United States Patent
Yoo et al.

(10) Patent No.: US 9,087,858 B2
(45) Date of Patent: Jul. 21, 2015

(54) MANUFACTURING METHOD OF A SEMICONDUCTOR DEVICE

(71) Applicant: Samsung Electronics Co., Ltd., Suwon-si (KR)

(72) Inventors: Seung-Han Yoo, Seongnam-si (KR); Dong-Kyu Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/331,403

(22) Filed: Jul. 15, 2014

(65) Prior Publication Data
US 2015/0037956 A1 Feb. 5, 2015

(30) Foreign Application Priority Data

Aug. 2, 2013 (KR) .................... 10-2013-0092074

(51) Int. Cl.
*H01L 21/8238* (2006.01)
*H01L 29/66* (2006.01)
*H01L 21/8234* (2006.01)
*H01L 27/088* (2006.01)

(52) U.S. Cl.
CPC ...... *H01L 29/66795* (2013.01); *H01L 21/8238* (2013.01); *H01L 21/823431* (2013.01); *H01L 27/0886* (2013.01); *H01L 29/66787* (2013.01)

(58) Field of Classification Search
CPC .............. H01L 21/832418; H01L 21/823431; H01L 21/8238; H01L 21/823821; H01L 21/845; H01L 27/0886; H01L 29/785; H01L 29/67787; H01L 29/66787
See application file for complete search history.

(56) References Cited

U.S. PATENT DOCUMENTS

| | | | |
|---|---|---|---|
| 2007/0099386 A1 | 5/2007 | Coolbaugh et al. | |
| 2007/0148836 A1 | 6/2007 | Cheng et al. | |
| 2009/0321836 A1 | 12/2009 | Wei et al. | |
| 2011/0147840 A1 | 6/2011 | Cea et al. | |
| 2011/0171795 A1* | 7/2011 | Tsai et al. | 438/232 |
| 2012/0211808 A1 | 8/2012 | Wei et al. | |
| 2013/0049121 A1 | 2/2013 | Baldauf et al. | |

FOREIGN PATENT DOCUMENTS

| | | |
|---|---|---|
| KR | 1020130023135 A | 3/2013 |
| WO | WO2011033623 A | 3/2011 |

* cited by examiner

*Primary Examiner* — Thanhha Pham
(74) *Attorney, Agent, or Firm* — Myers Bigel Sibley & Sajovec, PA

(57) ABSTRACT

Provided is a manufacturing method of a semiconductor device including providing a substrate including a first region and a second region, forming active fins in the first region and the second region, forming gate electrodes which intersect the active fins and have surfaces facing side surfaces of the active fins, forming an off-set zero (OZ) insulation layer covering the active fins, forming a first residual etch stop layer and a first hard mask pattern which cover the first region, injecting first impurities into the active fins of the second region, removing the first hard mask pattern and the first residual etch stop layer, forming second residual etch stop layer and a second hard mask pattern which cover the second region, injecting a second impurities into the active fins of the first region, and removing the second residual etch stop layer and the second hard mask pattern.

20 Claims, 73 Drawing Sheets

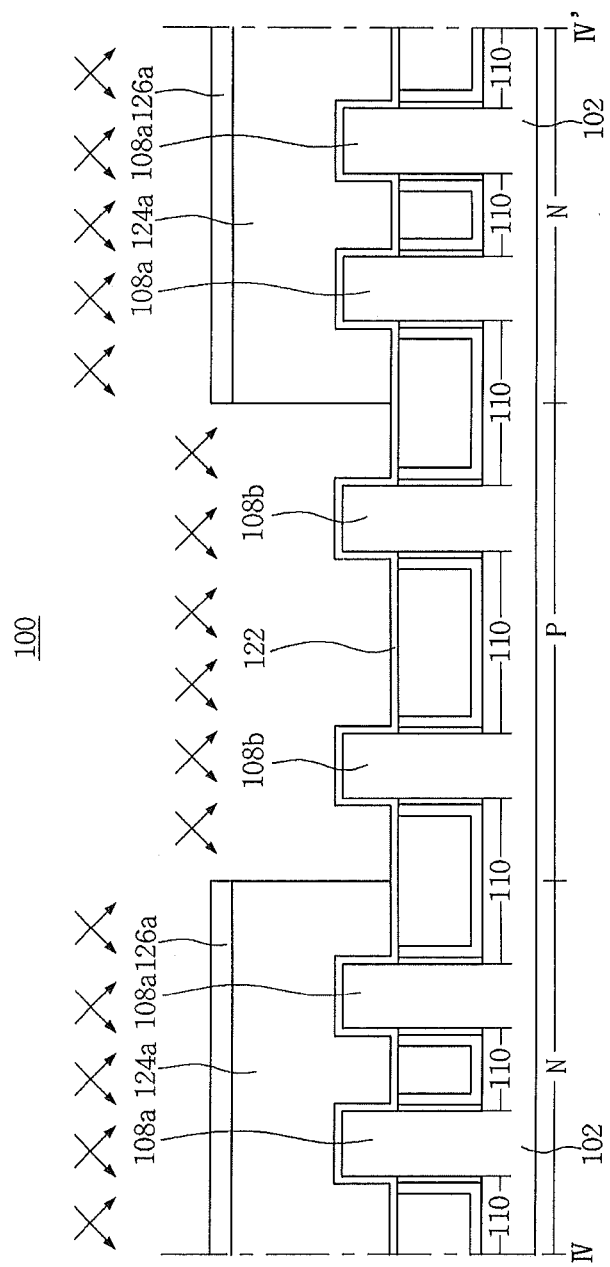

MANUFACTURING METHOD OF A SEMICONDUCTOR DEVICE

CROSS-REFERENCE TO RELATED APPLICATION

This application claims priority under 35 U.S.C. §119 to Korean Patent Application No. 10-2013-0092074 filed on Aug. 2, 2013, the disclosure of which is hereby incorporated by reference in its entirety.

BACKGROUND

1. Field

Embodiments of the inventive concept relate to a manufacturing method of a non-volatile memory semiconductor device including FinFETs, and, more specifically, to a manufacturing method of a non-volatile memory semiconductor device including an ion implantation process for regulating threshold voltages of p-type transistors and n-type transistors included in the non-volatile memory semiconductor device.

2. Description of Related Art

In recent years, semiconductor chips mounted in mobile products have been oriented toward microminiaturization and higher integration, and, in response to this, higher integration of semiconductor devices may be required.

As the size of transistors used in a semiconductor device becomes smaller, a technique that uses substitute materials having a good vertical profile as a mask for a patterning process and an ion implantation process to manufacture transistors, instead of using the existing photoresistor (PR) layer, has been proposed.

SUMMARY

A manufacturing method of a semiconductor device according to an embodiment of the technical idea of the inventive concept may include providing a substrate including a first region and a second region; forming active fins in the first region and the second region; forming gate electrodes which intersect the active fins and have surfaces facing side surfaces of the active fins; forming an off-set zero (OZ) insulation layer covering the active fins; forming a first hard mask pattern covering the first region; injecting first impurities into active fins of the second region; removing the first hard mask pattern; forming a second hard mask pattern covering the second region; injecting second impurities into the active fins of the first region; and removing the second hard mask pattern.

In the manufacturing method according to an embodiment of the inventive concept, the OZ insulation layer may include a silicon nitride layer.

The manufacturing method according to an embodiment of the inventive concept may further include forming a gate insulation layer between the gate electrodes and the active fins.

In the manufacturing method according to an embodiment of the inventive concept, the forming the first hard mask pattern may include forming sequentially a first hard mask layer, a first hard mask buffer layer, and a first photoresistor (PR) layer on an upper portion of the OZ insulation layer, forming the first hard mask buffer layer into a first hard mask buffer pattern covering the first region by a photolithography process using the first PR layer, forming the first hard mask layer into the first hard mask pattern using the first hard mask buffer pattern as an etching mask, and removing the first hard mask buffer pattern.

In the manufacturing method according to an embodiment of the inventive concept, the first hard mask layer may include a silicon organic layer, and the first hard mask buffer layer may include a silicon oxide layer.

In the manufacturing method according to an embodiment of the inventive concept, the forming the first hard mask layer may include a spin coating process, and the forming the first hard mask buffer layer may include an atomic layer deposition (ALD) process.

In the manufacturing method according to an embodiment of the inventive concept, the method may further include forming an etch stop layer on an upper surface of the OZ insulation layer.

In the manufacturing method according to an embodiment of the inventive concept, the etch stop layer may include a poly silicon layer.

In the manufacturing method according to an embodiment of the inventive concept, during removal of the first hard mask buffer pattern, the etch stop layer of the second region may be removed, and the residual etch stop layer may be left in the remaining region including the first region.

In the manufacturing method according to an embodiment of the inventive concept, the method may further include, forming the second hard mask pattern, and removing the residual etch stop layer.

In the manufacturing method according to an embodiment of the inventive concept, the first impurities and the second impurities may be injected into the active fins in all directions at a tilted angle.

In the manufacturing method of the semiconductor device according to an embodiment of the inventive concept, the first impurities and the second impurities may be injected into an upper surface and side surfaces of the active fins facing the gate electrodes.

In the manufacturing method according to an embodiment of the inventive concept, the method may further include, removing the second hard mask pattern, and performing an annealing process to the substrate.

In the manufacturing method according to an embodiment of the inventive concept, the method may include providing a substrate including a first region and a second region; forming active fins in the first region and the second region; forming gate electrodes which intersect the active fins and have surfaces facing side surfaces of the active fins; forming an off-set zero (OZ) insulation layer covering the active fins; forming a first residual etch stop layer and a first hard mask pattern which cover the first region; injecting first impurities into the active fins of the second region; removing the first hard mask pattern and the first residual etch stop layer; forming a second residual etch stop layer and a second hard mask pattern which cover the second region; injecting second impurities into the active fins of the first region; and removing the second hard mask pattern and the second residual etch stop layer.

In the manufacturing method according to an embodiment of the inventive concept, the forming the first residual etch stop layer and the first hard mask pattern may include forming sequentially a first etch stop layer, a first hard mask layer, a first hard mask buffer layer, and a first PR layer on an upper portion the OZ insulation layer; forming the first hard mask buffer layer into a hard mask buffer pattern covering the first region by a patterning process using the first PR layer; forming the first hard mask layer into a first hard mask pattern using the first hard mask buffer pattern as an etching mask; and forming a first residual etch stop layer beneath the first hard mask pattern by removing the first hard mask buffer pattern and the first etch stop layer of the second region.

More detailed matters in the other embodiments will be described in the following description with reference to the drawings.

In accordance with an aspect of the inventive concept, a manufacturing method of a semiconductor device may precisely define an ion implantation region located at a deep place using an organic layer (hard mask pattern) having a good vertical profile as a mask when an ion implantation process is performed.

In accordance with another aspect of the inventive concept, a manufacturing method of a semiconductor device may prevent an off-set zero (OZ) insulation layer from being pared defectively by a wet etching process which proceeds while an impurity injection process is repeatedly performed, by further configuring an etch stop layer on an upper portion of the off-set zero (OZ) insulation layer.

Accordingly, transistors having various levels of threshold voltages may be manufactured in the single substrate without fault of process while the ion implantation process is repeatedly performed.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
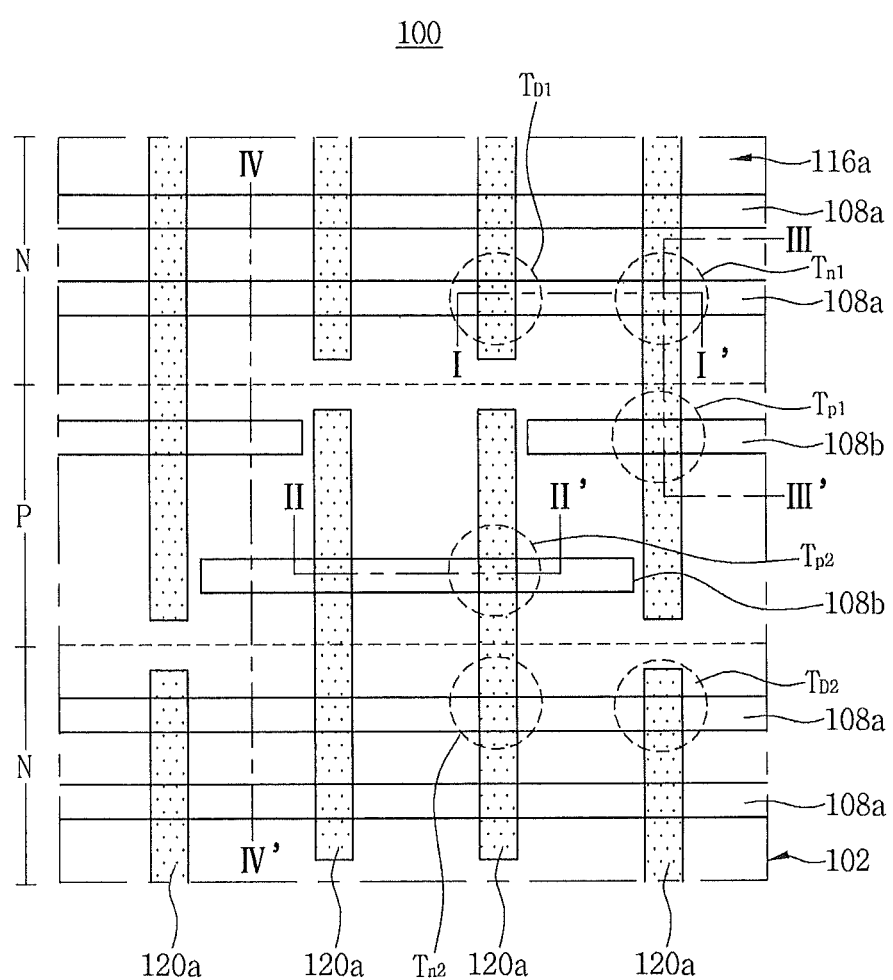
FIG. 1 is a conceptual plan view of a semiconductor device according to an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout the description. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present inventive concept.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional views that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and device structures thereon, as would be illustrated by a plan view of the device/structure.

FIG. 1 is a conceptual plan view of a semiconductor device according to an embodiment of the inventive concept.

Referring to FIG. 1, a semiconductor device 100 according to an embodiment of the inventive concept may include a substrate 102 including P regions P and an N regions N, first active fins 108a, second active fins 108b, gate electrodes 120a, and device separation layers 116a.

The first active fins 108a may be formed in one direction in the N region N, and the second active fins 108b may be formed in one direction in the P region P. The first active fins 108a formed in the N region N have a form, which is spaced apart up and down and extended in a first direction. The second active fins 108b formed in the P region P have a form extending in the first direction, but are shorter than the first active fins 108a in length. The second active fins 108b may be spaced apart up and down, and left and right in the P region P. In this case, sides of the second active fins 108b spaced apart up and down may not be aligned vertically.

The device separation layers 116a define each of regions of the first and second active fins 108a and 108b and may electrically isolate each of the first and second active fins 108a and 108b.

The gate electrodes 120a may be formed to intersect the first active fins 108a and the second active fins 108b.

Transistors may be formed in a region in which the gate electrodes 120a and the first and second active fins 108a and 108b intersect each other.

For example, a non-volatile memory device may include a unit cell composed of two drive transistors, two n-type transistors, and two p-type transistors.

Accordingly, the unit cell of the non-volatile memory device may be designed as shown in FIG. 1. More specifically, the region in which the gate electrodes 120a and the first and second active fins 108a and 108b intersect may be designed with a first drive transistor region $T_{D1}$, a n-type first transistor region $T_{N1}$, a p-type first transistor region $T_{P1}$, a second drive transistor region $T_{D2}$, a n-type second transistor region $T_{N2}$, and a p-type second transistor region $T_{P2}$.

In the N region N of the substrate 102, the first drive transistor region $T_{D1}$, the second drive transistor region $T_{D2}$, the n-type first transistor region $T_{N1}$, and the n-type second transistor region $T_{N2}$ may be defined, and in the P region P, the p-type first transistor region $T_{P1}$ and the p-type second transistor region $T_{P2}$ may be defined.

Figure 2A:
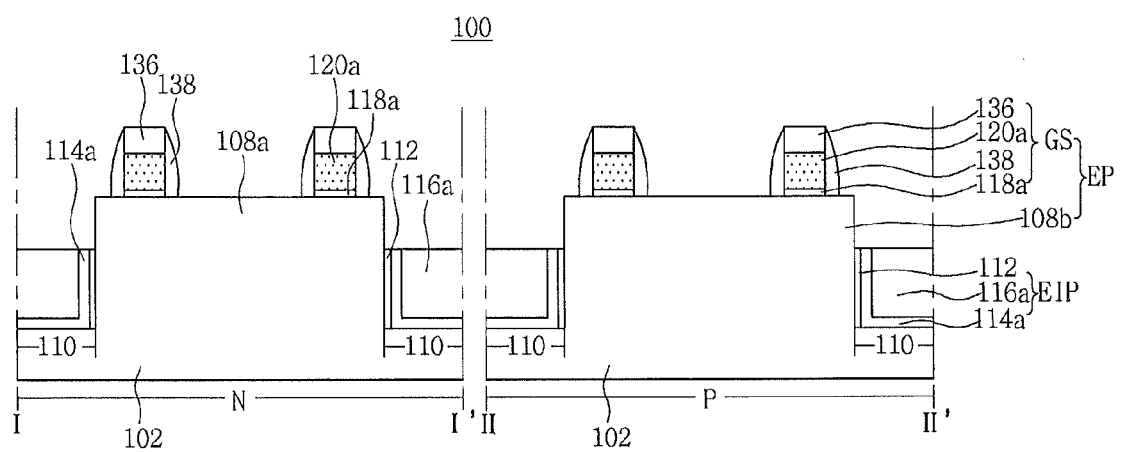
FIG. 2A is a cross-sectional view taken along lines I-I' and II-II' in FIG. 1, and FIG. 2B and FIG. 2C are cross-sectional views taken along lines III-III' and IV-IV' in FIG. 1.
Figure 2B:
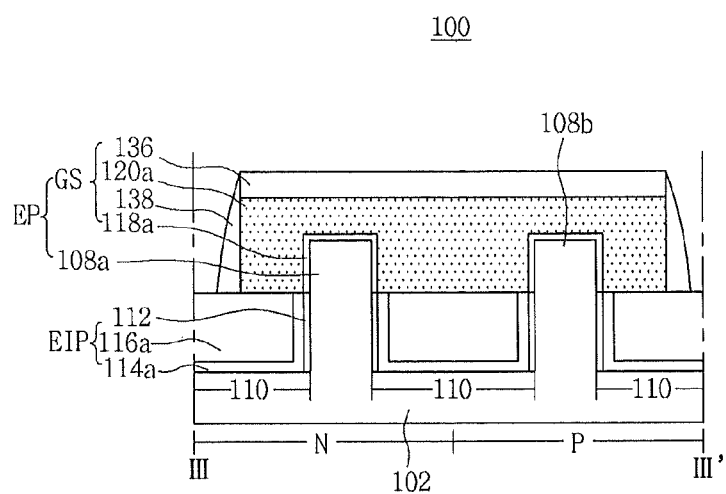
Figure 2C:
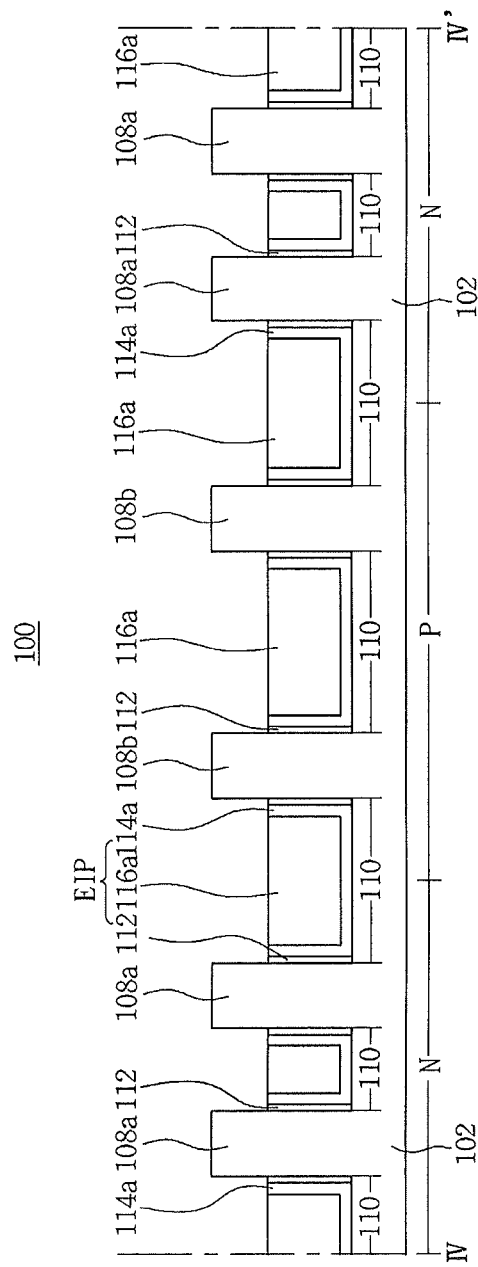

FIG. 2A is a cross-sectional view taken along lines I-I' and II-II' in FIG. 1, and FIG. 2B and FIG. 2C are cross-sectional views taken along lines III-III' and IV-IV' in FIG. 1, respectively.

Referring FIG. 2A to FIG. 2C, the semiconductor device according to the inventive concept may include the substrate 102, a device separation portion (EIP), and a device portion (EP).

The substrate 102 may include the N region N and the P region P.

The device separation portion (EIP) may include trenches 110, an oxide layer 112, and a nitride layer liner 114a, which are sequentially formed in the inner wall of the trenches 110, and the device separation layer 116a which fills inside of the trenches 110.

The device portion (EP) may include the first active fins 108a and the second active fins 108b, both of which protrude from an upper portion of the substrate 102, and gate stacks (GS) intersecting the first and second active fins 108a and 108b.

The first active fins 108a and the second active fins 108b may be formed to have a protruding shape by recessing the surface of the substrate 102 in a process of forming the trenches 110.

The gate stack (GS) may include a gate insulation layer 118a, the gate electrodes 120a, a gate capping layer 136, and a side spacer 138.

The gate insulation layer 118a may be formed among the gate electrodes 120a and the first active fins 108a and the second active fins 108b. The gate electrodes 120a may have surfaces facing side surfaces of the first active fins 108a and the second active fins 108b, and may be formed on the upper surface of the device separation layers 116a.

The substrate 102 may include a silicon substrate. The device separation layers 116a may include a silicon oxide layer. The gate insulation layers 118a may include the silicon oxide layer. The gate electrodes 120a may include a polysilicon layer. The gate capping layer 136 and the side spacers 138 may include a silicon nitride layer.

The process of forming transistors including the aforementioned configurations may include an ion implantation process for regulating threshold voltages of transistors.

Hereinafter, the manufacturing method of the semiconductor device including the ion implantation processes for regulating the threshold voltages according to embodiments of the inventive concept will be described with reference to drawings showing processes.

FIG. 3A to FIG. 17A are cross-sectional views taken along lines I-I' and II-II' in FIG. 1 and FIG. 3B to FIG. 17B and FIG. 3C to FIG. 17C are cross-sectional views taken along lines III-III' and IV-IV' in FIG. 1, showing sequences of a process according to an embodiment of the inventive concept, respectively.

Figure 3A:
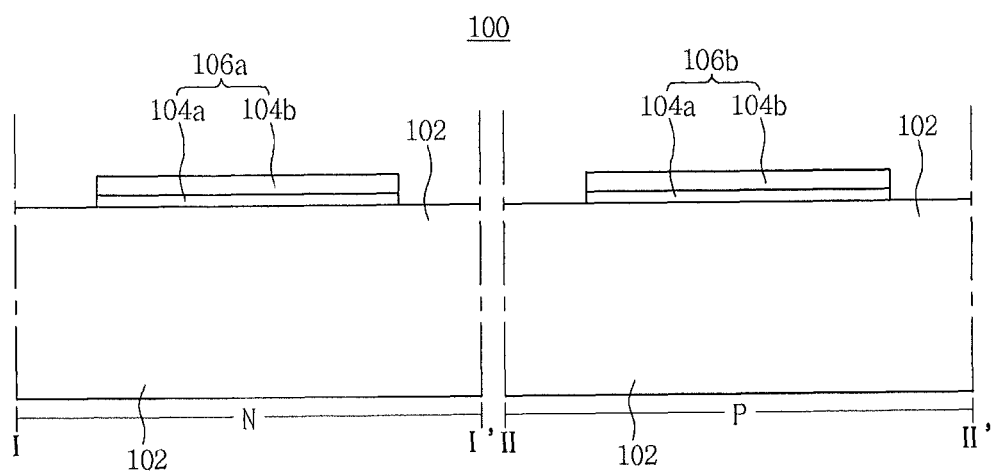
FIG. 3A to FIG. 17A are cross-sectional views taken along lines I-I' and II-II' in FIG. 1, and FIG. 3B to FIG. 17B, and FIG. 3C to FIG. 17C are cross-sectional views taken along lines III-III' and IV-IV' in FIG. 1, showing sequences of a process according to an embodiment of the inventive concept, respectively.
Figure 3B:
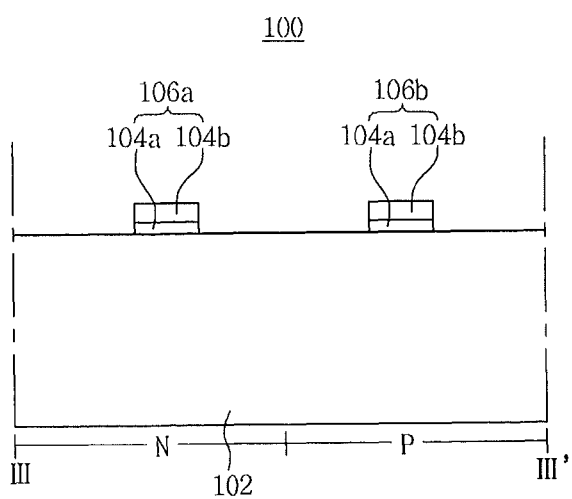
Figure 3C:
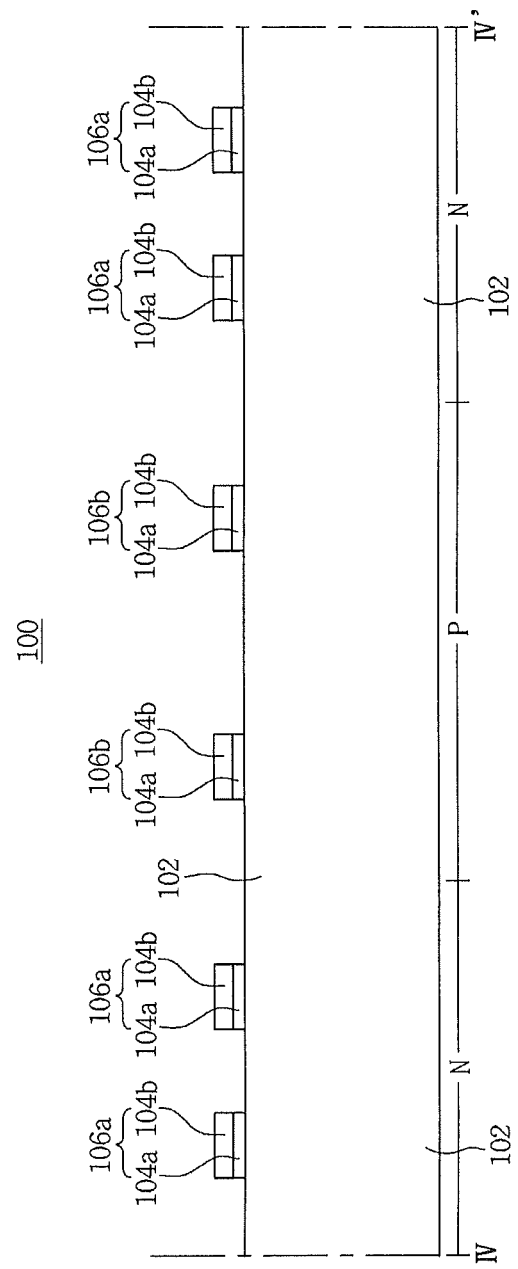

Referring to FIG. 3A, FIG. 3B, and FIG. 3C, the manufacturing method of the semiconductor device 100 according to an embodiment of the inventive concept may include defining the P region P and the N region N in the substrate 102, forming the first hard mask patterns 106a in the N region N, and forming the second hard mask patterns 106b in the P region P. The P region P is a region in which a p-type transistor will be formed and the N region N is a region in which an n-type transistor will be formed.

The first hard mask patterns 106a and the second hard mask patterns 106b may be formed in the same form as the first active fins 108a and the second active fins 108b shown in FIG. 1.

Specifically, referring to FIG. 1, the first hard mask patterns 106a formed in the N region N may be extended in the first direction being spaced apart up and down. The second hard mask patterns 106b formed in the P region P have a form extending in the first direction, but are shorter than first hard mask patterns 106a in length. The second hard mask patterns 106b may be spaced apart up and down, and left and right. In this case, the sides of patterns spaced apart up and down may not be vertically aligned.

The substrate 102 may be a silicon substrate. The first hard mask patterns 106a and the second hard mask patterns 106b may include oxide layer patterns 104a and nitride layer patterns 104b, which are laminated thereon, respectively. The oxide layer patterns 104a may include a silicon oxide ($SiO_2$), and the nitride layer patterns 104b may include a silicon nitride (SiNx).

The process of forming the oxide layer patterns 104a may include a thermal oxidation process, and the process of forming the nitride layer patterns 104b may include a chemical vapor deposition (CVD) process.

Figure 4A:
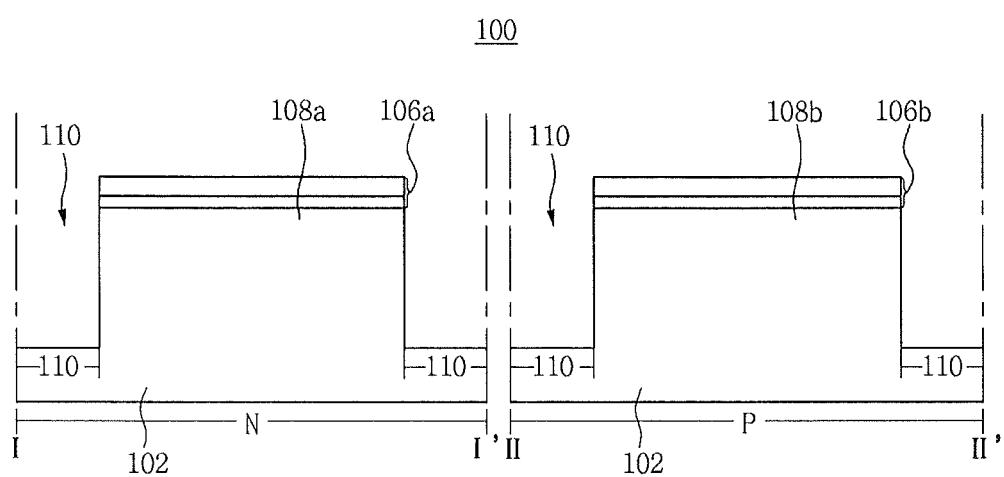
Figure 4B:
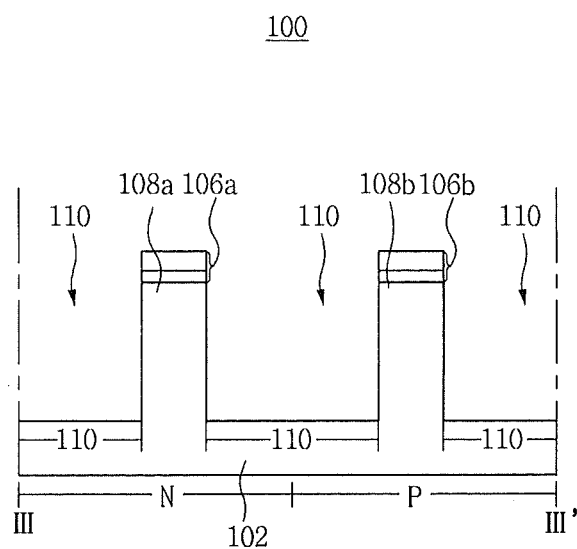
Figure 4C:
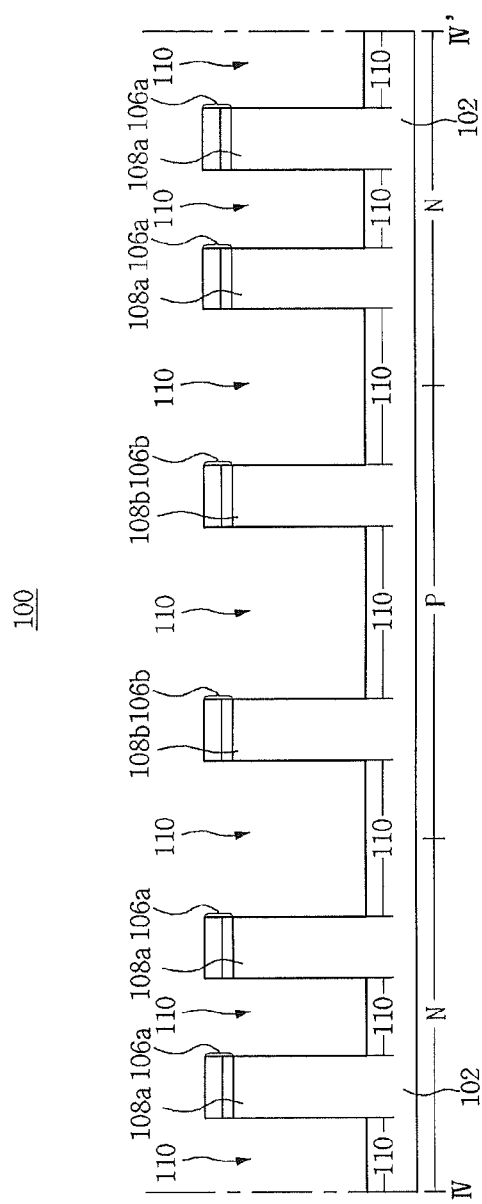

Referring to FIG. 4A, FIG. 4B, and FIG. 4C, the manufacturing method of the semiconductor device according to an embodiment of the inventive concept may include forming the first active fins 108a and the second active fins 108b in the substrate 102.

The forming the first active fins 108a and the second active fins 108b may include forming the trenches 110 by recessing the surface of the substrate 102 exposed between the first hard mask patterns 106a and the second hard mask patterns 106b up to a certain depth.

The first active fins 108a are formed beneath the first hard mask patterns 106a, and the second active fins 108b are formed beneath the second hard mask patterns 106b. Further, the first active fins 108a and the second active fins 108b may have a shape protruding from the substrate 102.

Figure 5A:
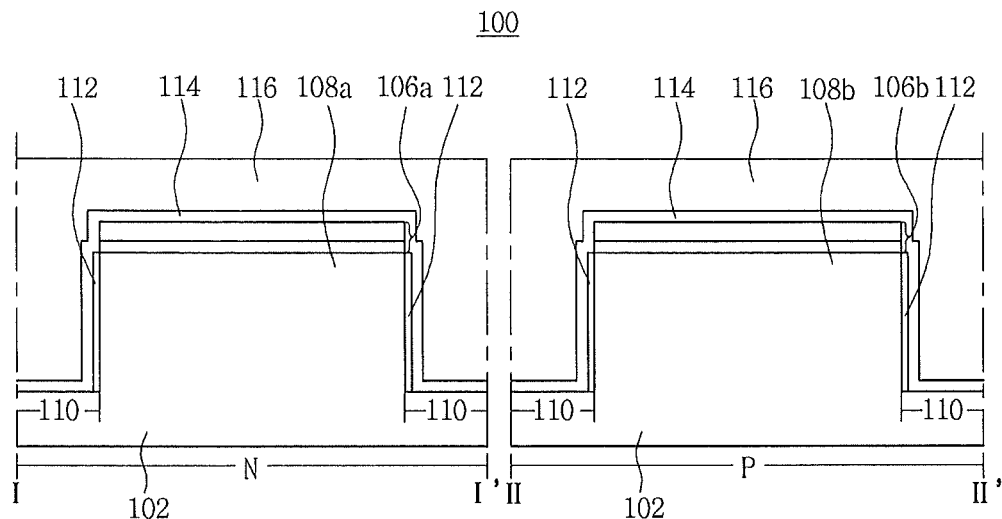
Figure 5B:
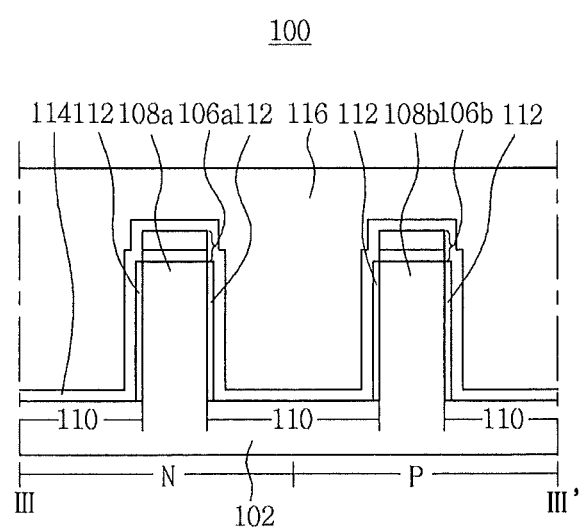
Figure 5C:
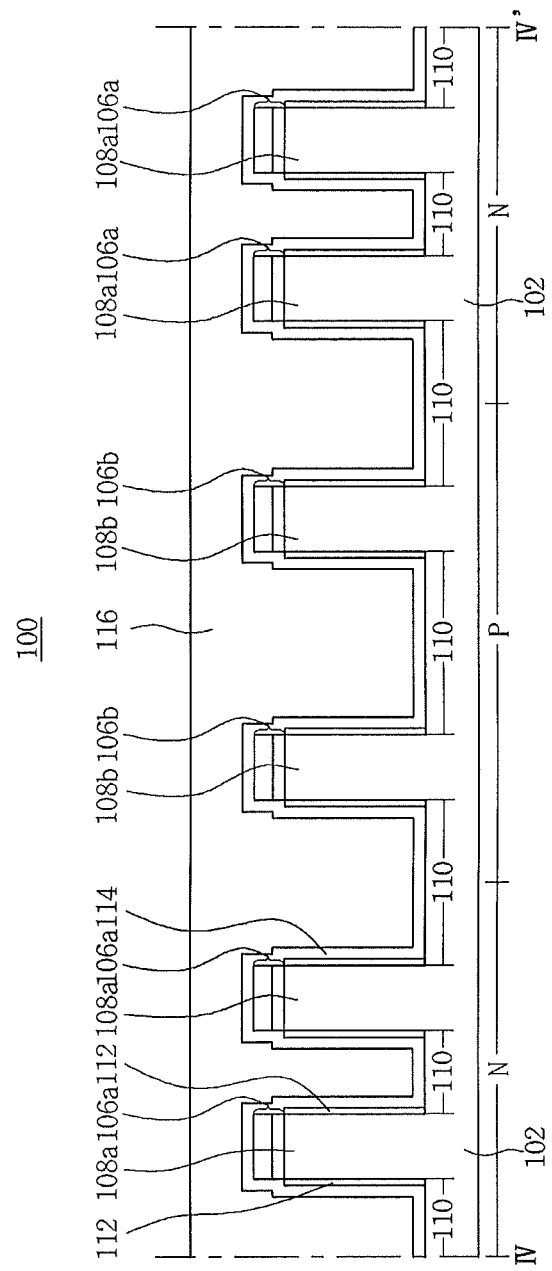

Referring to FIG. 5A, FIG. 5B, and FIG. 5C, the manufacturing method of the semiconductor device according to an embodiment of the inventive concept may include forming the oxide layers 112 on side walls of the first active fins 108a and the second active fins 108b. Further, forming a nitride layer 114 covering the oxide layers 112, the first hard mask patterns 106a, the second hard mask patterns 106b, and the trenches 110 may be further included. Further, forming a gap filling layer 116 covering the nitride layer 114 while filling the trenches 110 may be further included.

The oxide layers 112 may include a silicon oxide, and the nitride layer 114 may include a silicon nitride, and the gap filling layer 116 may include a silicon oxide.

Forming the oxide layers 112 may include a thermal oxidation process. The nitride layer 114 and the gap filling layer 116 may be formed by performing the CVD process.

Figure 6A:
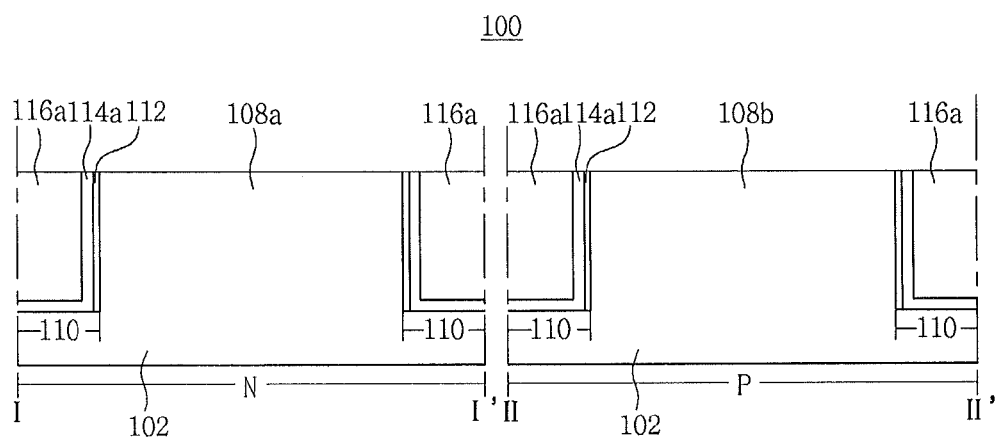
Figure 6B:
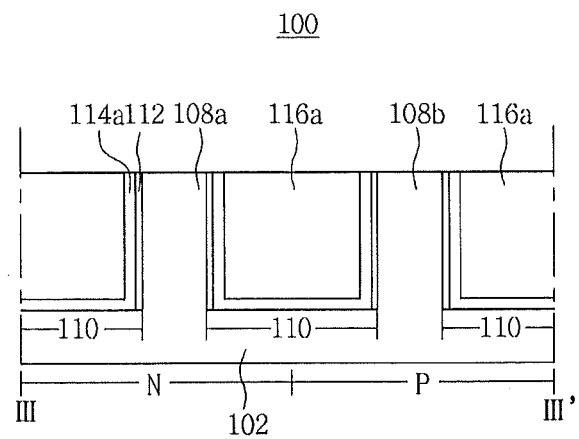
Figure 6C:
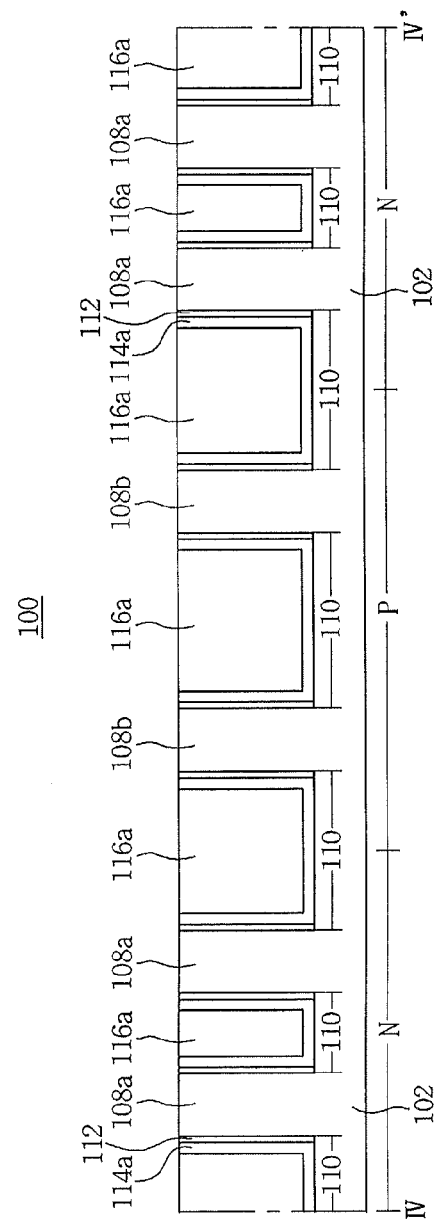

Referring to FIG. 6A, FIG. 6B, and FIG. 6C, the manufacturing method of the semiconductor device according to an embodiment of the inventive concept may include forming the nitride layer liner 114a covering the inner wall of the trenches 110 and the device separation layers 116a filling the trenches 110.

The nitride layer liners 114a and the device separation layers 116a may be formed through a planarization process and a wet etching process. Specifically, through the planarization process, the gap filling layer 116 shown in FIG. 5A to FIG. 5C is removed and thereby the device separation layers 116a which are at the same level as the surface of the nitride layer 114 may be formed. The nitride layer 114 and the first hard mask patterns 106a and the second hard mask patterns 106b shown in FIG. 5A to FIG. 5C are removed in the wet etching method and thereby an upper surface of the first active fins 108a and the second active fins 108b may be exposed, and may form the nitride layer liner 114a having a surface at the same level as those of the first and second active fins 108a and 108b. Subsequently, the device separation layers 116a at the upper portion of the trenches 110 are wet-etched, and a surface at the same level as the first and second active fins 108a and 108b may be formed.

The planarization process may include a chemical mechanical polishing (CMP) process. The wet etching may be performed using a normal wet solution, which is determined depending on the quality of each layer.

Figure 7A:
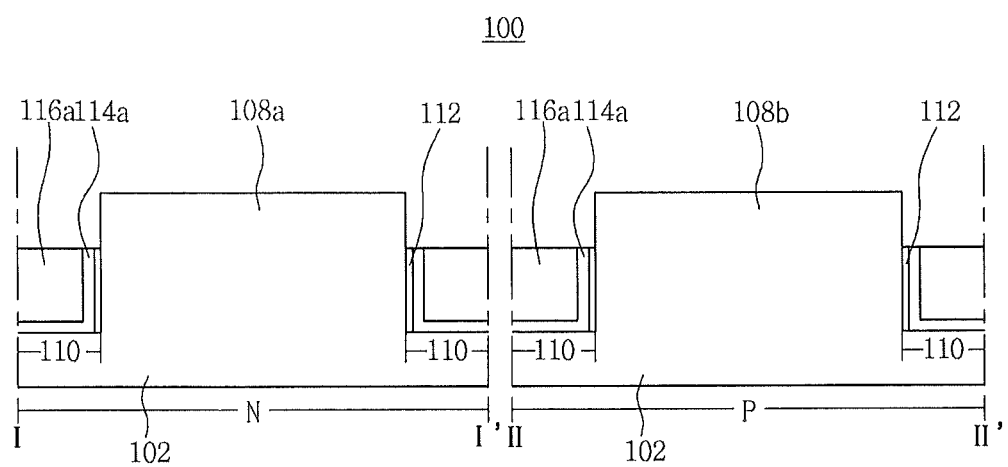
Figure 7B:
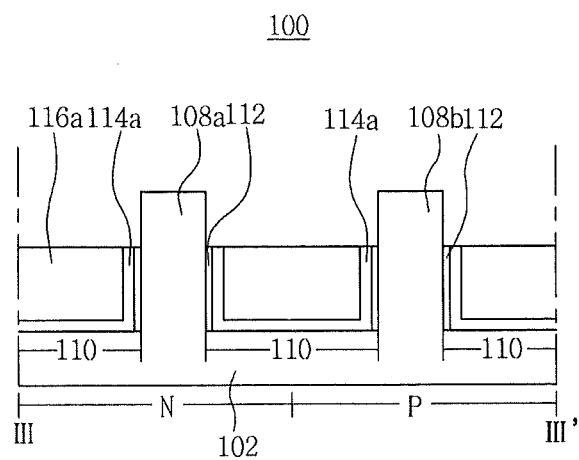
Figure 7C:
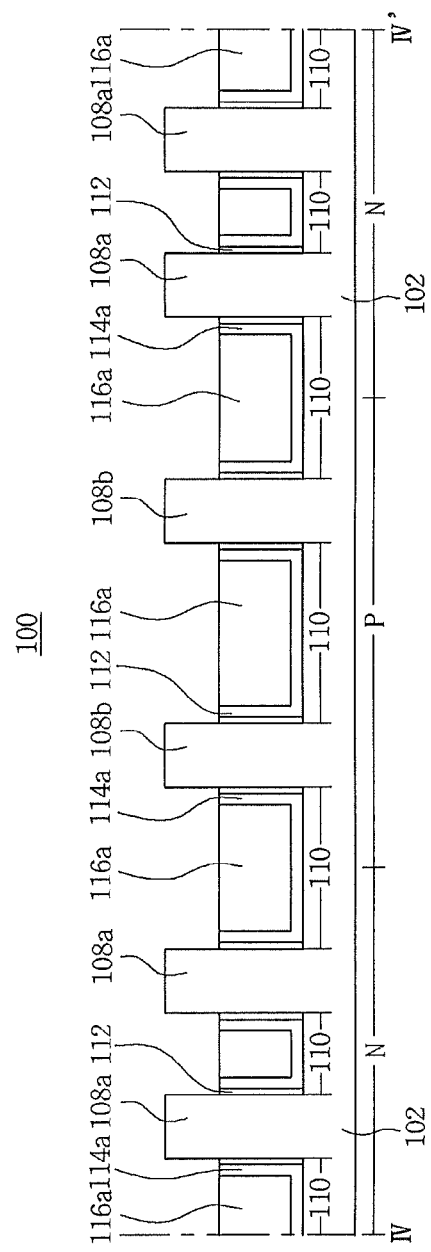

Referring to FIG. 7A, FIG. 7B, and FIG. 7C, the manufacturing method of the semiconductor device according to an embodiment of the inventive concept may include exposing the upper portions of the first active fins 108a and the second active fins 108b to a level of a certain height.

The exposing of the first active fins 108a and the second active fins 108b may include recessing the device separation layers 116a, the nitride layer liners 114a, and the oxide layers 112 into a certain depth from the surface. The surfaces of the device separation layers 116a, the nitride layer liners 114a, and the oxide layers 112 may be placed in the same level.

Figure 8A:
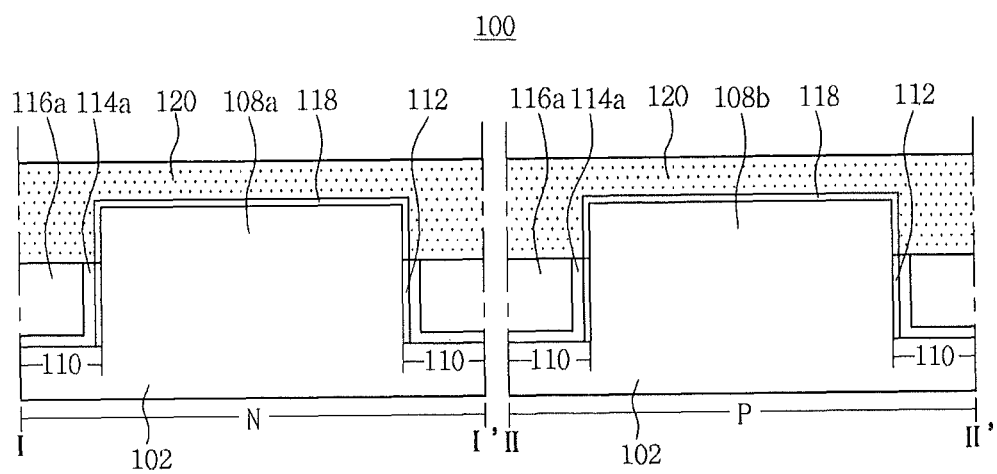
Figure 8B:
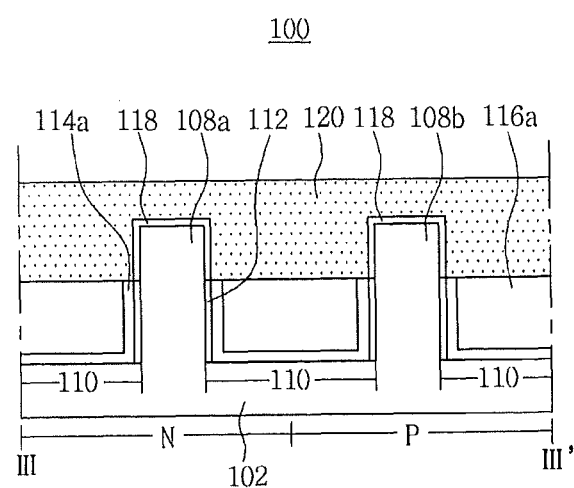
Figure 8C:
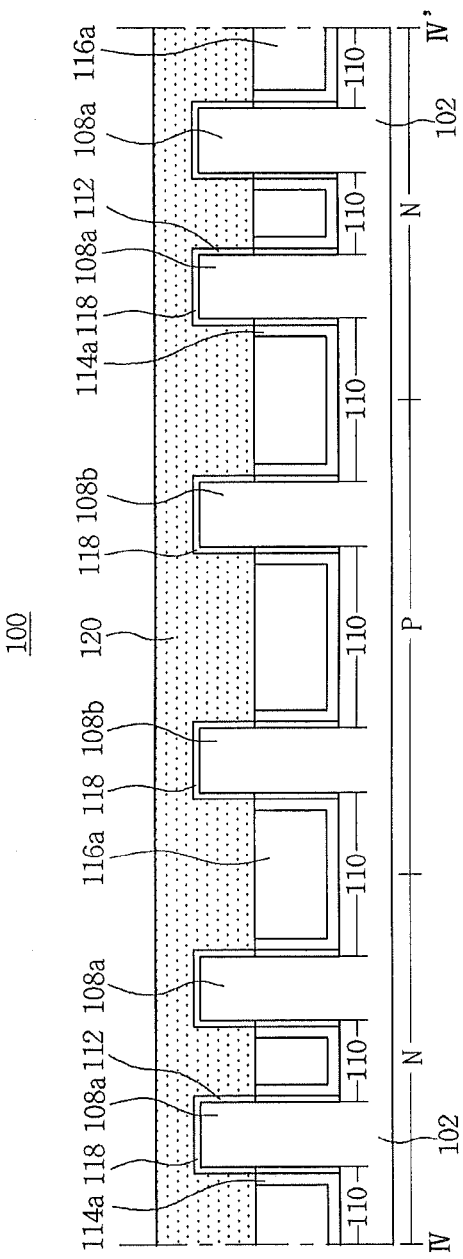

Referring to FIG. 8A, FIG. 8B, and FIG. 8C, the manufacturing method of the semiconductor device according to an embodiment of the inventive concept may include forming fin oxidation layers 118 and a gate electrode layer 120.

The fin oxidation layers 118 may cover the surface of the first active fins 108a and the second active fins 108b, and the gate electrode layer 120 may cover the entire surface of the substrate 102 including the fin oxidation layers 118.

The fin oxidation layers 118 may include the silicon oxide layer, and the gate electrode layer 120 may include the polysilicon layer.

The silicon oxide layer may be formed through a thermal oxidation process. The polysilicon layer may be formed through processes of forming an amorphous silicon layer containing impurities and crystallizing the amorphous silicon layer by applying heat.

Figure 9A:
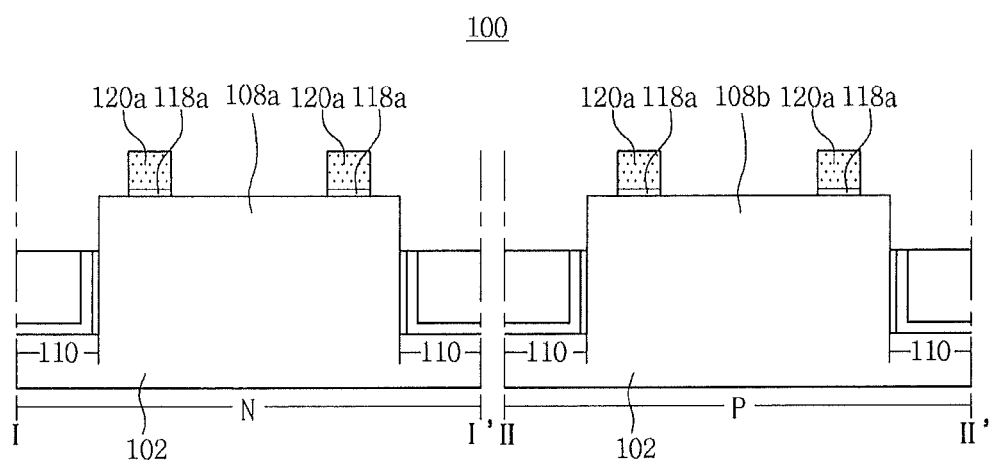
Figure 9B:
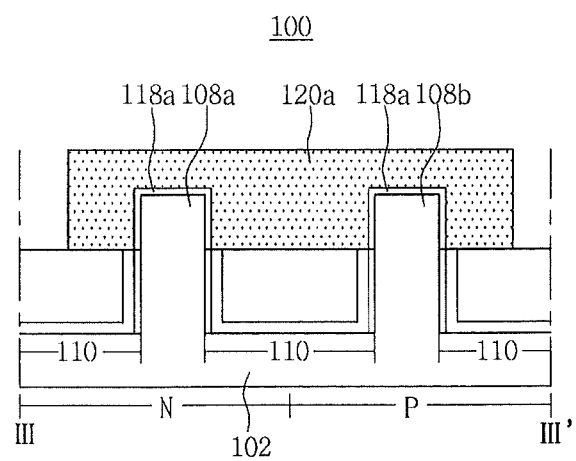
Figure 9C:
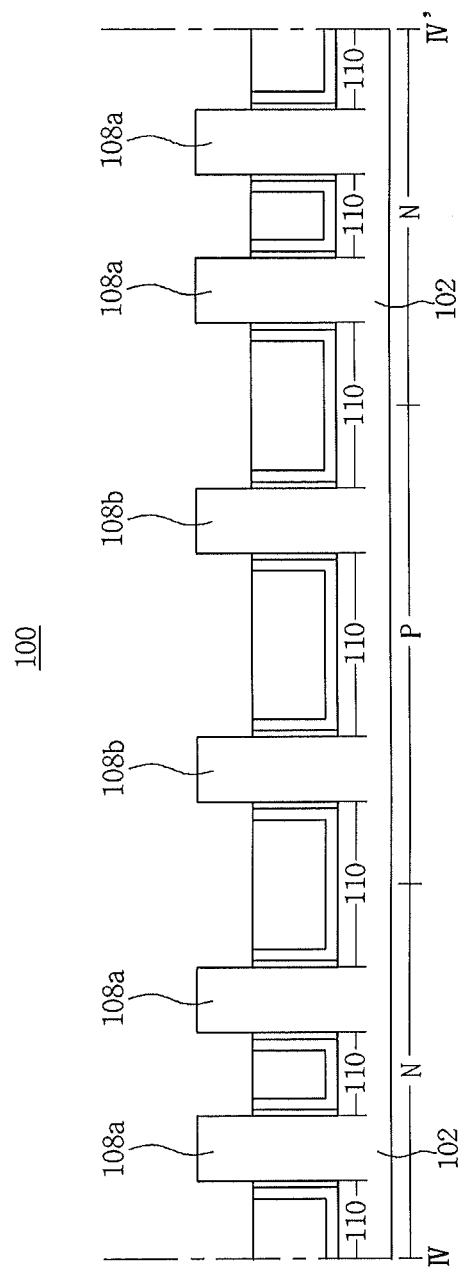

Referring to FIG. 9A, FIG. 9B, and FIG. 9C, the manufacturing method of the semiconductor device according to an embodiment of the inventive concept may include forming the gate insulation layers 118a and the gate electrodes 120a.

The forming the gate insulation layers 118a and the gate electrodes 120a may include patterning the fin oxidation layers 118 and the gate electrode layers 120 shown in FIG. 8A to FIG. 8C.

The gate insulation layers 118a may be placed between the gate electrodes 120a, and the first active fins 108a and the second active fins 108b. The gate electrodes 120a, referring to FIG. 1, may be formed in the direction intersecting the first active fins 108a and the second active fins 108b placed respectively in the N region N and the P region P.

The gate electrodes 120a may have surfaces facing side surfaces of the first and second active fins 108a and 108b.

Figure 10A:
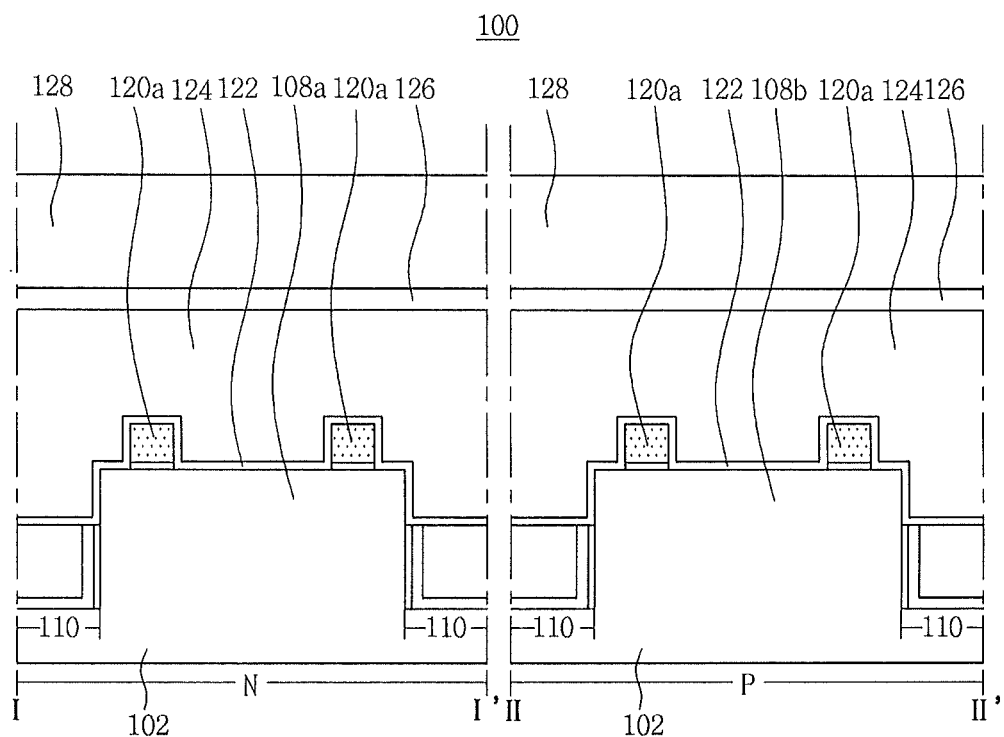
Figure 10B:
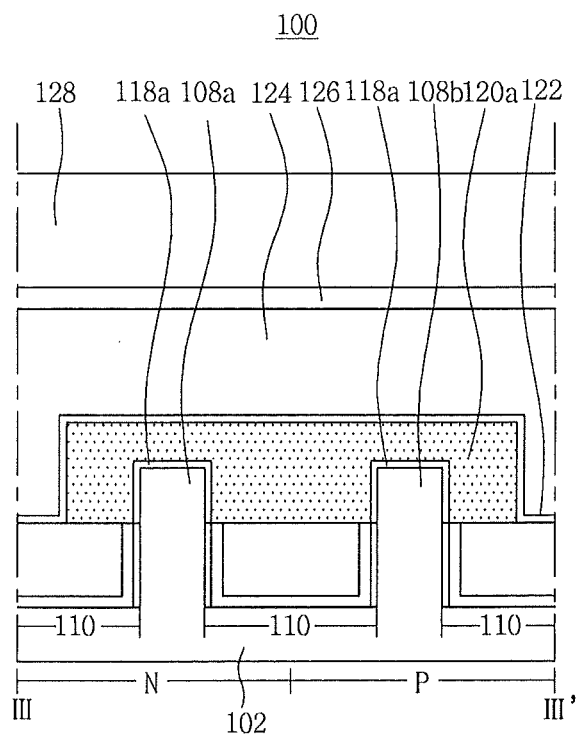
Figure 10C:
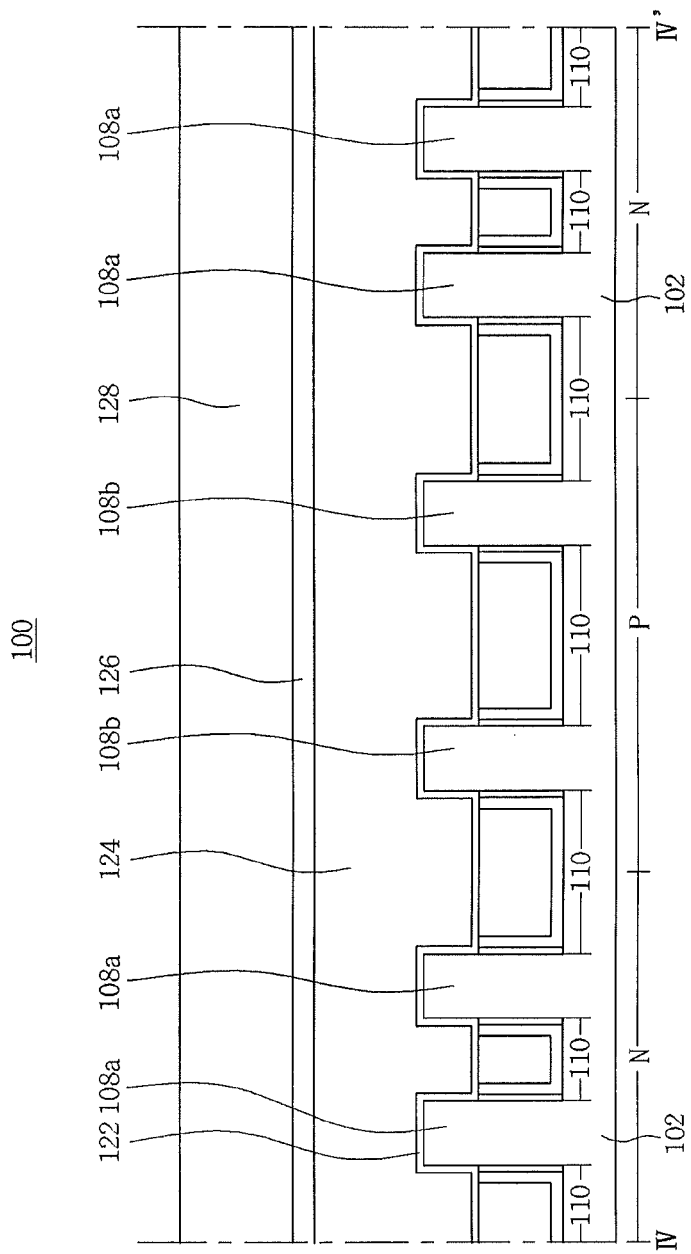

Referring to FIG. 10A, FIG. 10B, and FIG. 10C, the manufacturing method of the semiconductor device according to an embodiment of the inventive concept may include forming an off-set zero (OZ) insulation layer 122, a first hard mask layer 124, a first hard mask buffer layer 126, and a first PR layer 128 on the entire surface of the substrate 102.

The OZ insulation layer 122 may be formed on the entire surface of the substrate 102 including the gate electrodes 120a. The first hard mask layer 124, the first hard mask buffer layer 126, and the first PR layer 128 may be sequentially laminated on the upper surface of the OZ insulation layer 122.

The OZ insulation layer 122 may include the silicon nitride layer. The first hard mask layer 124 may include a silicon organic layer. The first hard mask buffer layer 126 may include the silicon oxide layer.

The OZ insulation layer 122 may be formed by the chemical vapor deposition (CVD) process. The first hard mask layer 124 may be formed by spin coat of a silicon organic material and is referred to as a layer coated by spin on hard mask (SOH layer). The first hard mask buffer layer 126 may be formed by an atomic layer deposition (ALD) process.

The OZ insulation layer 122 may reduce or prevent damage to the surface of active fins 108a, 108b from being damaged during the ion implantation process performed in subsequent processes, to regulate the amount of injected impurities and to prevent the injected impurities in the heat processing stage after the ion implantation process from escaping. The first hard mask layer 124 may be used as a mask for injecting ions in the subsequent process and has a good vertical profile characteristic. The first hard mask buffer layer 126 may be used as an etching mask for patterning the first hard mask layer 124.

Figure 11A:
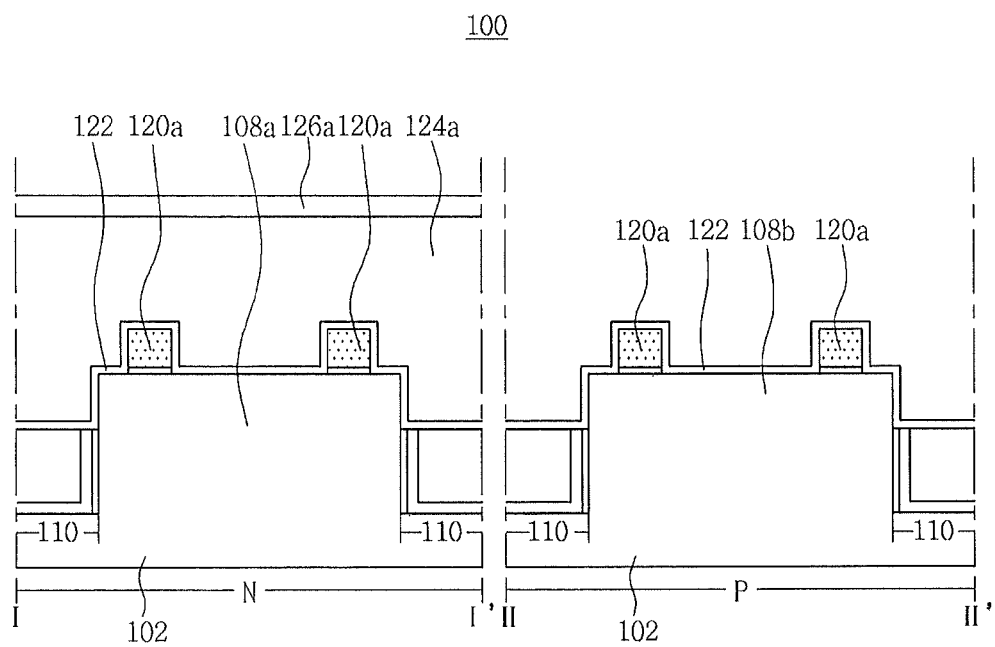
Figure 11B:
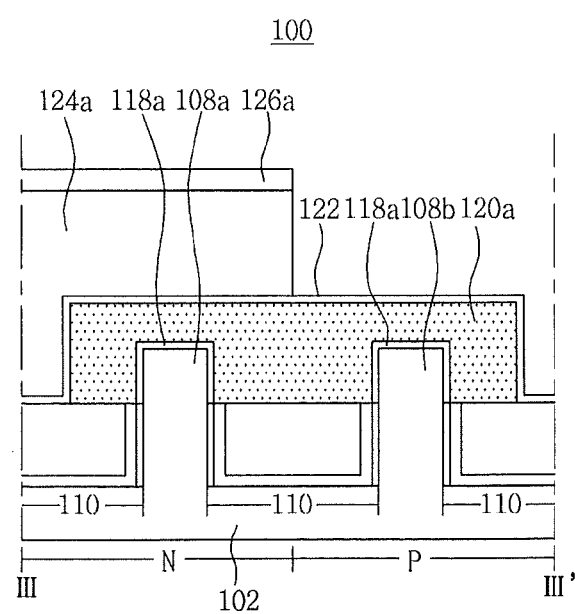
Figure 11C:
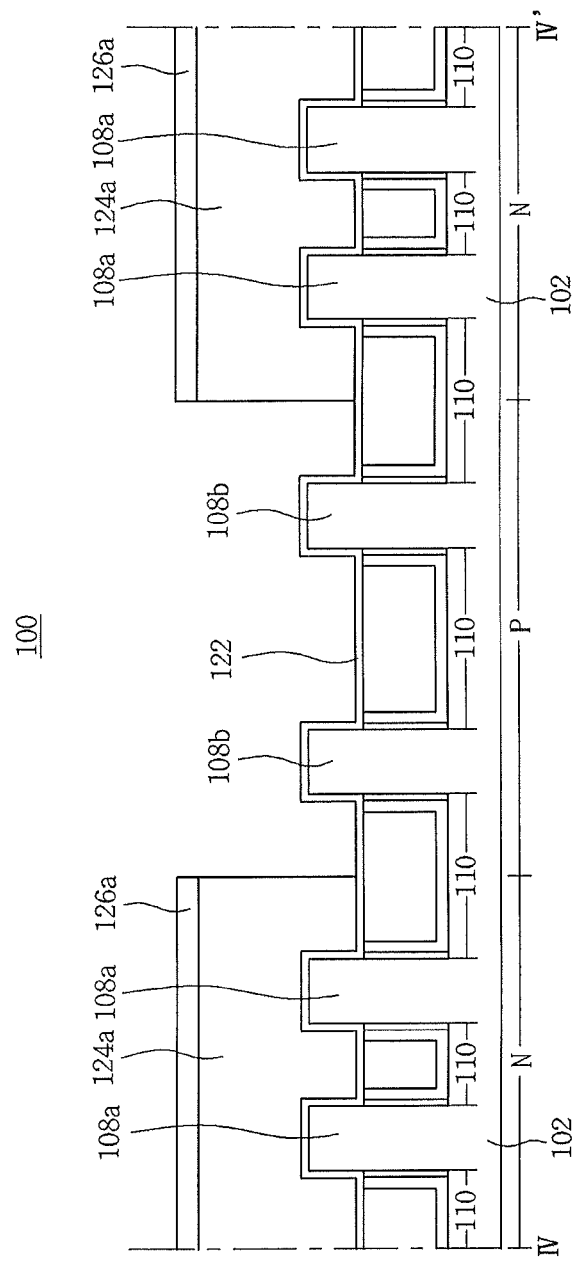

Referring to FIG. 11A, FIG. 11B, and FIG. 11C, the manufacturing method of the semiconductor device according to an embodiment of the inventive concept may include forming a first hard mask pattern 124a and a first hard mask buffer pattern 126a, which cover the N region N.

The first hard mask buffer pattern 126a may be formed through a photolithography process using the first PR layer 128 shown in FIG. 10A to FIG. 10C. The first hard mask pattern 124a may be patterned using the first hard mask buffer pattern 126a as the etching mask.

The first hard mask pattern 124a and the first hard mask buffer pattern 126a are generally the same shape and may be formed to be overlapped up and down. The OZ insulation layer 122 may be exposed in the P region P on which the first hard mask pattern 124a and the first hard mask buffer pattern 126a are not covered.

The forming the first hard mask pattern 124a may include a dry etching process, and the forming of the first hard mask buffer pattern 126a may include the wet etching process. The dry etching process may use halogen plasma. The wet etching process may use an etching solution, which is made by mixing of hydrogen fluoride and ammonium fluoride.

Figure 12A:
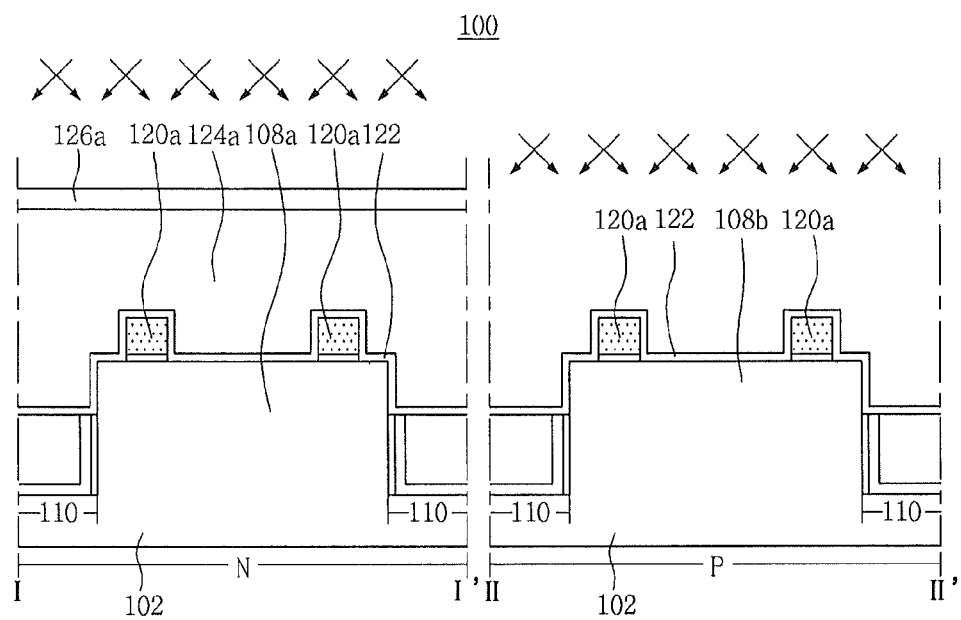
Figure 12B:
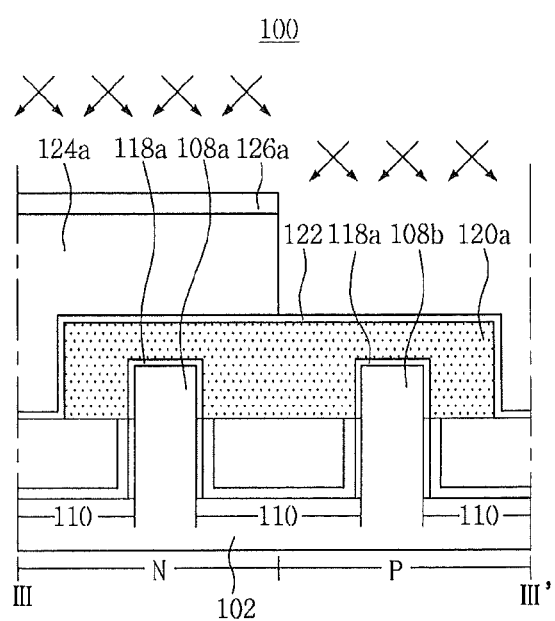

Referring to FIG. 12A, FIG. 12B, and FIG. 12C, the manufacturing method of the semiconductor device according to an embodiment of the inventive concept may include injecting impurity ions into the P region P on which the first hard mask pattern 124a is not covered.

The impurities injected into the P region P are n-type impurities, and the n-type impurities may include phosphorus (P), arsenic (As), and/or antimony (Sb), which belong to 5-valent.

The impurity ions injected into the second active fins 108b may be injected from all directions at a tilted angle determined reasonably. The impurities may be injected into the second active fins 108b passing through the exposed OZ insulation layer 122. In particular, depending on the amount of impurities injected into the sides and the upper surface of the second active fins 108b facing the gate electrodes 120a, the threshold voltage of the p-type transistor may be determined.

After the impurities are injected, the first hard mask pattern 124a may be removed. The first hard mask pattern 124a may be removed using the aforementioned wet etching method. In the present process, the processes of removing the first hard mask buffer pattern 126a after the impurities are injected have been described, but the impurity injection process may be performed after the first hard mask buffer pattern 126a is firstly removed.

Figure 13A:
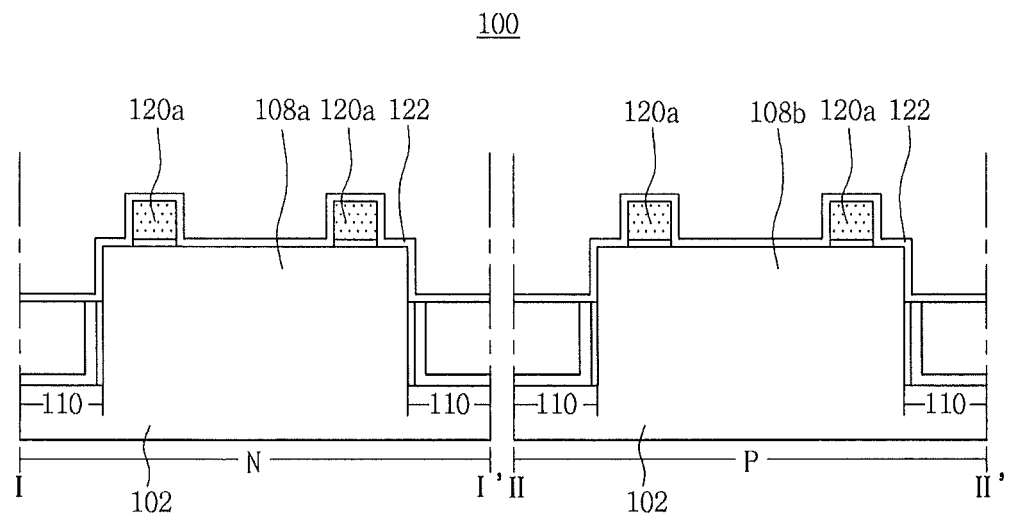
Figure 13B:
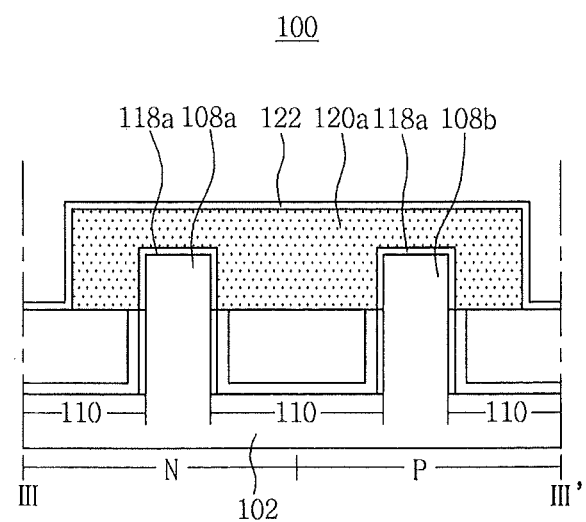
Figure 13C:
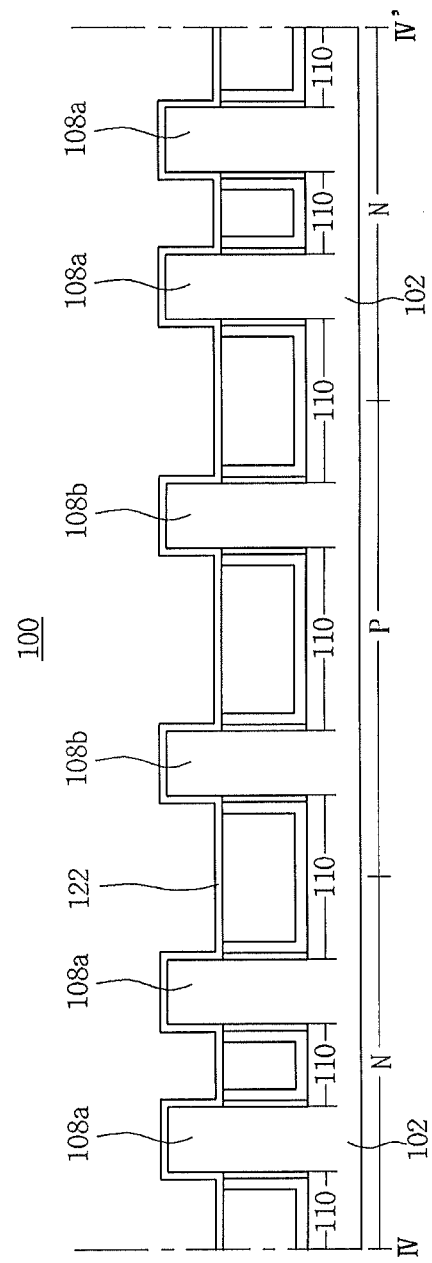

Referring to FIG. 13A, FIG. 13B, and FIG. 13C, the manufacturing method of the semiconductor device according to an embodiment of the inventive concept may include removing the first hard mask pattern 124a shown in FIG. 12A to FIG. 12C. When the first hard mask pattern 124a is removed, the OZ insulation layer 122 covering the N region N and the P region P may be exposed.

Figure 14A:
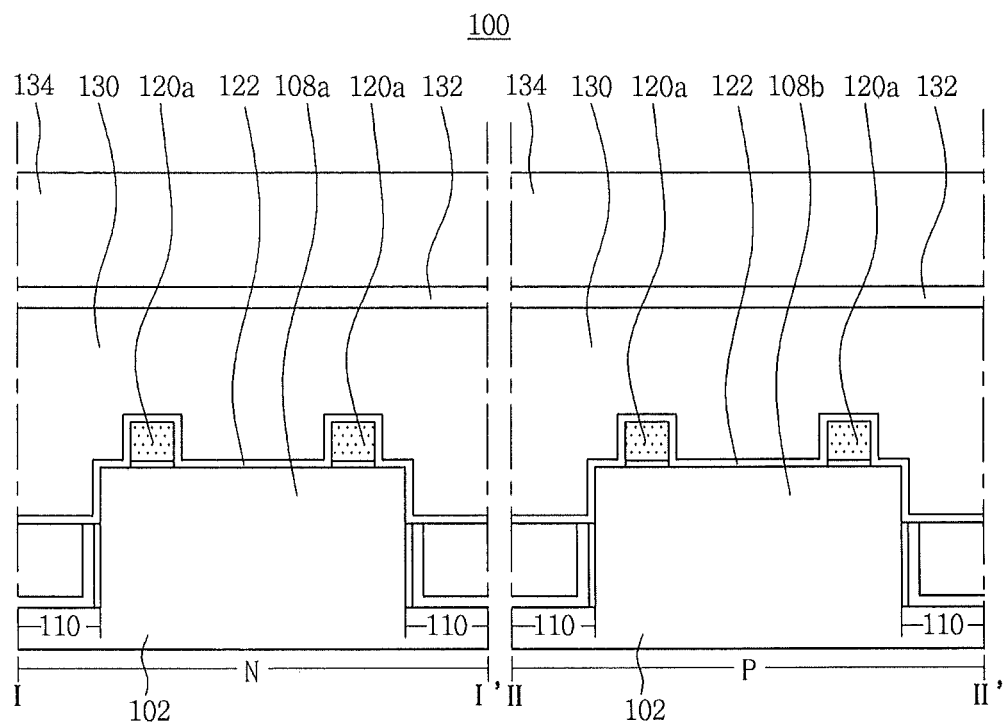
Figure 14B:
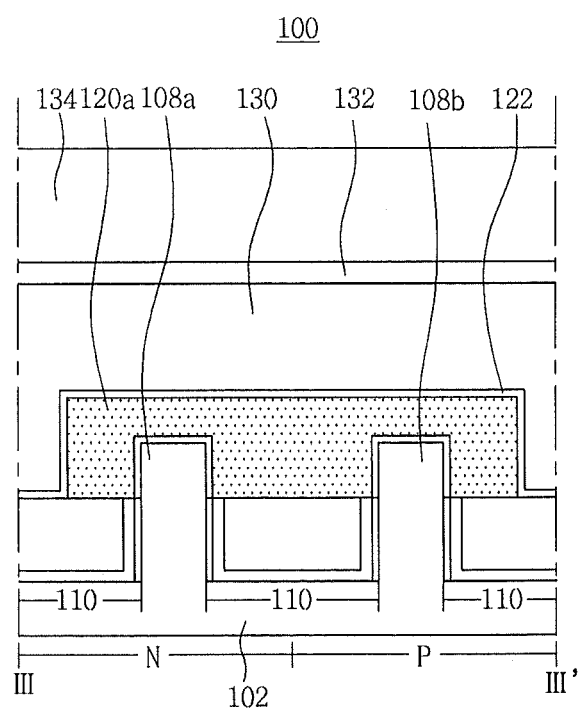
Figure 14C:
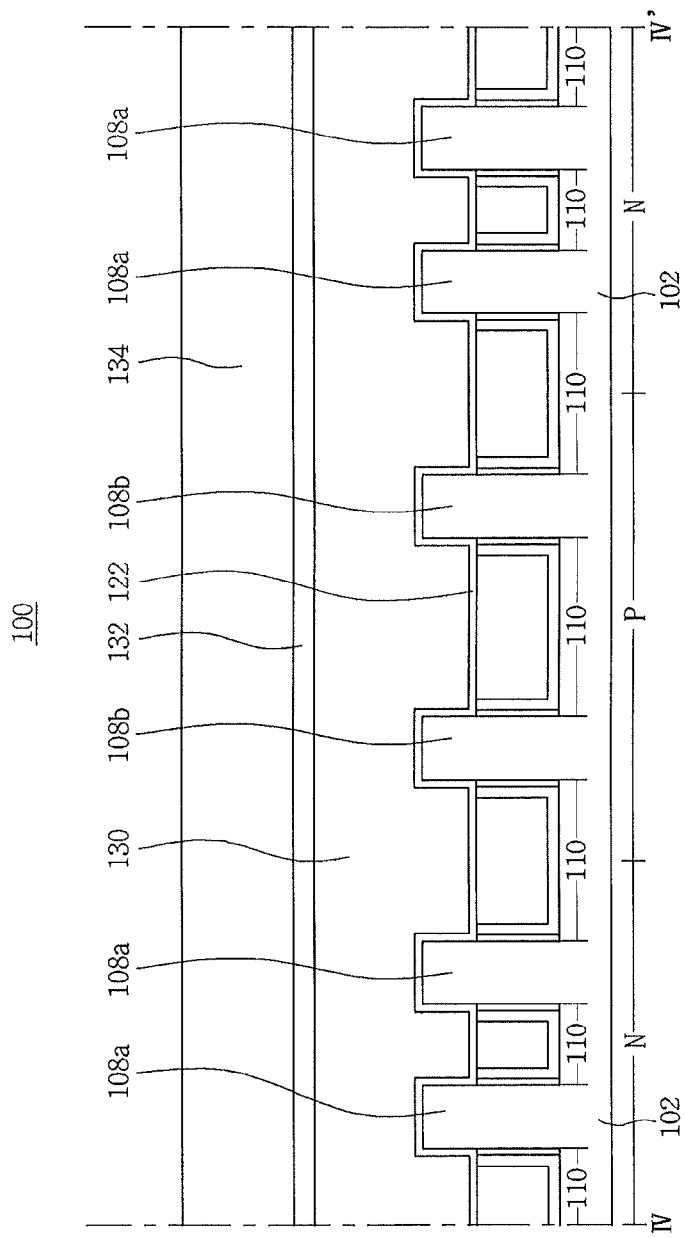

Referring to FIG. 14A, FIG. 14B, and FIG. 14C, the manufacturing method of the semiconductor device according to an embodiment of the inventive concept may include sequentially laminating a second hard mask layer 130, a second hard mask buffer layer 132, and a second PR layer 134 on the upper surface of the OZ insulation layer 122.

The second hard mask layer 130 may include the silicon organic layer as described above. The second hard mask buffer layer 132 may include the silicon oxide layer.

Figure 15A:
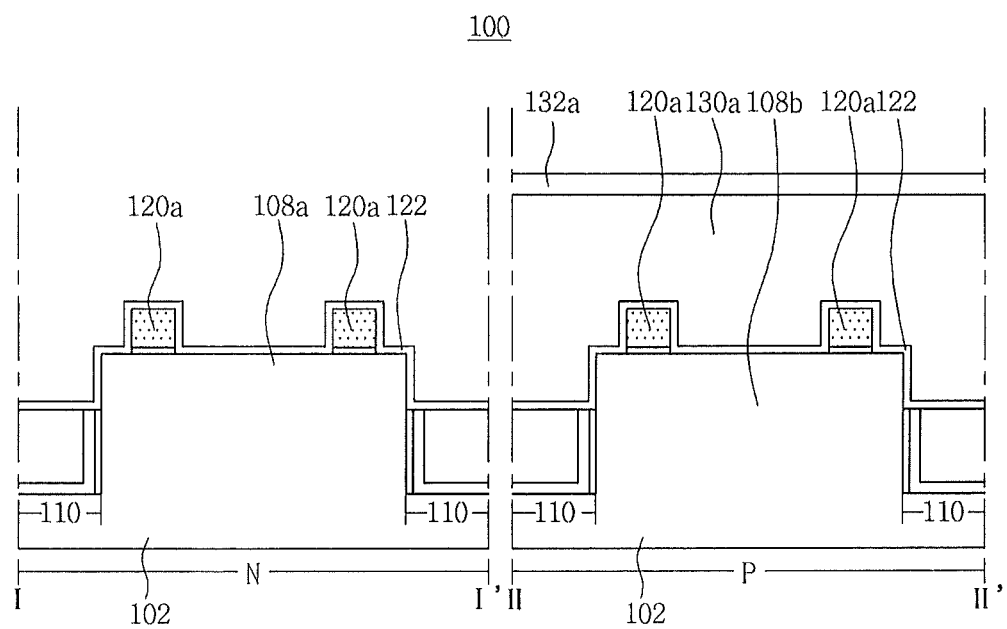
Figure 15B:
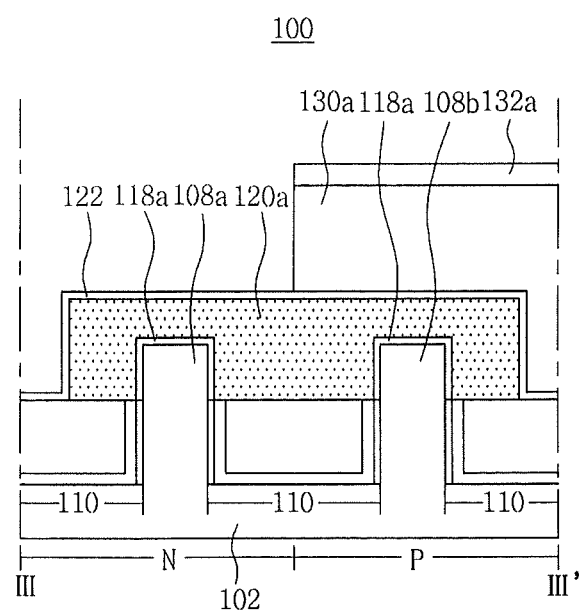
Figure 15C:
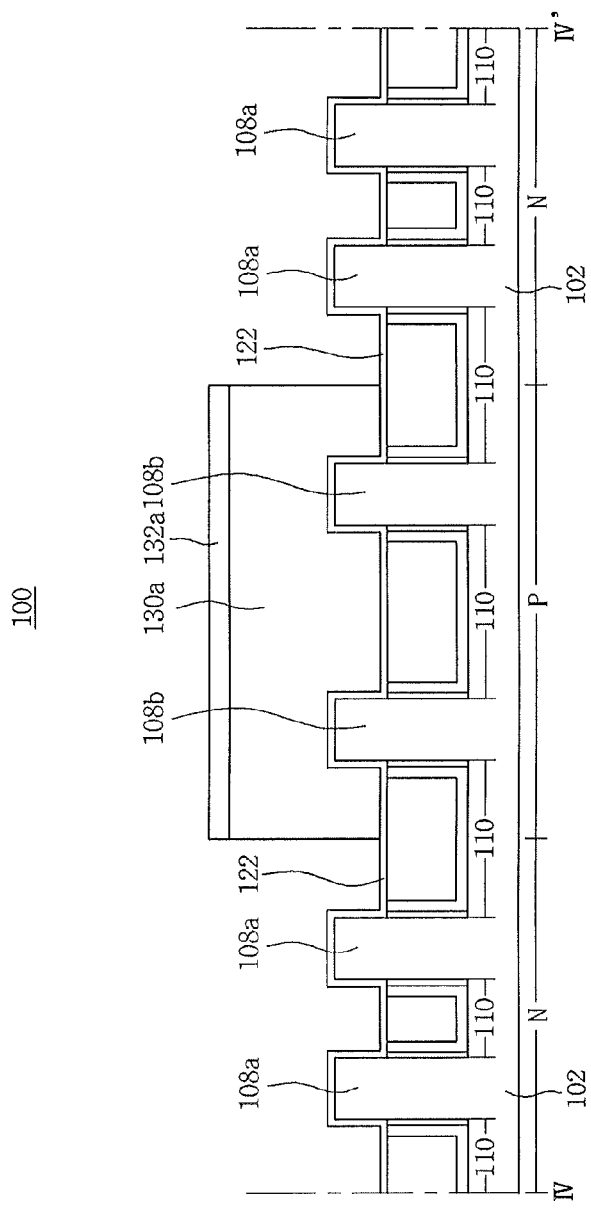

Referring to FIG. 15A, FIG. 15B, and FIG. 15C, the manufacturing method of the semiconductor device according to an embodiment of the inventive concept may include forming a second hard mask pattern 130a and a second hard mask buffer pattern 132a covering the P region P.

The second hard mask buffer pattern 132a may be formed through a photolithography process using the second PR layer 134 shown in FIG. 14A to FIG. 14C. The second hard mask pattern 130a may be patterned using the second hard mask buffer pattern 132a as the etching mask.

Accordingly, the second hard mask pattern 130a and the second hard mask buffer pattern 132a are generally the same shape, and may be formed to be overlapped up and down. The OZ insulation layer 122 may be exposed through the N region N on which the second hard mask pattern 130a is not covered.

Figure 16A:
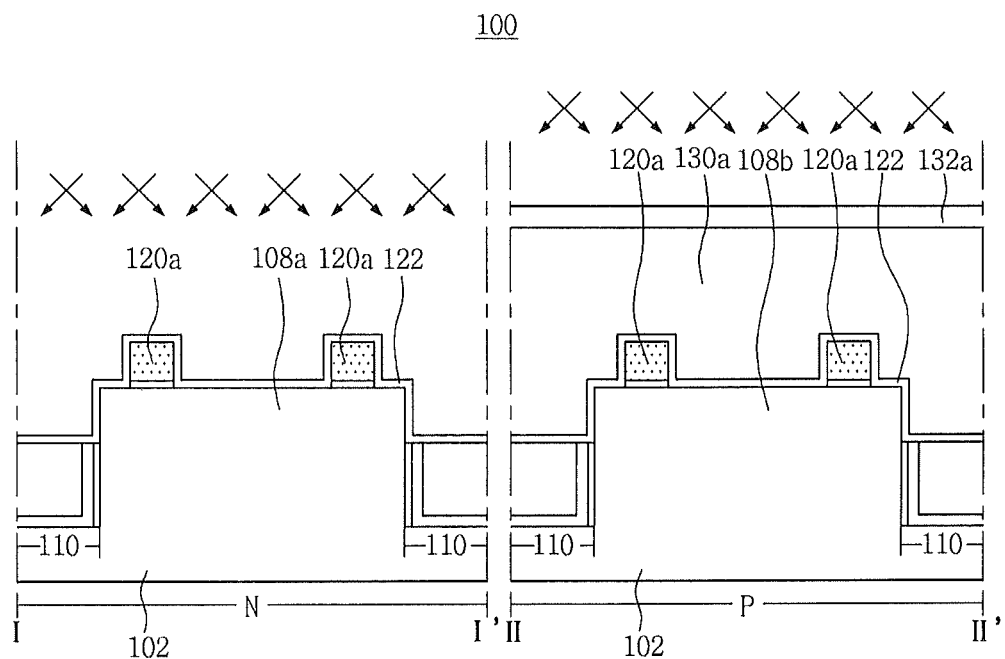
Figure 16B:
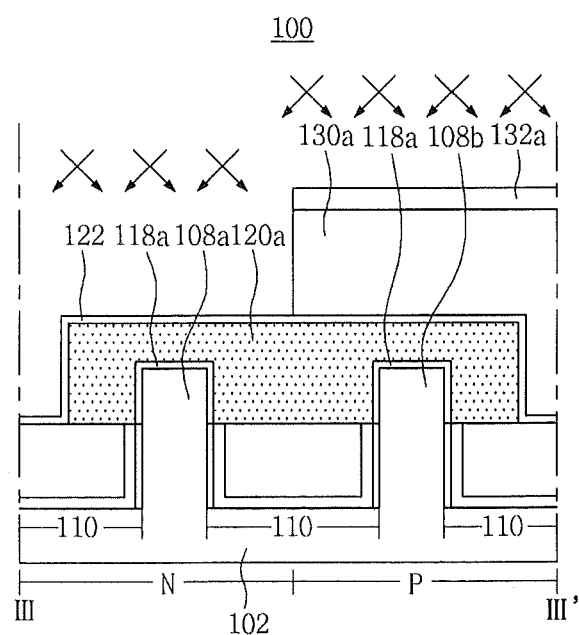
Figure 16C:
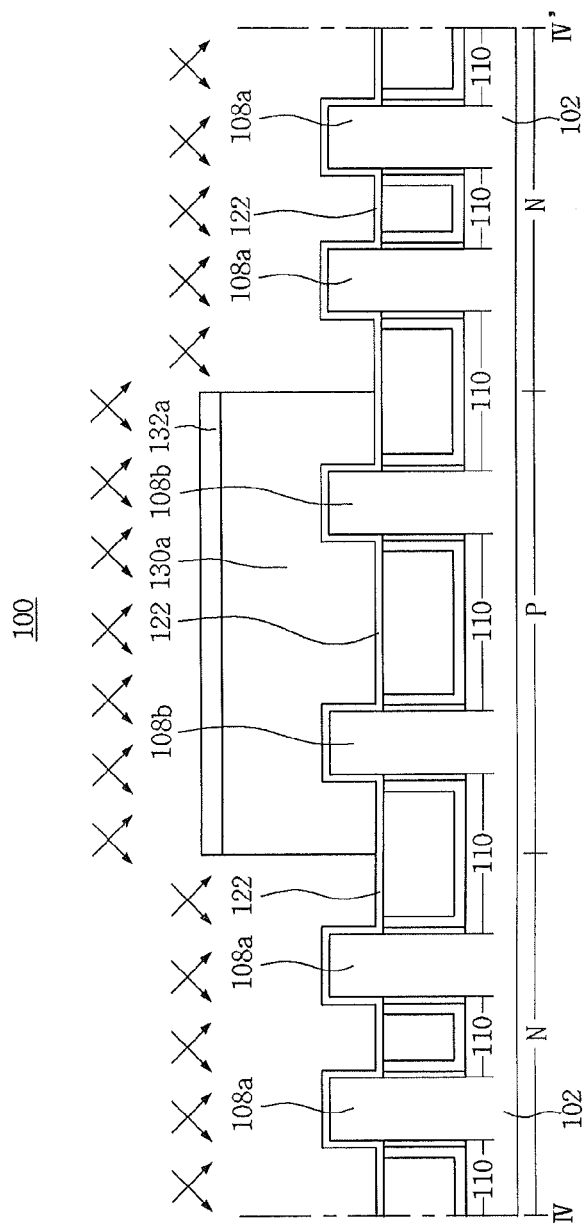

Referring to FIG. 16A, FIG. 16B, and FIG. 16C, the manufacturing method of the semiconductor device according to an embodiment of the inventive concept may include injecting the impurity ions into the N region N.

The impurities injected into the N region N are p-type impurities, and the p-type impurities may include boron (B), indium (In), and/or gallium (Ga), which belong to 3-valent.

The impurity ions injected into the first active fins 108a may be injected in all directions with the tilted angle, which is reasonably determined. The impurity ions may be injected into the first active fins 108a passing through the exposed OZ insulation layer 122. In particular, the threshold voltage of the n-type transistor may be determined depending on the amount of the impurities injected into the sides and the upper surface of the first active fins 108a facing the gate electrodes 120a.

After the impurities are injected, the second hard mask buffer pattern 132a may be removed. In the present process, the processes of removing the second hard mask buffer pattern 132a after the impurities are injected have been described, but the impurity injection process may be performed after the second hard mask buffer pattern 132a is removed first.

Figure 17A:
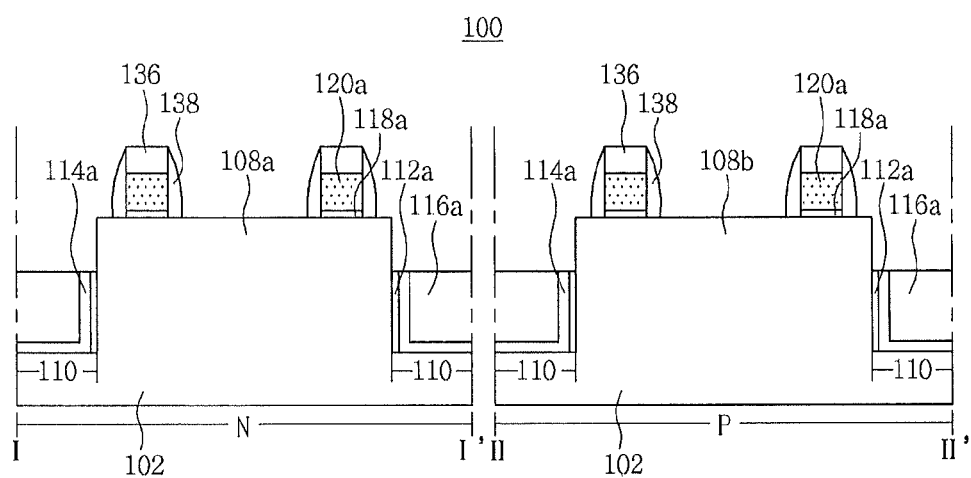
Figure 17B:
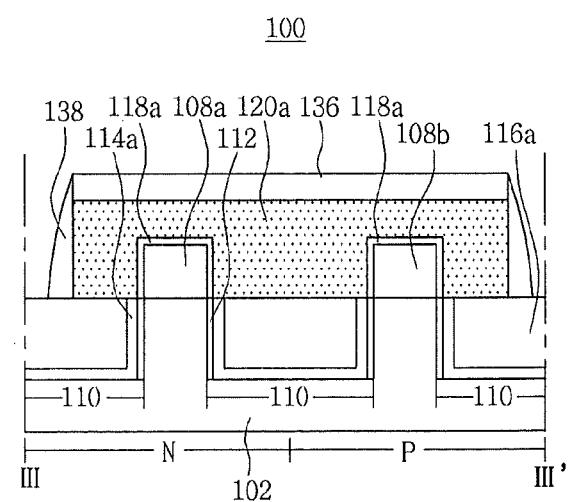
Figure 17C:
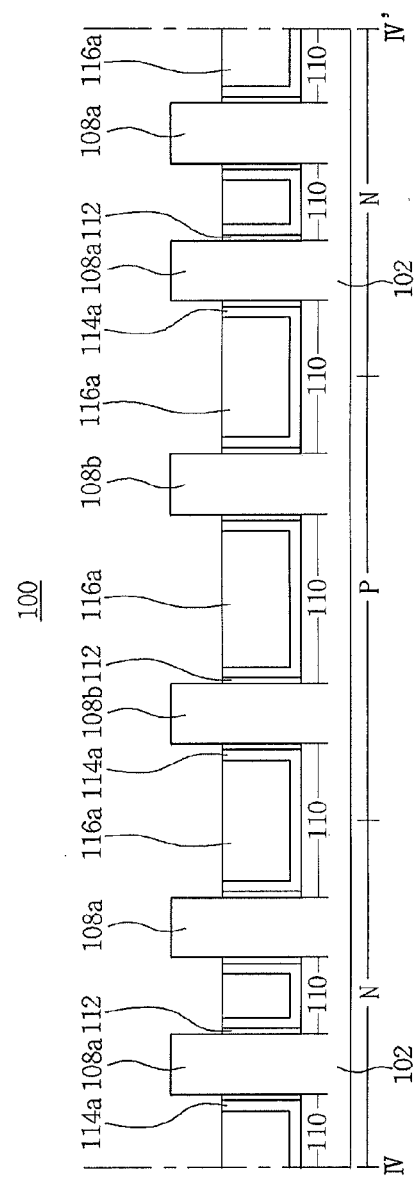

Referring to FIG. 17A, FIG. 17B, and FIG. 17C, the manufacturing method of the semiconductor device according to an embodiment of the inventive concept may include removing the second hard mask pattern 130a shown in FIG. 16A to FIG. 16C. After having removed the second hard mask pattern 130a, an annealing process may be performed. During the annealing process, the impurity ions are diffused and thereby the impurities injected into the region of the first and second active fins 108a and 108b facing the gate electrodes 120a may be distributed evenly. The OZ insulation layer 122 may be removed later.

Next, forming the gate capping layer 136 on the upper surface of the gate electrodes 120a and the side spacers 138 on opposite sides of the gate electrodes 120a respectively may be further included. The first active fins 108a and the second active fins 108b may be exposed in the vicinity of the side spacers 138.

The gate capping layer 136 and the side spacer 138 may include the silicon nitride layer.

As subsequent processes, the manufacturing method of the semiconductor device according to an embodiment of the inventive concept may further include a process of recessing the first active fins 108a and the second active fins 108b, which are exposed in the opposite sides of the gate electrodes 120a, a process of forming polysilicon in the recessed portion with an epitaxial process, a process of forming source and drain regions through injection of impurities into the poly silicon, and the like.

Using the aforementioned processes, the semiconductor device according to an embodiment of the inventive concept may be manufactured, and using the first hard mask layer and second hard mask layer, that is, the SOH layer in which the vertical profile is good as the mask for injecting the impurity ions, the regions in which ions are injected can be correctly defined.

FIG. 18A to FIG. 26A are diagrams taken along lines I-I' and II-II' in FIG. 1, respectively, and FIG. 18B to FIG. 26B and FIG. 18C to FIG. 26C are diagrams taken along lines III-III' and IV-IV' in FIG. 1, respectively, which are process cross-sectional views showing a process sequence of an embodiment of the inventive concept.

Processes prior to the processes of forming a gate electrode and a gate insulation layer to be described below are the same as the processes of FIG. 3A to FIG. 8A, FIG. 3B to FIG. 8B, FIG. 3C to FIG. 8C, and FIG. 3D to FIG. 8D described above, and the same configurations are formed by such processes, and thus description thereof will be omitted.

Figure 18A:
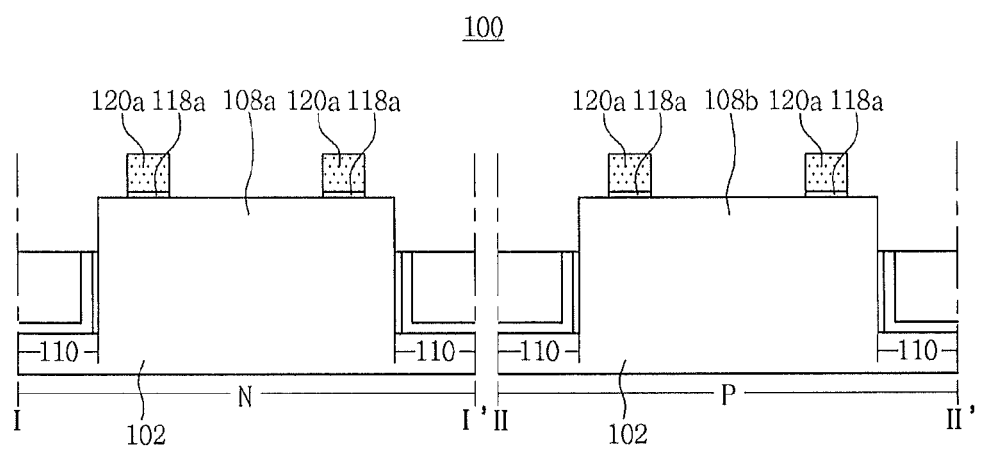
FIG. 18A to FIG. 26A are cross-sectional views taken along lines I-I' and II-II' in FIG. 1, and FIG. 18B to FIG. 26B, and FIG. 18C to FIG. 26C are cross-sectional views taken along lines III-III' and IV-IV' in FIG. 1, showing sequences of a process according to an embodiment of the inventive concept, respectively.
Figure 18B:
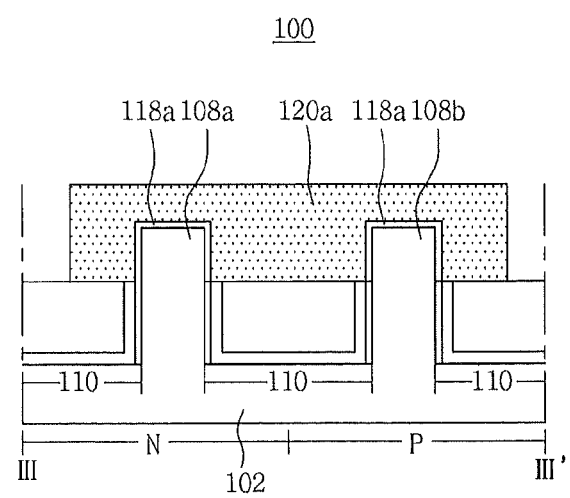
Figure 18C:
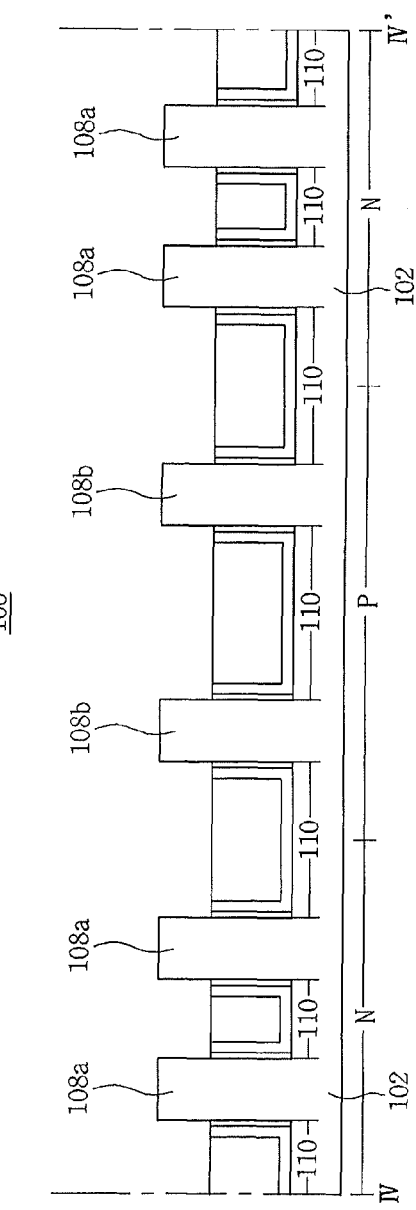

Referring to FIG. 18A, FIG. 18B and FIG. 18C, the manufacturing method of the semiconductor device according to an embodiment of the inventive concept may include forming the gate insulation layers 118a and the gate electrodes 120a.

The gate insulation layers 118a may be placed between the gate electrodes 120a, and the first active fins 108a and the second active fins 108b. Referring to FIG. 1, the gate electrodes 120a may be formed to intersect the first active fins 108a and the second active fins 108b, which are respectively placed in the N region N and the P region P.

Figure 19A:
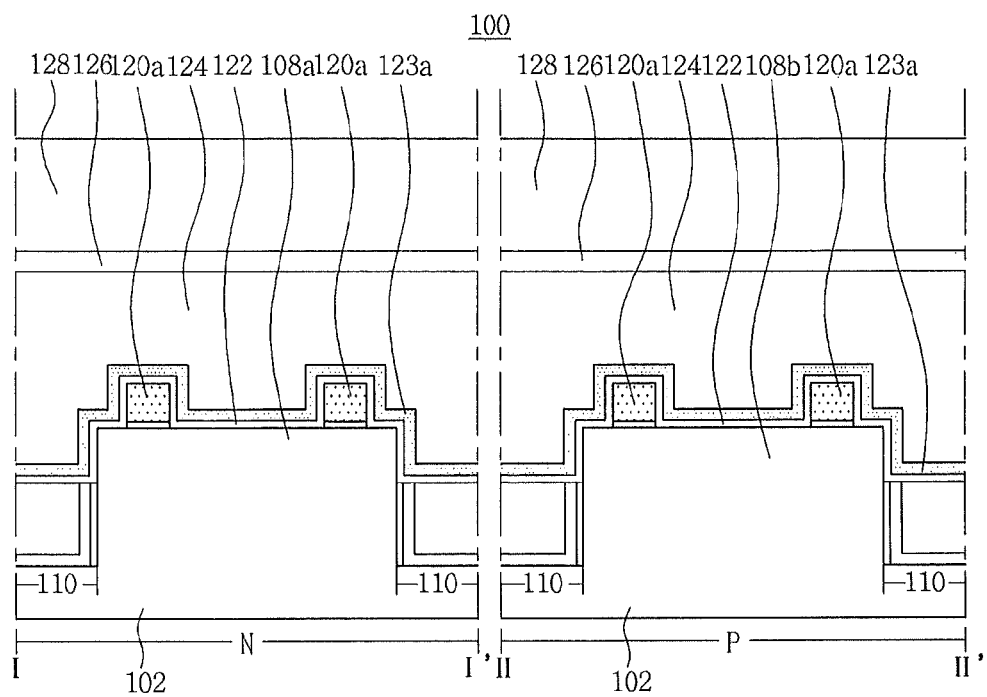
Figure 19B:
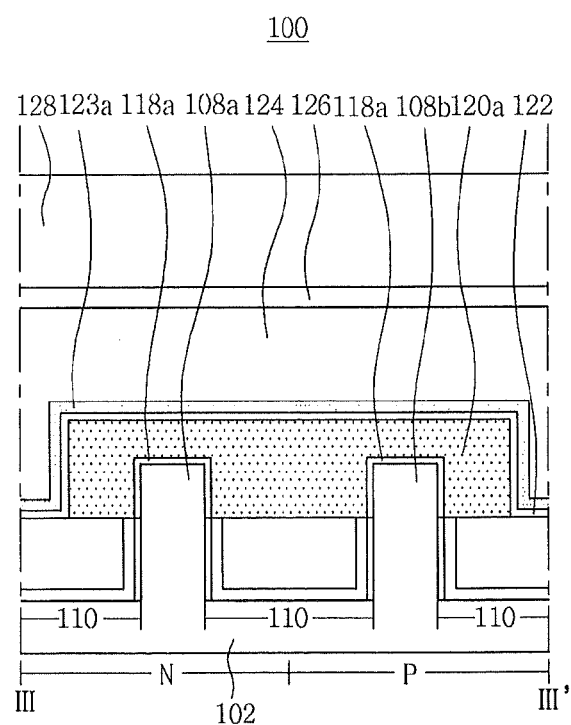
Figure 19C:
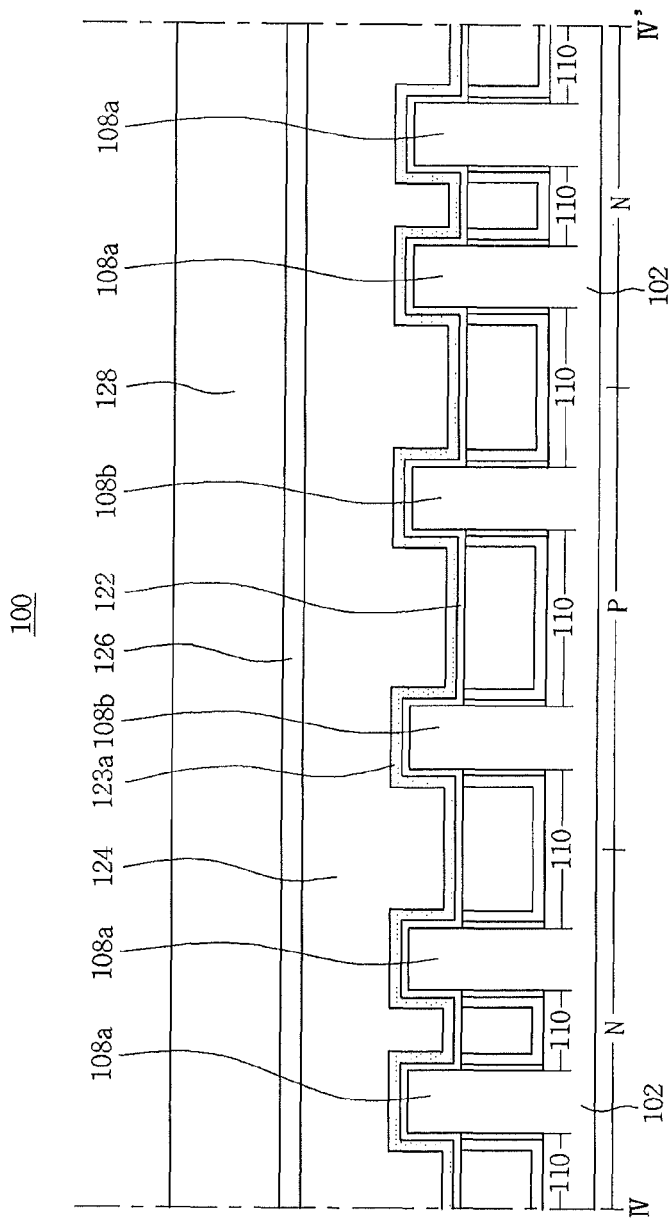

Referring to FIG. 19A, FIG. 19B, and FIG. 19C, the manufacturing method of the semiconductor device according to an embodiment of the inventive concept may include processes of sequentially laminating the OZ insulation layer 122, the etch stop layer 123a, the first hard mask layer 124, the first hard mask buffer layer 126, and the first PR layer 128 on the entire surface of the substrate 102.

The OZ insulation layer 122 may include the silicon nitride layer. The etch stop layer 123a may include the polysilicon layer. The first hard mask layer 124 may include the silicon organic layer described in the above. The first hard mask buffer layer 126 may include the silicon oxide layer.

By configuring the etch stop layer 123a, in the etching process of removing the first hard mask buffer layer 126, which is performed later, because the OZ insulation layer 122 is not affected, the choice range of etching solutions can be widened.

Figure 20A:
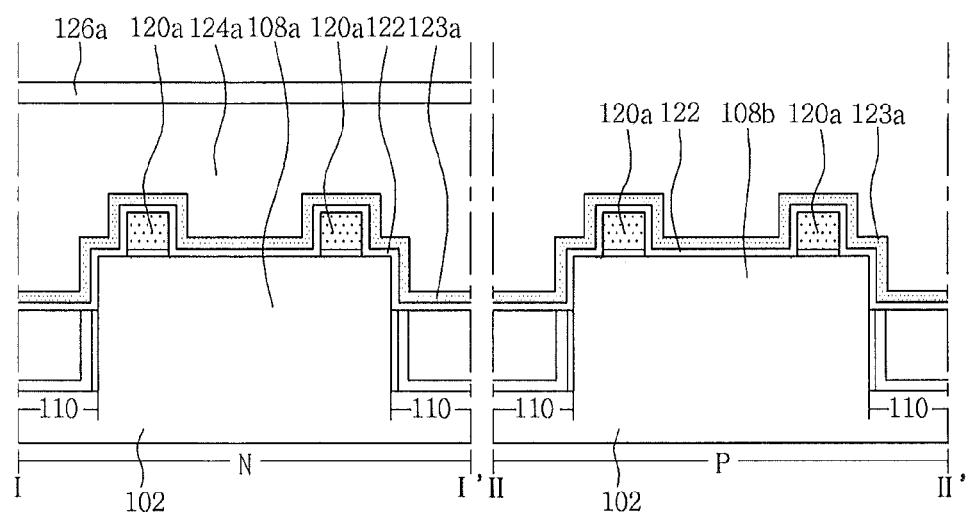
Figure 20B:
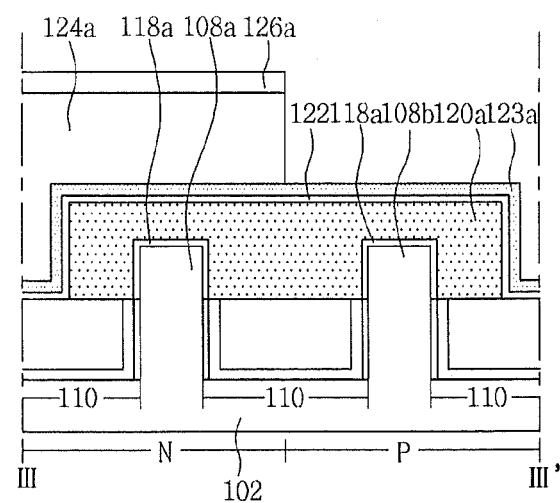
Figure 20C:
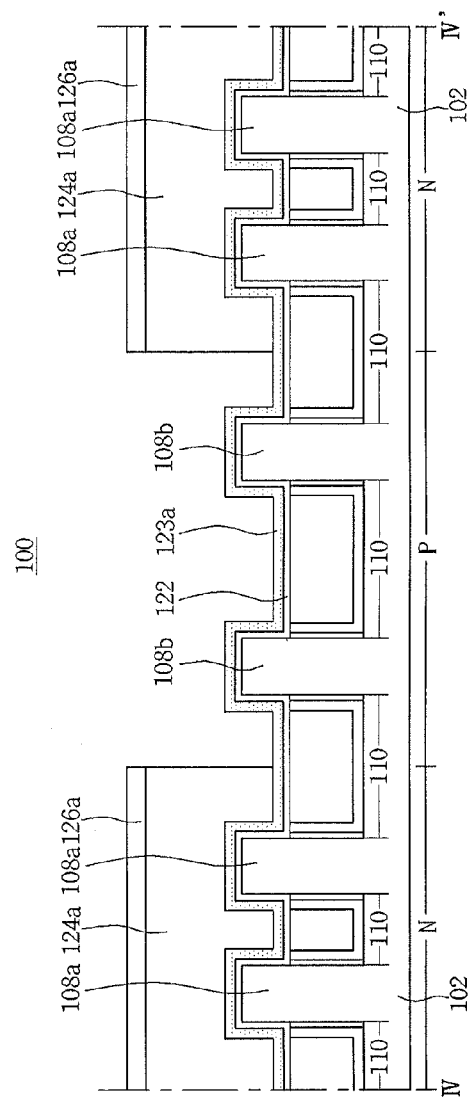

Referring to FIG. 20A, FIG. 20B, and FIG. 20C, the manufacturing method of the semiconductor device according to an embodiment of the inventive concept may include forming the first hard mask pattern 124a and the first hard mask buffer pattern 126a, which cover the N region N.

The first hard mask buffer pattern 126a may be formed through the photo etching using the first PR layer 128 shown in FIG. 19A to FIG. 19C. The first hard mask pattern 124a may be patterned using the first hard mask buffer pattern 126a as the etching mask.

The etch stop layer 123a may be exposed in the P region P on which the first hard mask pattern 124a is not covered.

Figure 21A:
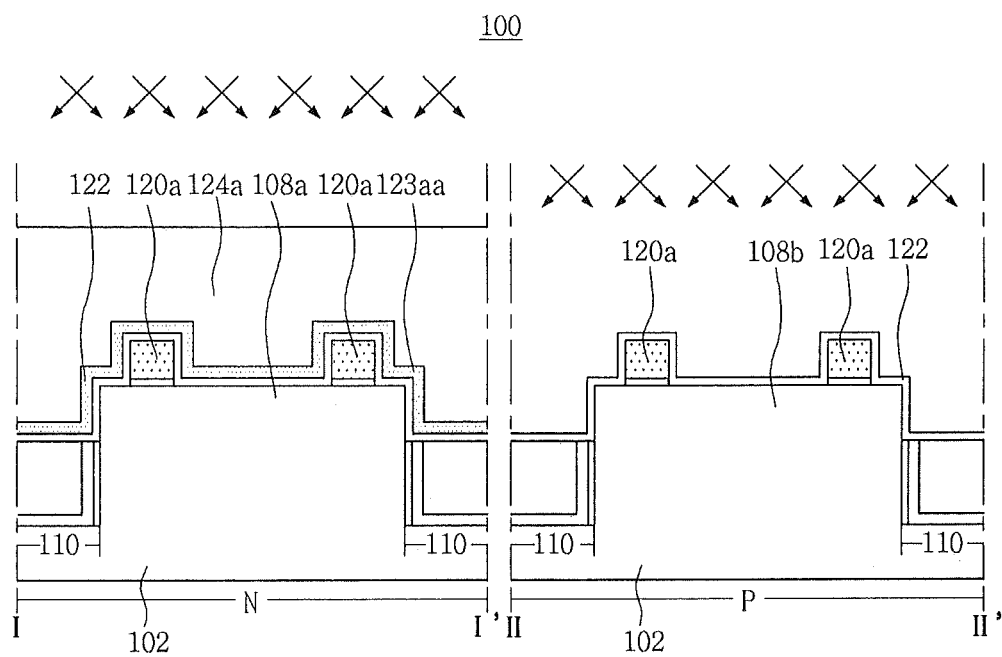
Figure 21B:
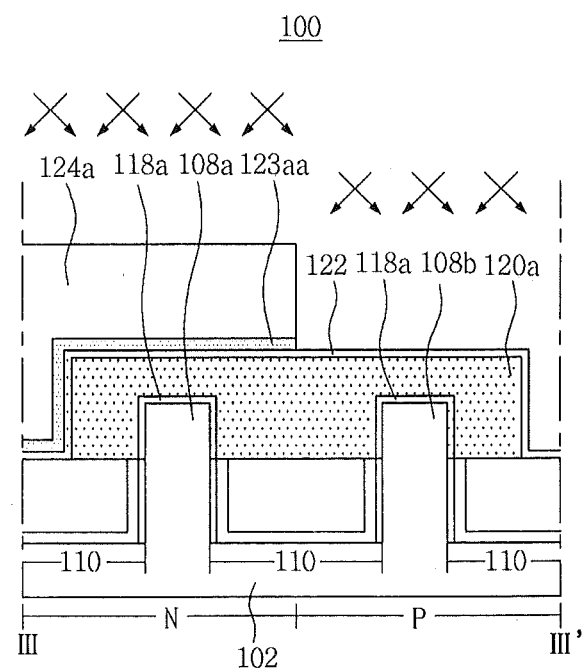
Figure 21C:
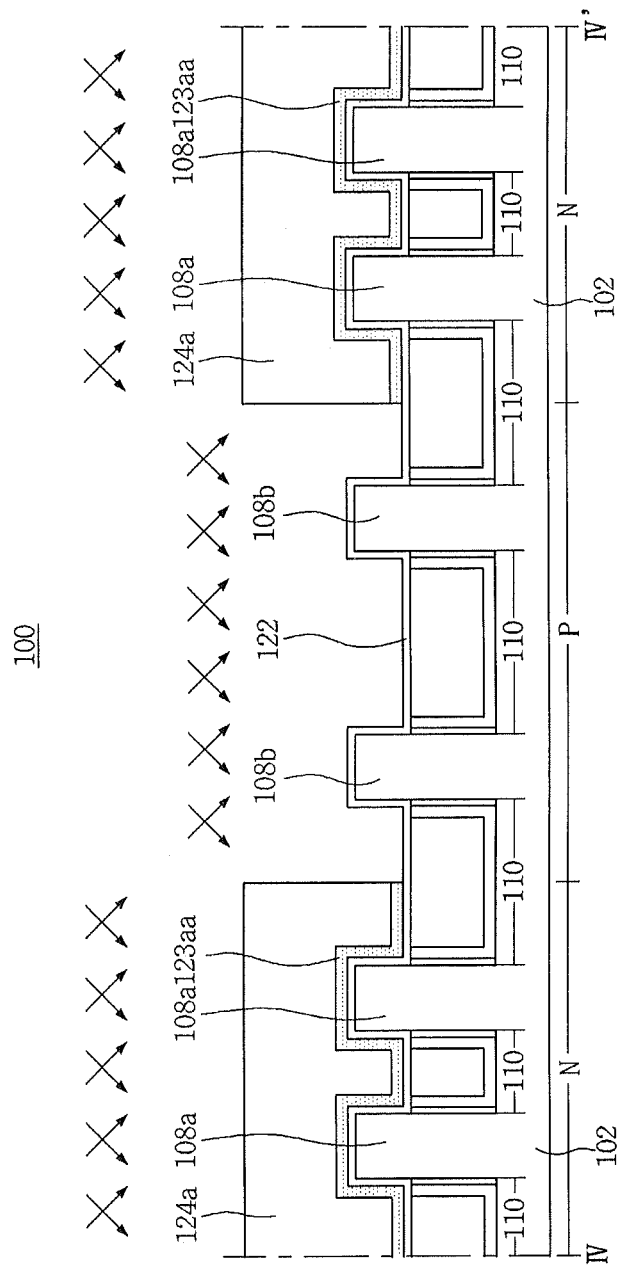

Referring to FIG. 21A, FIG. 21B, and FIG. 21C, the manufacturing method of the semiconductor device according to an embodiment of the inventive concept may include processes of removing the first hard mask buffer pattern 126a and then injecting the impurity ions into the P region P using the first hard mask pattern 124a as the mask as shown in FIG. 20A to FIG. 20C.

While removing the first hard mask buffer pattern 126a, the exposed etch stop layer 123a of the P region P may be removed at the same time. Accordingly, a residual etch stop layer 123aa may remain in a region except the P region P, that is, the N region N and the surrounding region of the substrate 102. Further, the OZ insulation layer 122 may be exposed in the P region P.

The impurity ion injected into the P region P is a n-type impurity, and the n-type impurity may include phosphorus (P), arsenic (As), and/or antimony (Sb), which belong to 5-valent.

The impurity ions injected into the second active fins 108b may be injected in all directions with the tilted angle, which is reasonably determined. The impurity may be injected into the second active fins 108b passing through the exposed OZ insulation layer 122. In particular, the threshold voltage of the p-type transistor may be determined depending on the amount of impurities injected into the sides and the upper surface of the second active fins 108b facing the gate electrodes 120a.

Figure 22A:
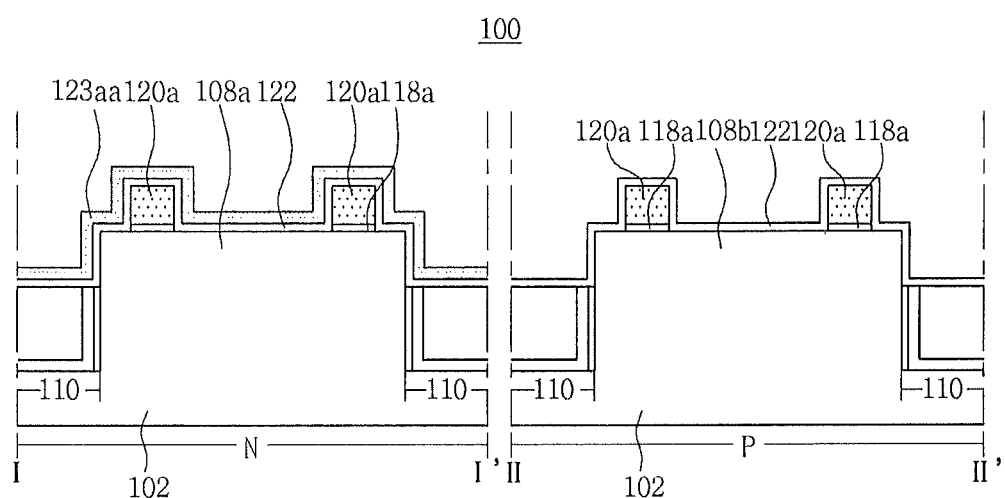
Figure 22B:
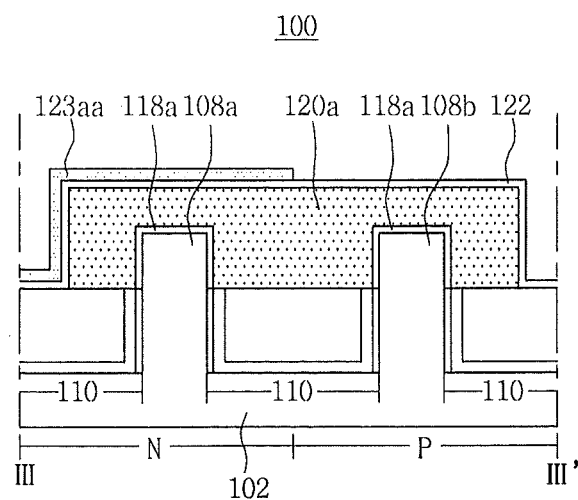
Figure 22C:
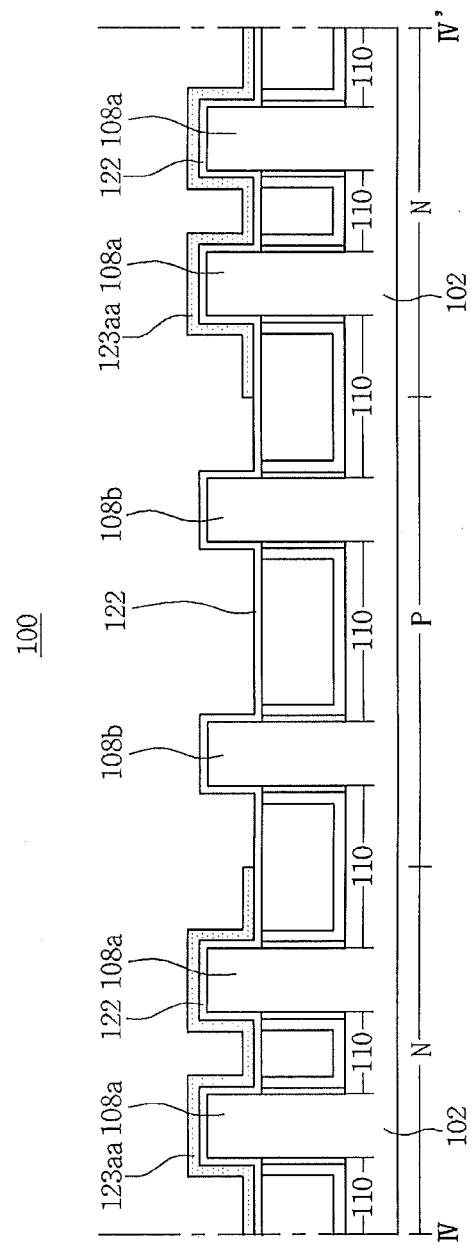

Referring to FIG. 22A, FIG. 22B, and FIG. 22C, the manufacturing method of the semiconductor device according to an embodiment of the inventive concept may include processes of removing the first hard mask pattern 124a shown in FIG. 21A to FIG. 21C.

When the first hard mask pattern 124a is removed, in the N region N and the surrounding region of the substrate 102, the residual etch stop layer 123aa may be exposed and in the P region P, the OZ insulation layer 122 may be exposed.

Figure 23A:
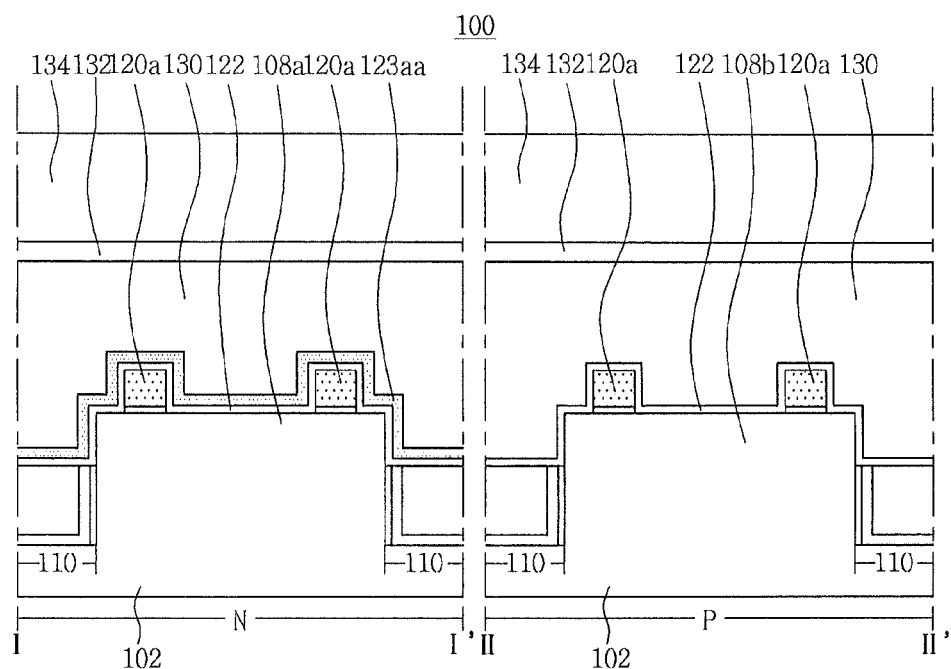
Figure 23B:
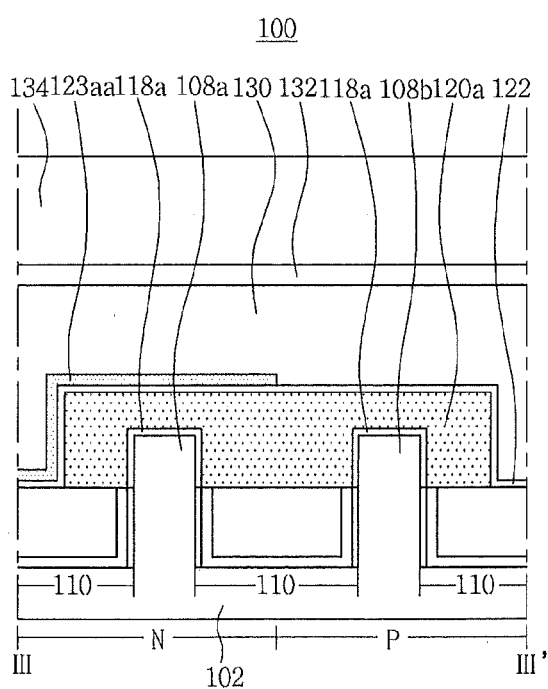
Figure 23C:
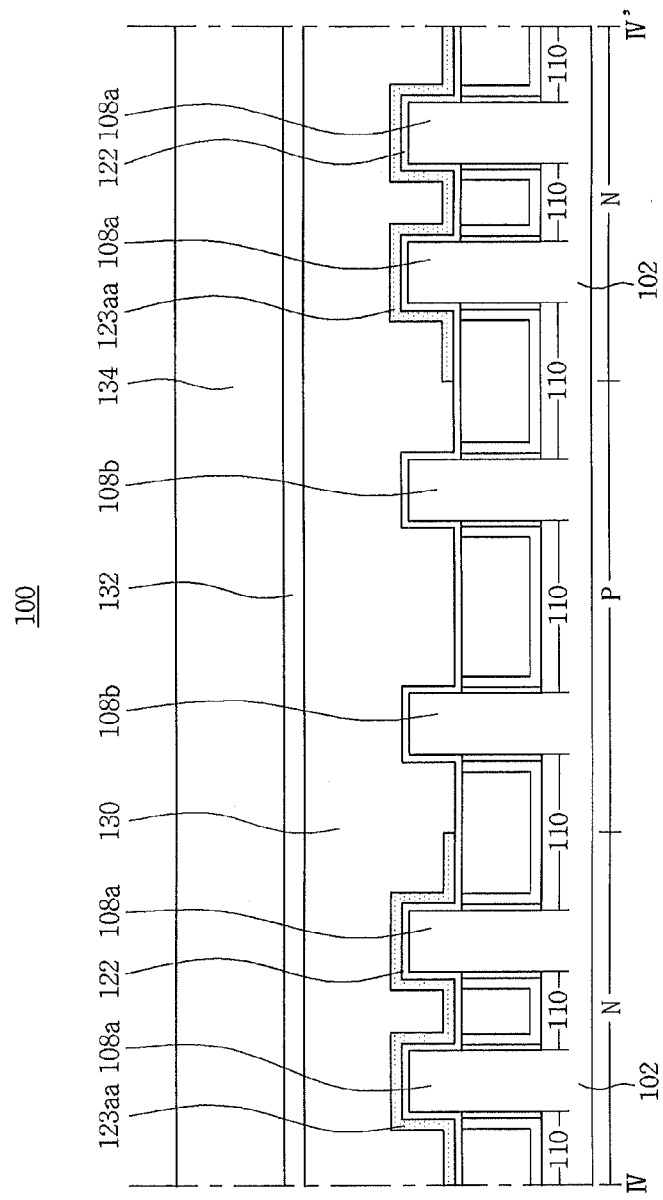

Referring to FIG. 23A, FIG. 23B, and FIG. 23C, the manufacturing method of the semiconductor device according to an embodiment of the inventive concept may include sequentially laminating the second hard mask layer 130, the second hard mask buffer layer 132, and the second PR layer 134.

The second hard mask layer 130, the second hard mask buffer layer 132, and the second PR layer 134 may be sequentially formed on the entire surface of the substrate 102 on which the residual etch stop layer 123aa and the OZ insulation layer 122 are exposed.

The second hard mask layer 130 may include the silicon organic layer described above. The second hard mask buffer layer 132 may include the silicon oxide layer.

Figure 24A:
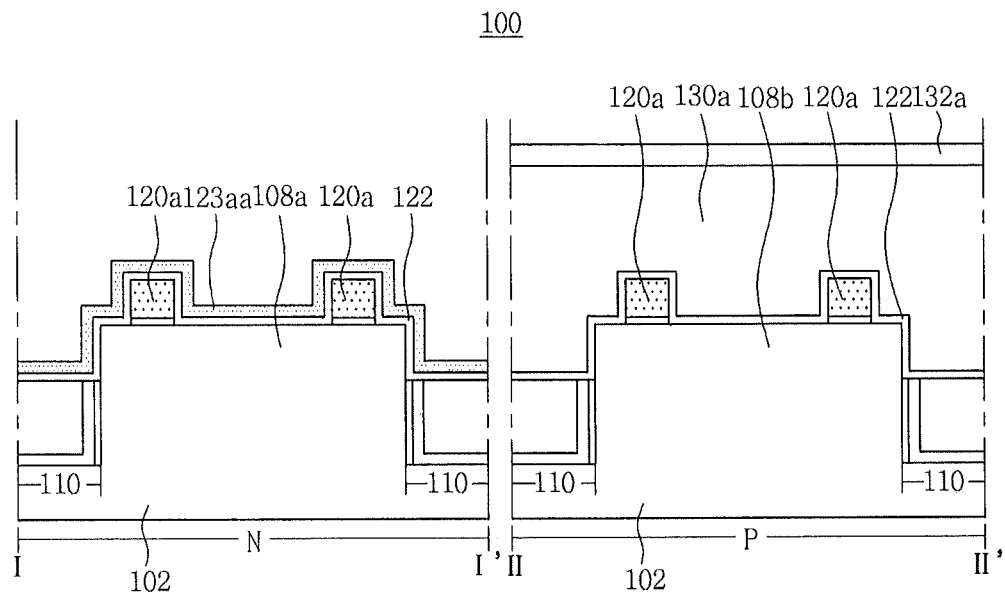
Figure 24B:
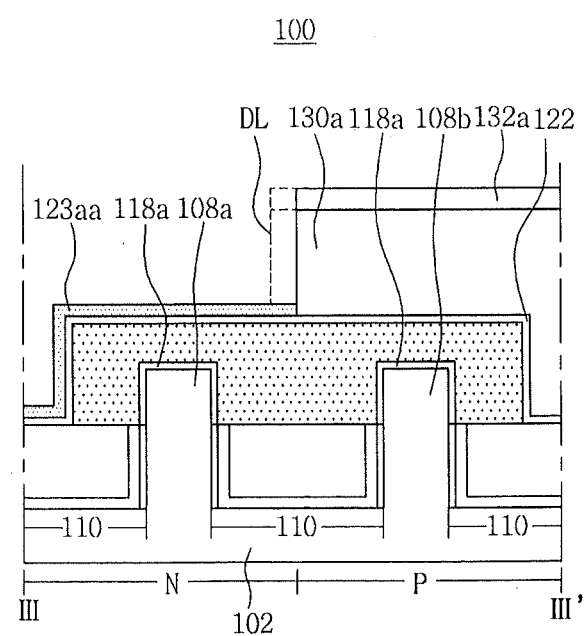
Figure 24C:
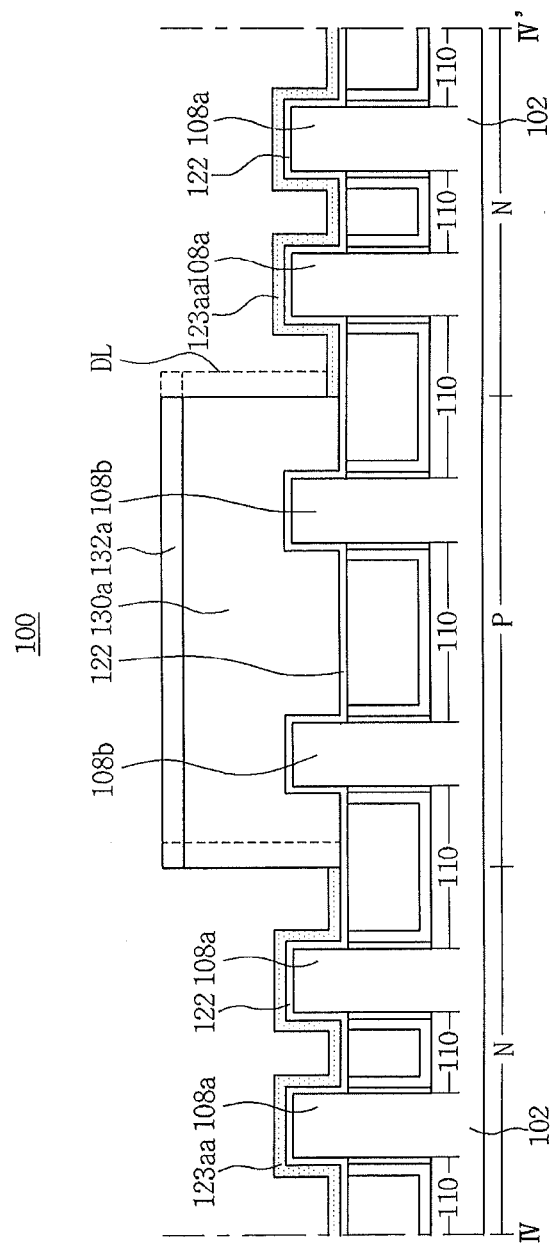

Referring to FIG. 24A, FIG. 24B, and FIG. 24C, the manufacturing method of the semiconductor device according to an embodiment of the inventive concept may include the processes of forming the second hard mask pattern 130a and the second hard mask buffer pattern 132a, which cover the P region P.

The second hard mask pattern 130a and the second hard mask buffer pattern 132a are generally the same shape, and may be formed to be overlapped up and down. The residual etch stop layer 123aa may be exposed in the N region N on which the second hard mask pattern 130a is not covered.

In this case, the second hard mask buffer pattern 132a may be formed by etching the exposed second hard mask buffer layer by developing the second PR layer 134 shown in FIG. 23A to FIG. 23C. In this case, a misalignment of the mask to be used in the process of developing the second PR layer 134 may occur. In this case, a second hard mask pattern DL may be formed partially overlapping one side of the residual etch stop layer 123aa left in the N region N in the vicinity of the boundaries of the N region N and P region P.

Figure 25A:
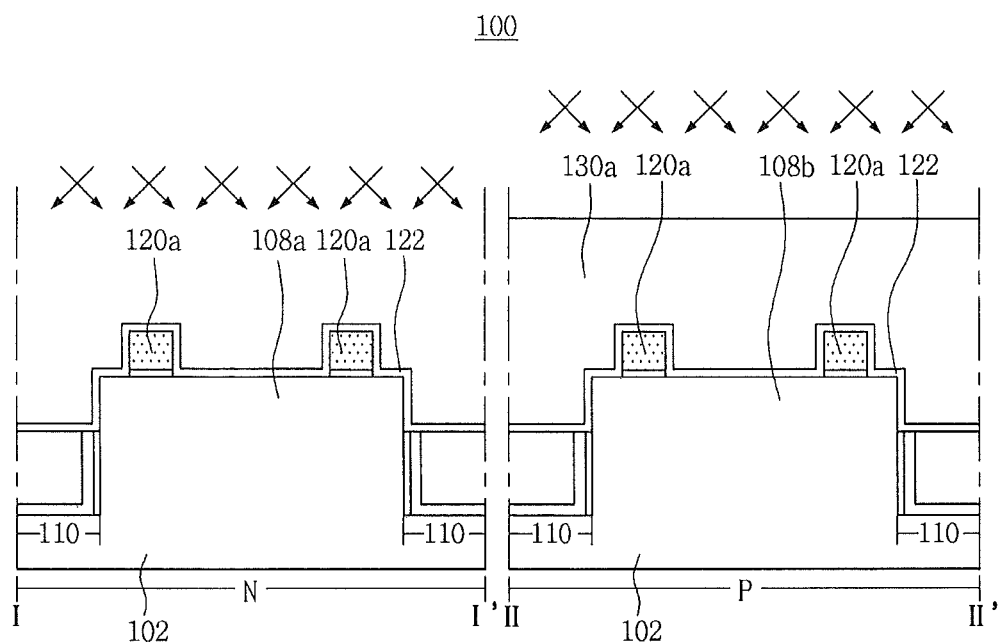
Figure 25B:
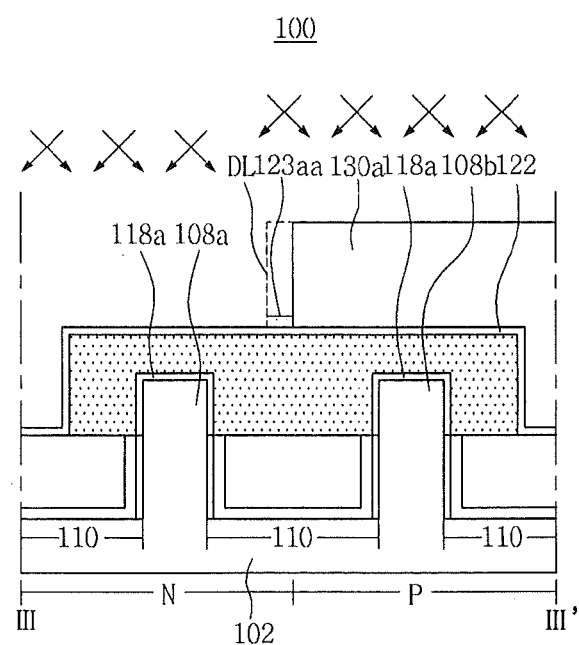
Figure 25C:
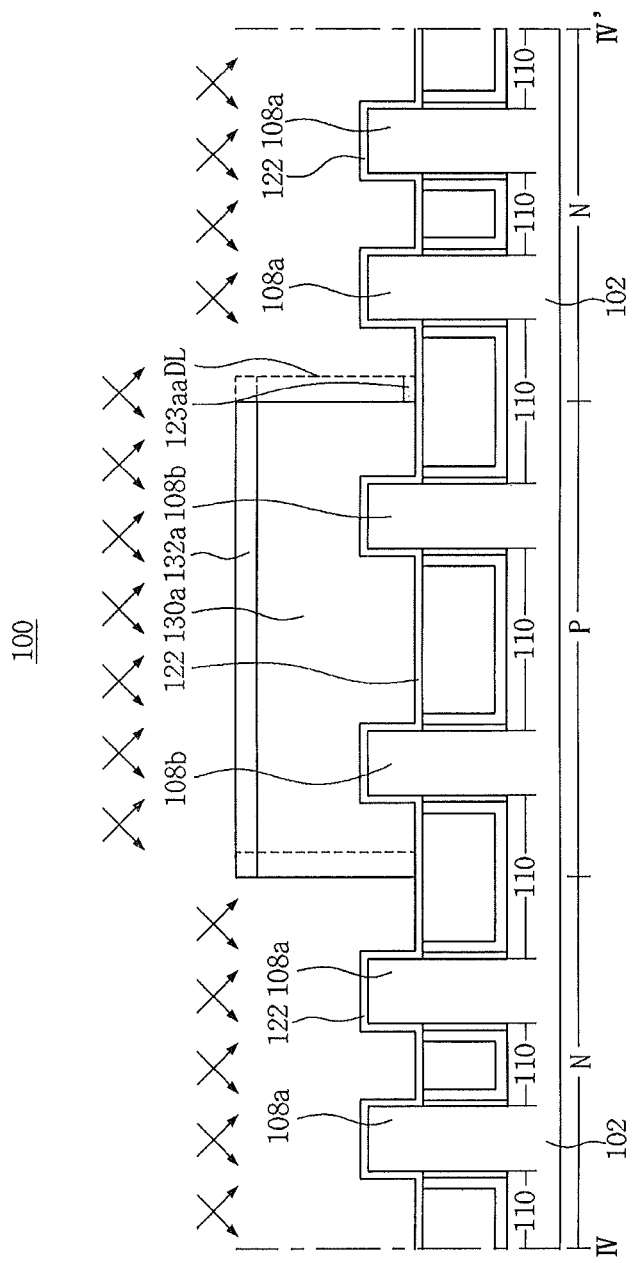

Referring to FIG. 25A, FIG. 25B, and FIG. 25C, the manufacturing method of the semiconductor device according to an embodiment of the inventive concept may include removing the second hard mask buffer pattern 132a and then injecting the impurity ions into the N region N, shown in FIG. 24A to FIG. 24C.

While removing the second hard mask buffer pattern 132a, the residual etch stop layer 123aa exposed in the N region N may be removed at the same time. Accordingly, in the N region N, the OZ insulation layer 122 may be exposed.

The impurities injected into the N region N are p-type impurities, and the p-type impurities may include boron (B), indium (In), and/or gallium (Ga), which belong to 3-valent.

The impurity ions injected into the first active fins 108a may be injected in all directions with the tilted angle, which is reasonably determined. The impurity ions may be injected into the first active fins 108a passing through the exposed OZ insulation layer 122. In particular, the threshold voltage of the n-type transistor may be determined depending on the amount of impurities injected into the sides and the upper surface of the first active fins 108a facing the gate electrodes 120a.

In the present process, the second hard mask buffer pattern 132a of the P region P and the residual etch stop layer 123aa exposed in the N region N are removed at the same time, but in the surrounding region of the substrate 102, the residual etch stop layer 123aa covered by the second hard mask pattern 130a may be present, and also in the vicinity of the boundaries of the N region N and the P region P, the aforementioned residual etch stop layer 123aa, the portion of which is covered by the second hard mask pattern DL, may remain without being removed.

Figure 26A:
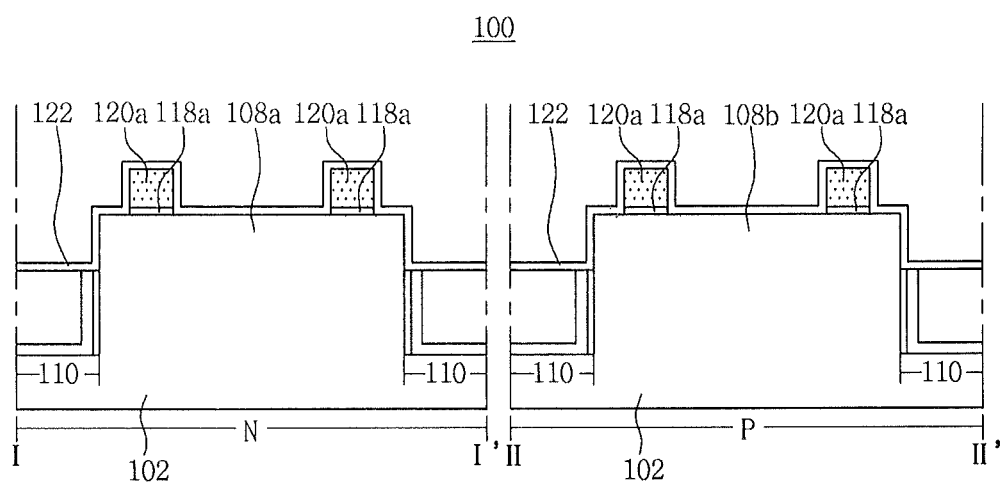
Figure 26B:
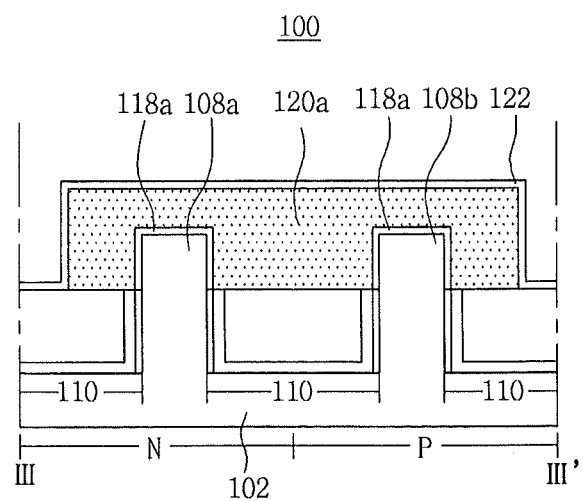
Figure 26C:
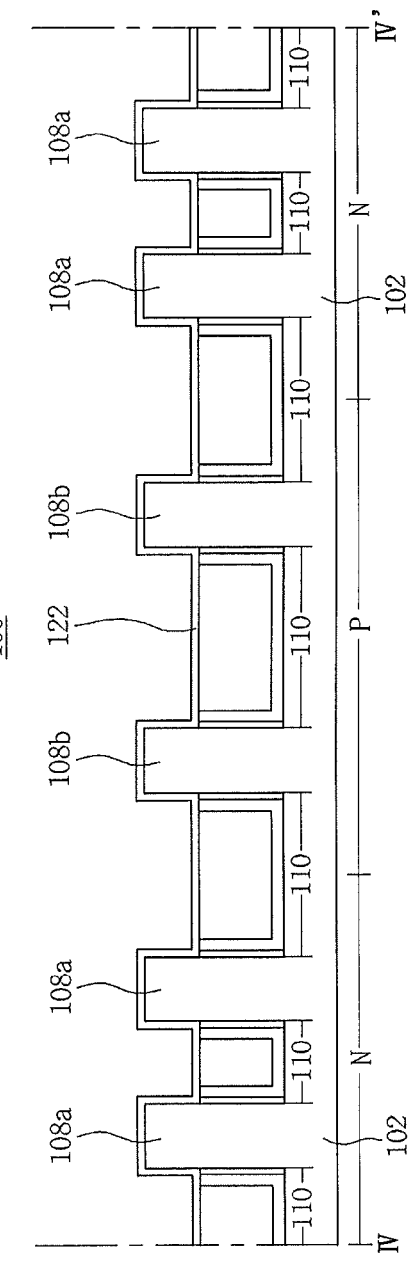

Referring to FIG. 26A, FIG. 26B, and FIG. 26C, the manufacturing method of the semiconductor device according to an embodiment of the inventive concept may include removing the second hard mask pattern 130a shown in FIG. 25A to FIG. 25C. Further, the process of entirely removing the residual etch stop layer 123aa from the substrate, which is described above may be further included. Accordingly, in the entire surface of the substrate 102 including the N region N and P region P, the OZ insulation layer 122 may be exposed.

Next, after the second hard mask pattern 130a is removed, performing the annealing process may be further included. While performing the annealing process, the impurity ions are diffused and thereby the impurities injected into the sides and the upper surface of the first and second active fins 108a and 108b facing the gate electrodes 120a may be distributed generally evenly.

The description with respect to the subsequent processes is the same as that of the processes described with reference to FIG. 17A to FIG. 17C and therefore will be omitted herein.

FIG. 27A to FIG. 36A are cross-sectional views taken along lines I-I' and II-II' in FIG. 1, and FIG. 27B to FIG. 36B and FIG. 27C to FIG. 36C are cross-sectional views taken along lines III-III' and IV-IV' in FIG. 1, showing sequences of a process according to an embodiment of the inventive concept, respectively.

Processes prior to the processes of forming a gate electrode and a gate insulation layer to be described below are the same as the processes of FIG. 3A to FIG. 8A, FIG. 3B to FIG. 8B, and FIG. 3C to FIG. 8C described above in configurations formed by such processes and thus will be omitted.

Figure 27A:
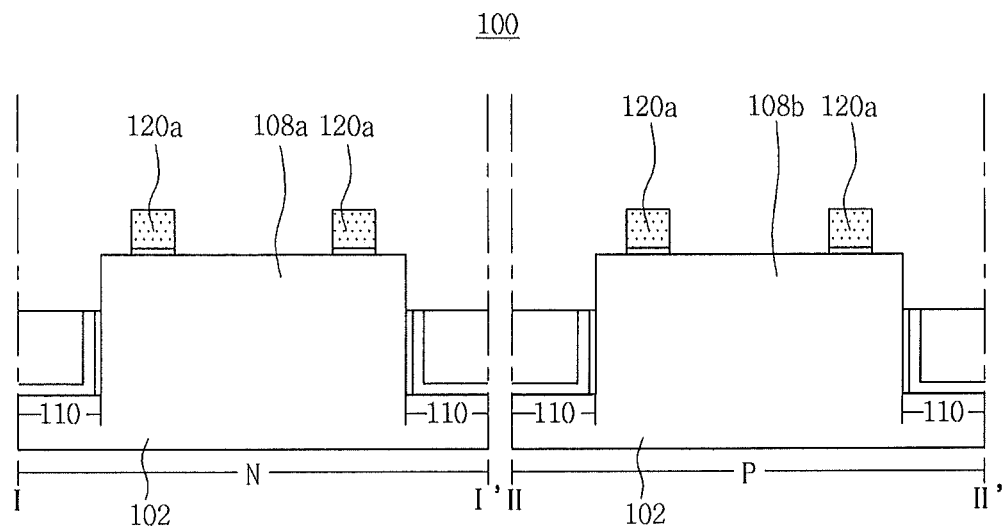
FIG. 27A to FIG. 36A are cross-sectional views taken along lines I-I' and II-II' in FIG. 1, and FIG. 27B to FIG. 36B, and FIG. 27C to FIG. 36C are cross-sectional views taken along lines III-III' and IV-IV' in FIG. 1, showing sequences of a process according to an embodiment of the inventive concept, respectively.
Figure 27B:
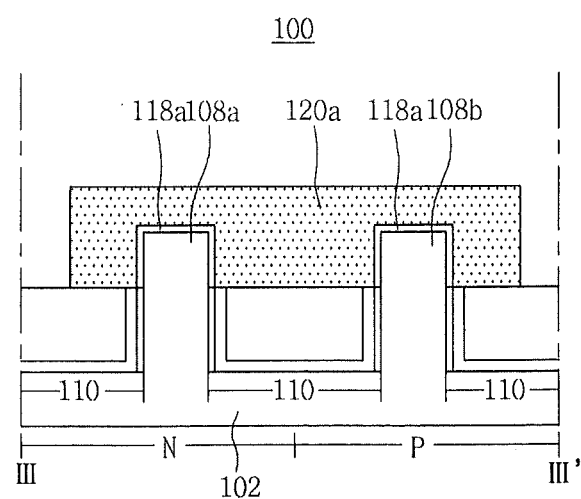
Figure 27C:
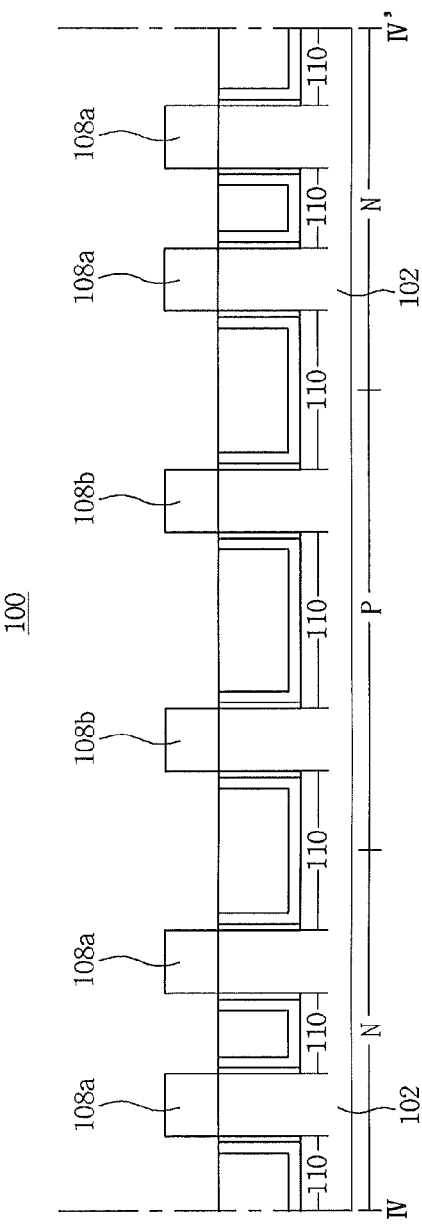

Referring to FIG. 27A, FIG. 27B, and FIG. 27C, the manufacturing method of the semiconductor device according to an embodiment of the inventive concept may include forming the gate insulation layers 118a and the gate electrodes 120a.

The gate insulation layers 118a may be placed between the gate electrodes 120, and the first active fins 108a and the second active fins 108b. The gate electrodes 120a, referring to FIG. 1, may be formed in the direction intersecting the first and second active fins 108a and 108b placed in the N region N and P region P, respectively.

Figure 28A:
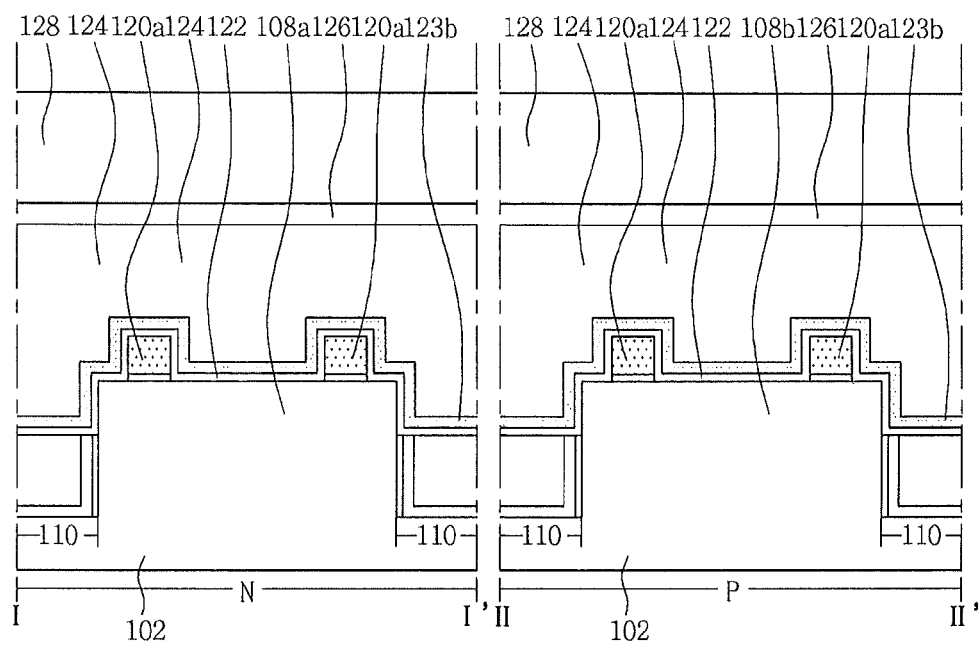
Figure 28B:
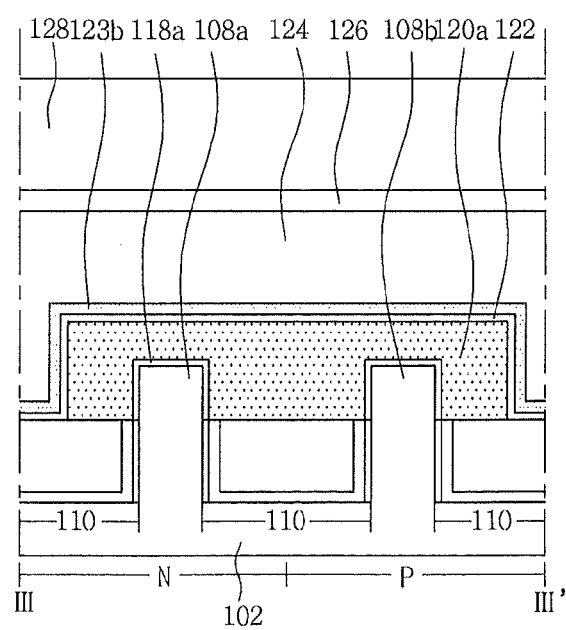
Figure 28C:
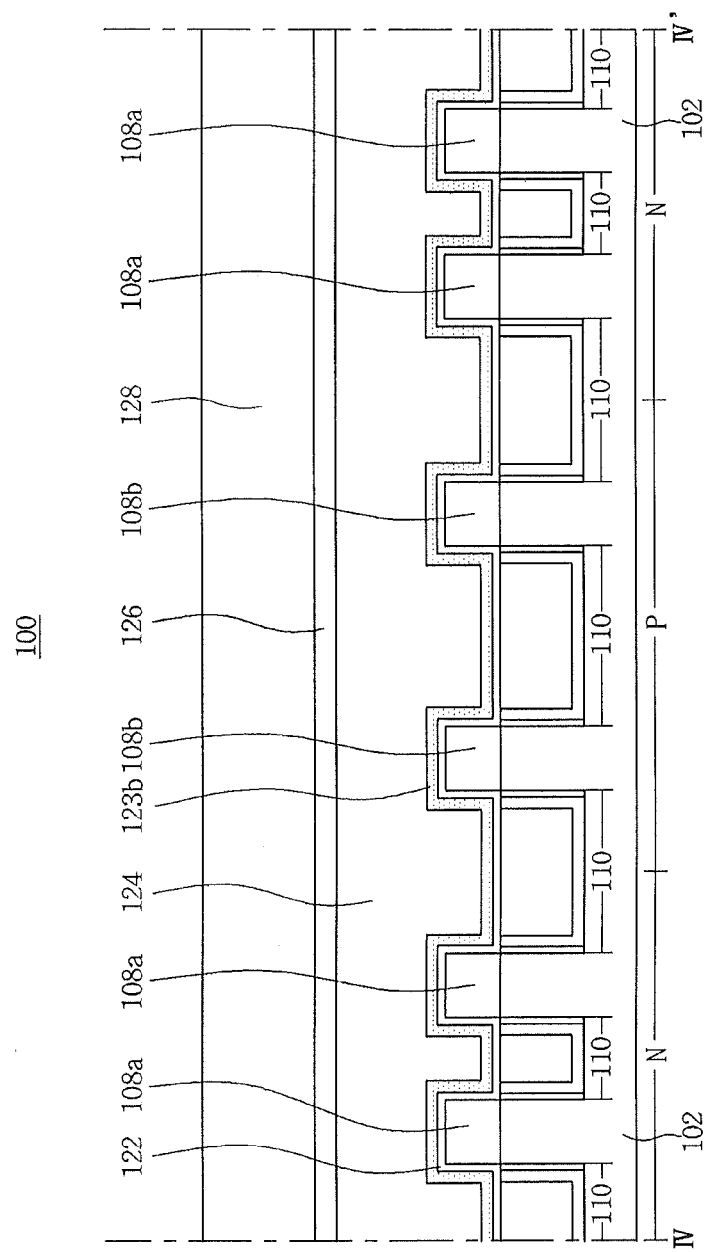

Referring to FIG. 28A, FIG. 28B, and FIG. 28C, the manufacturing method of the semiconductor device according to an embodiment of the inventive concept may include forming the OZ insulation layer 122, a first etch stop layer 123b, the first hard mask layer 124, the first hard mask buffer layer 126, and the first PR layer 128.

The OZ insulation layer 122 may be formed on the entire surface of the substrate 102 including the gate electrodes 120a. The first etch stop layer 123b, the first hard mask layer 124, the first hard mask buffer layer 126, and the first PR layer 128 may be sequentially laminated on the upper surface of the OZ insulation layer 122.

The OZ insulation layer 122 may include the silicon nitride layer. The first etch stop layer 123b may include the polysilicon layer. The first hard mask layer 124 may include the silicon organic layer described above. The first hard mask buffer layer 126 may include the silicon oxide layer.

The first etch stop layer 123b is a configuration for reducing or preventing damage to the OZ insulation layer 122 caused by the wet solution in the subsequent wet etching process. By configuring the first etch stop layer 123b, in the subsequent patterning process, the choice range of the etching solutions can be widened.

Figure 29A:
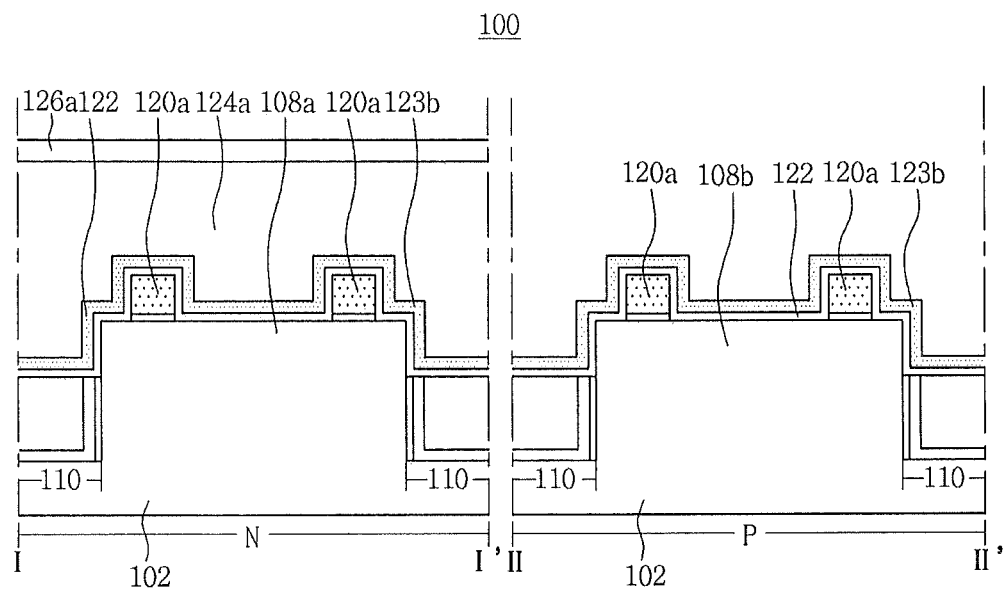
Figure 29B:
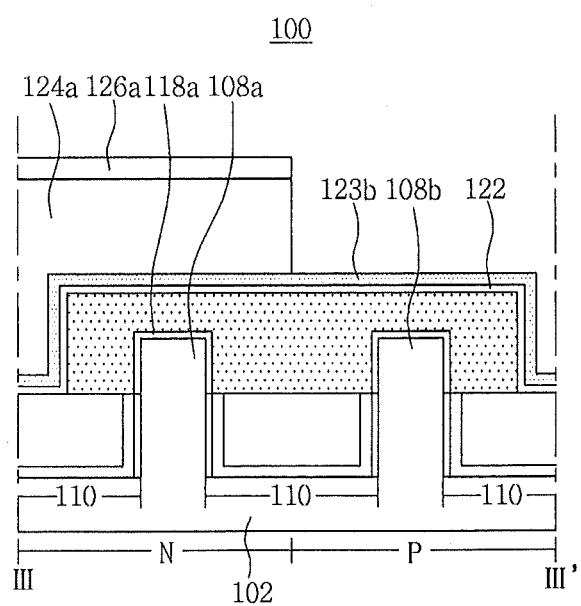
Figure 29C:
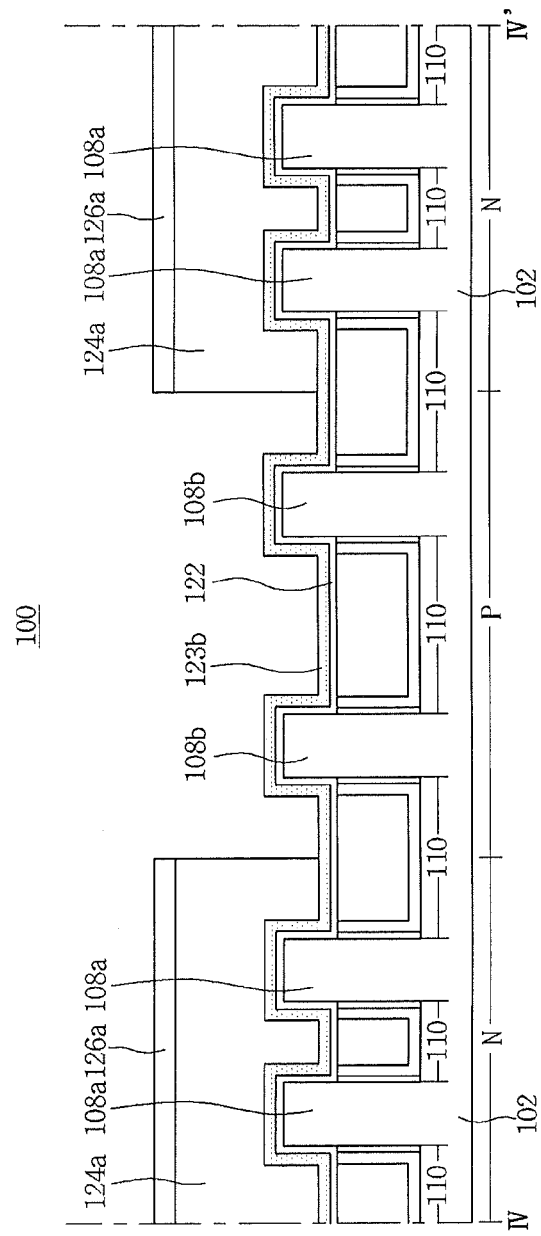

Referring to FIG. 29A, FIG. 29B, and FIG. 29C, the manufacturing method of the semiconductor device according to an embodiment of the inventive concept may include forming the first hard mask pattern 124a and the first hard mask buffer pattern 126a covering the N region N.

The first hard mask buffer pattern 126a may be formed through the photolithography process using the first PR layer 128 shown in FIG. 28A to FIG. 28C. The first hard mask pattern 124a may be patterned using the first hard mask buffer pattern 126a as the etching mask.

In the P region P on which the first hard mask pattern 124a is not covered, the first etch stop layer 123b may be exposed.

Figure 30A:
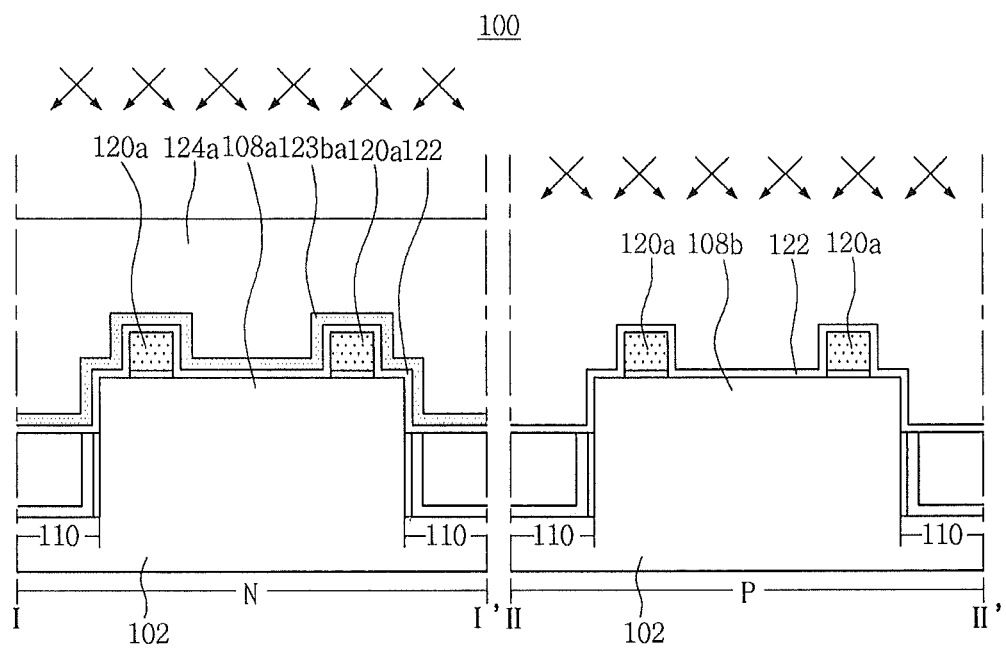
Figure 30B:
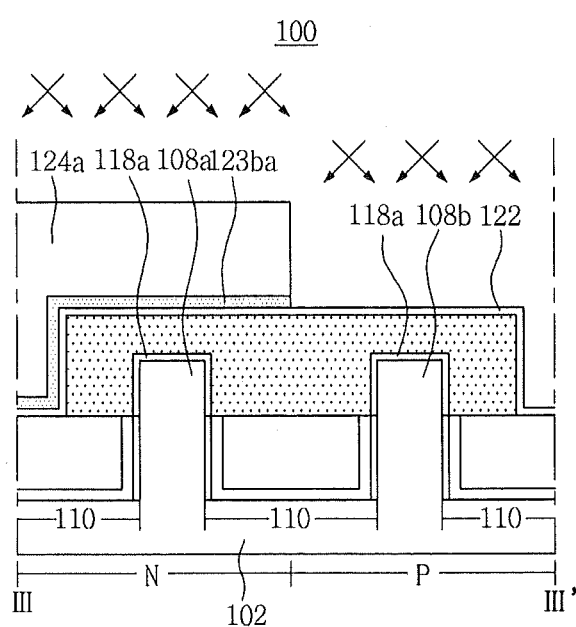
Figure 30C:
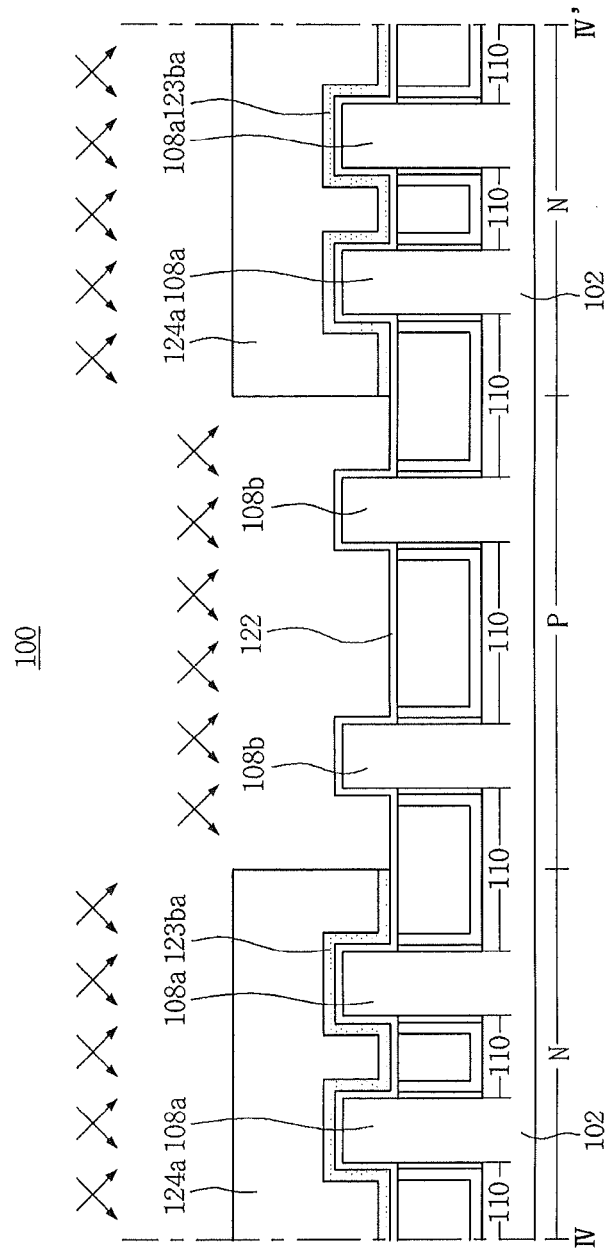

Referring to FIG. 30A, FIG. 30B, and FIG. 30C, the manufacturing method of the semiconductor device according to an embodiment of the inventive concept may include removing the first hard mask buffer pattern 126a shown in FIG. 29A to FIG. 29c and then injecting the impurity ions into the P region P using the first hard mask pattern 124a as the mask.

While the first hard mask buffer pattern 126a is removed, the exposed first etch stop layer 123b of the P region P may be removed at the same time. Accordingly, in the region except the P region P, that is, the N region N and the surrounding region of the substrate 102, the first residual etch stop layer 123ba is left. In the P region P, the OZ insulation layer 122 may be exposed.

The impurities injected into the P region P are n-type impurities, and the n-type impurities may include phosphorus (P), arsenic (As), and/or antimony (Sb), which belong to 5-valent.

The impurity ions injected into the second active fins 108b may be injected from all directions with the tilted angle determined reasonably. The impurities may be injected into the second active fins 108b passing through the exposed OZ insulation layer 122. In particular, depending on the amount of the impurities injected into the sides and the upper surface of the second active fins 108b facing the gate electrodes 120a, the threshold voltage of the p-type transistor may be determined.

Figure 31A:
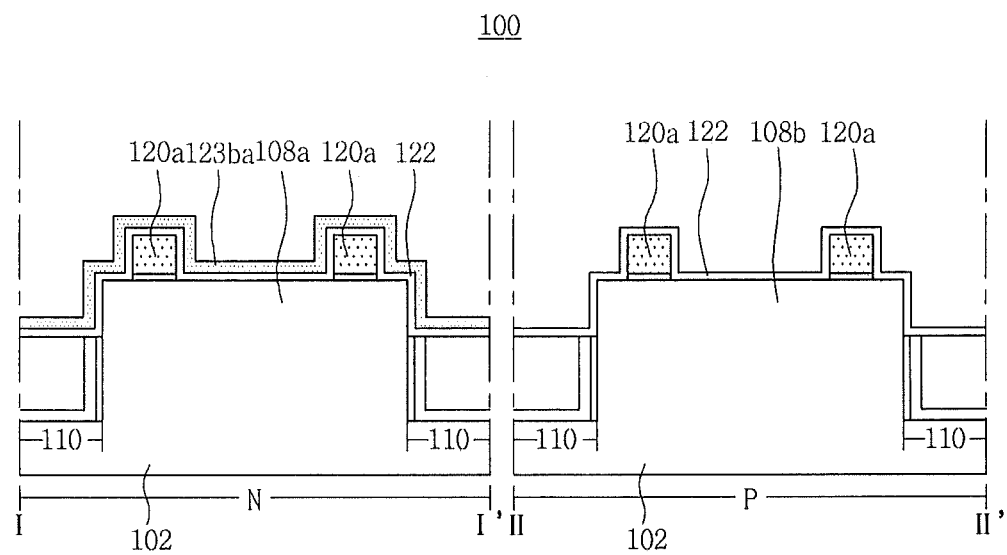
Figure 31B:
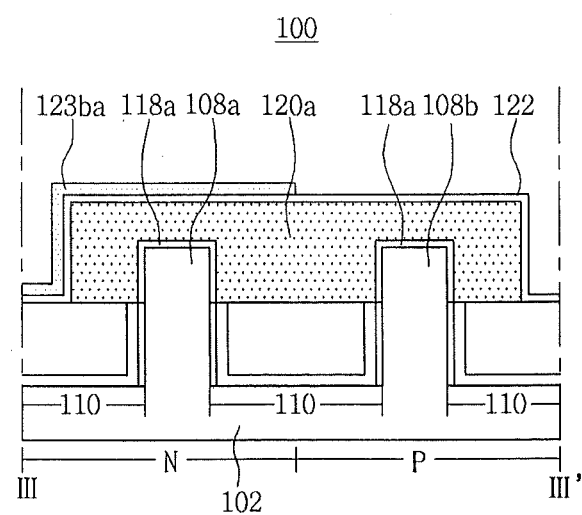
Figure 31C:
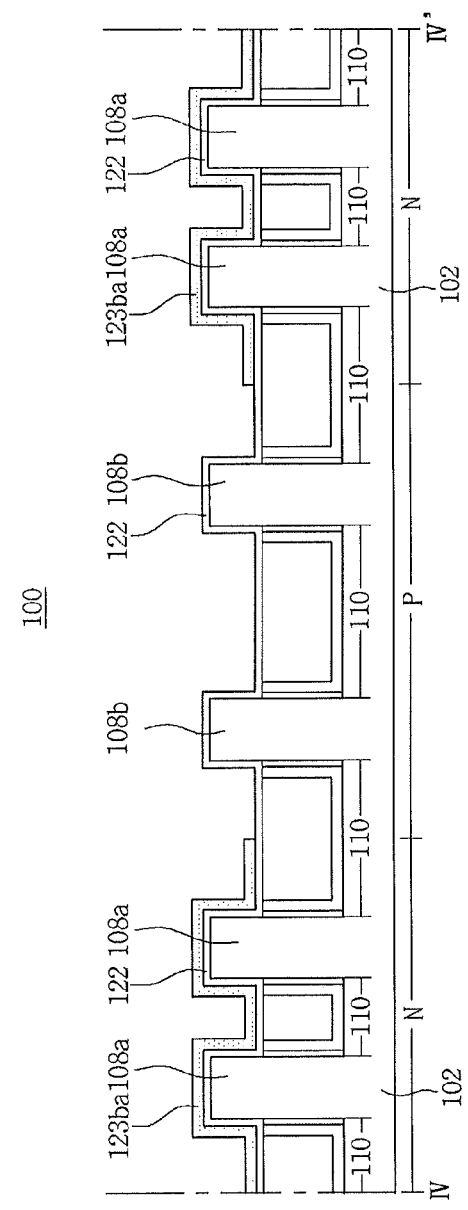

Referring to FIG. 31A, FIG. 31B, and FIG. 31C, the manufacturing method of the semiconductor device according to an embodiment of the inventive concept may include removing the first hard mask pattern 124a after the impurities are injected into the P region P as previously described in FIG. 30A to FIG. 30C.

When the first hard mask pattern 124a is removed, in the N region N, the first residual etch stop layer 123ba may be exposed, and in the P region P, the OZ insulation layer 122 may be exposed.

Figure 32A:
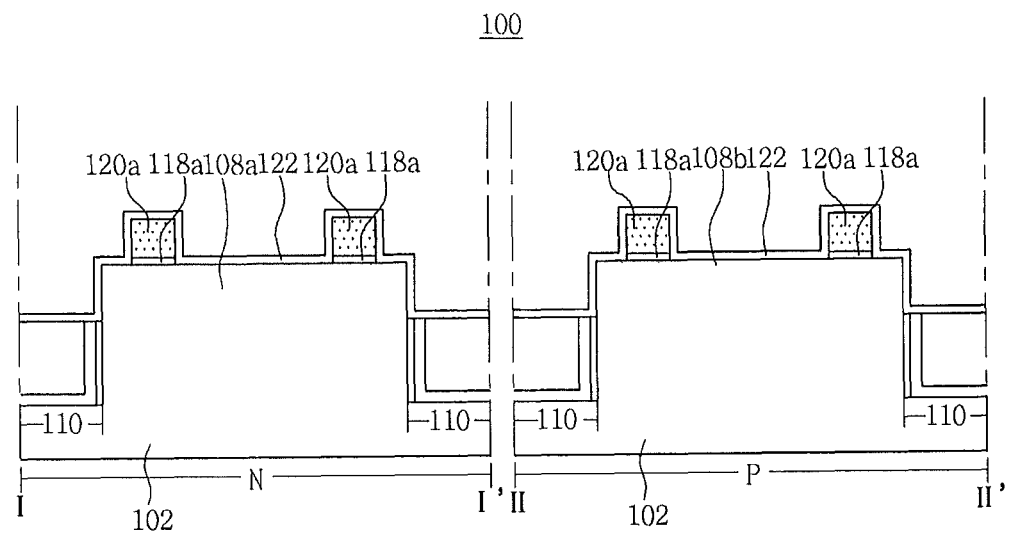
Figure 32B:
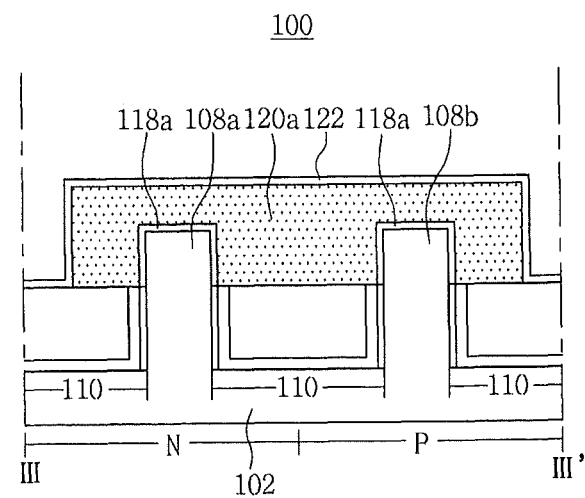
Figure 32C:
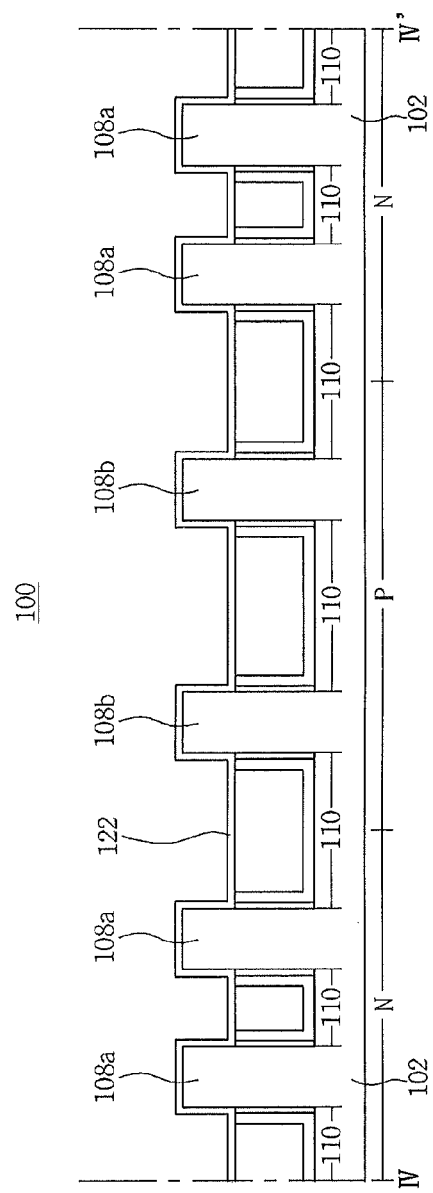

Referring to FIG. 32A, FIG. 32B, and FIG. 32C, the manufacturing method of the semiconductor device according to, an embodiment of the inventive concept may include removing the first residual etch stop layer 123ba as previously shown in FIG. 31A to FIG. 31C.

The first residual etch stop layer 123ba is removed, and thereby the OZ insulation layer 122 may be exposed on the entire surface of the substrate 102, including the N region N and the P region P.

Figure 33A:
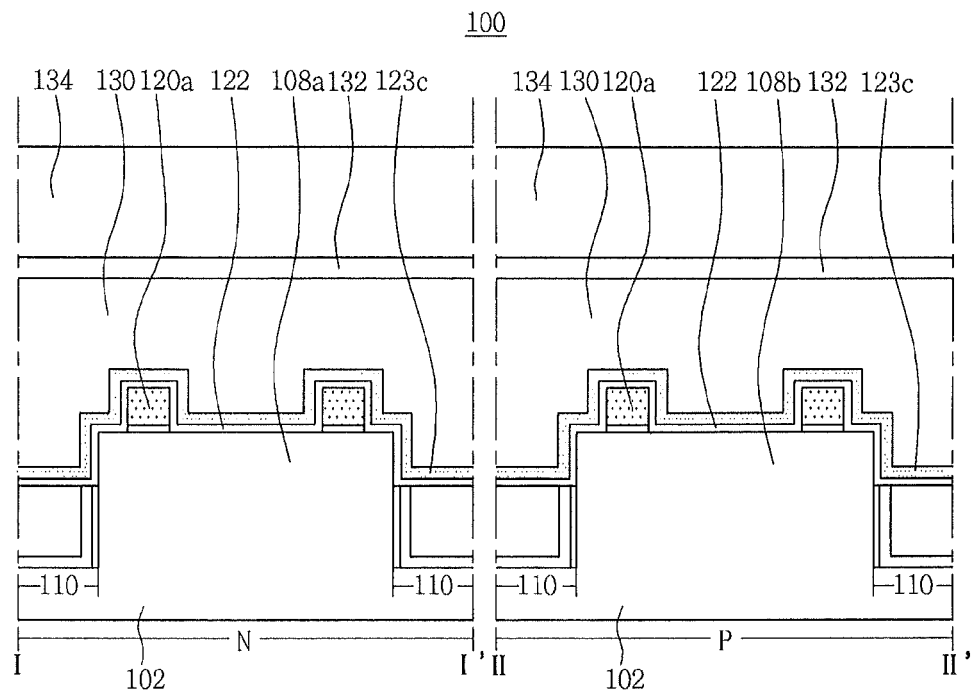
Figure 33B:
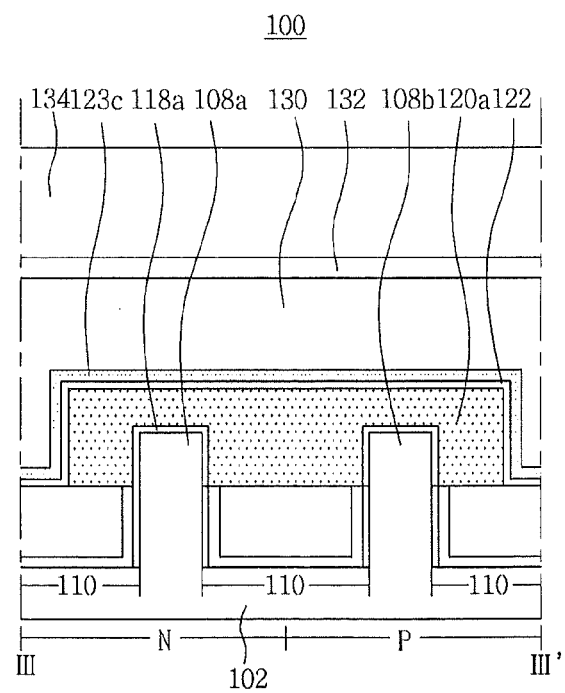
Figure 33C:
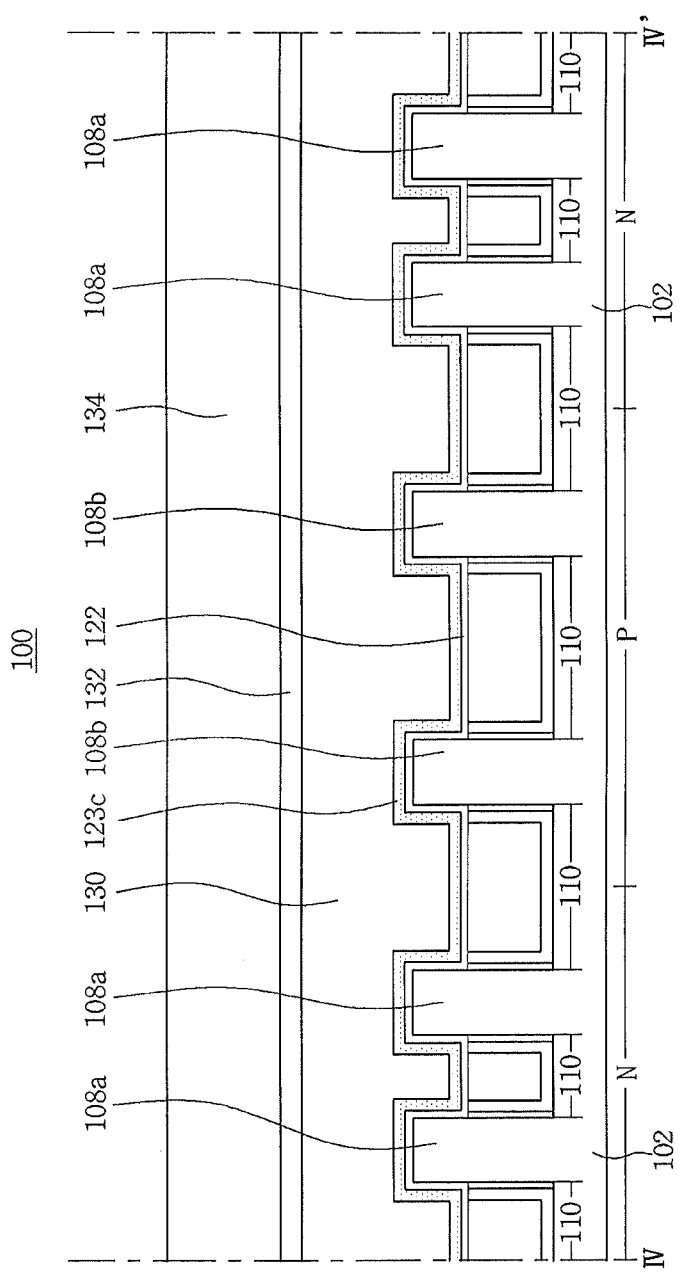

Referring to FIG. 33A, FIG. 33B, and FIG. 33C, the manufacturing method of the semiconductor device according to an embodiment of the inventive concept may include sequentially laminating a second etch stop layer 123c, the second hard mask layer 130, the second hard mask buffer layer 132, and the second PR layer 134 on the upper surface of the OZ insulation layer 122.

The second etch stop layer 123c may include the poly silicon layer. The second hard mask layer 130 may include the silicon organic layer previously mentioned. The second hard mask buffer layer 132 may include the silicon oxide layer.

Figure 34A:
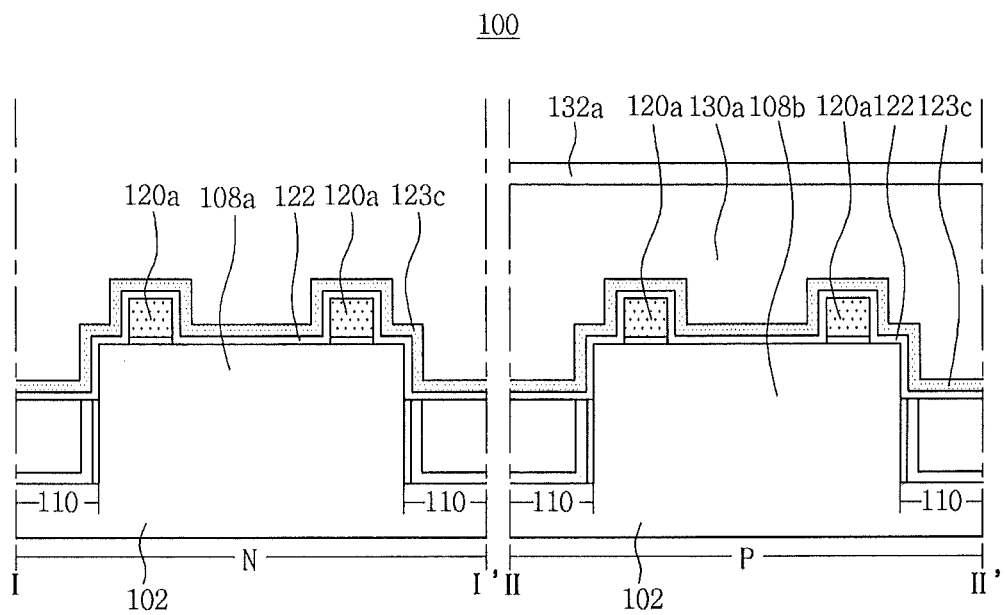
Figure 34B:
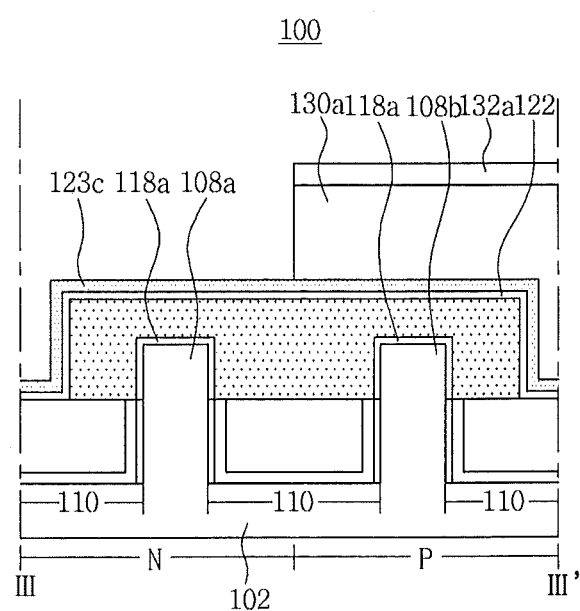
Figure 34C:
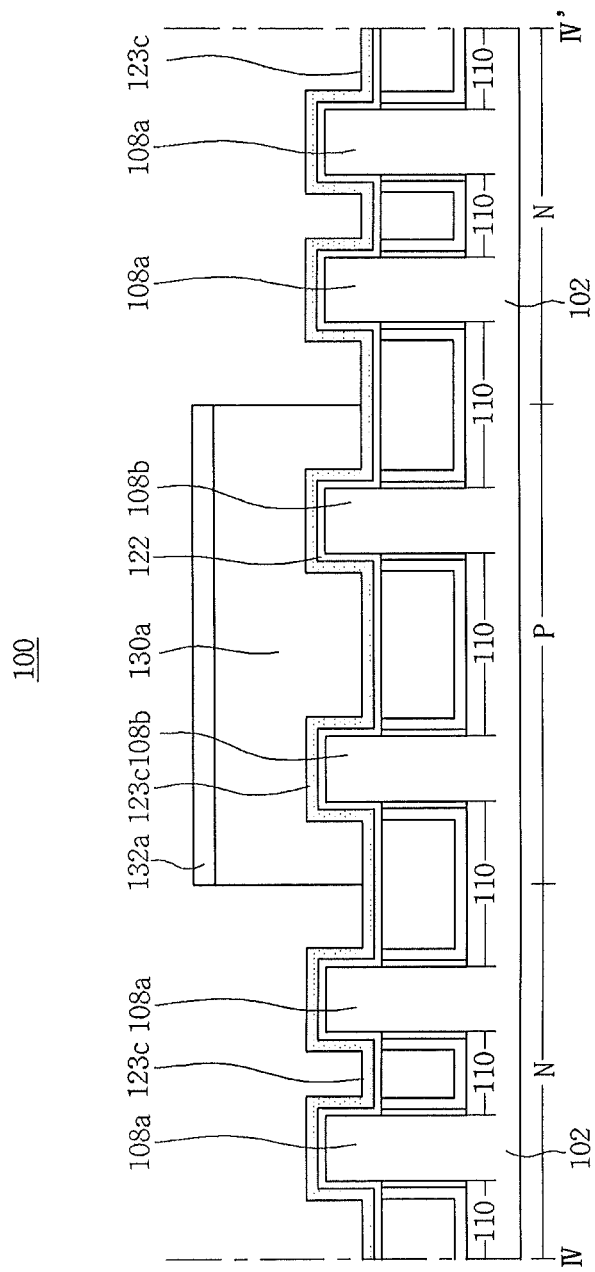

Referring to FIG. 34A, FIG. 34B, and FIG. 34C, the manufacturing method of the semiconductor device according to an embodiment of the inventive concept may include forming the second hard mask pattern 130a and the second hard mask buffer pattern 132a covering the P region P.

The second hard mask buffer pattern 132a may be formed through the photolithography process using the second PR layer 134 shown in FIG. 33A to FIG. 33C. The second hard mask pattern 130a may be patterned using the second hard mask buffer pattern 132a as the etching mask.

The second hard mask pattern 130a and the second hard mask buffer pattern 132a are generally the same shape, and may be formed to be overlapped up and down. The second etch stop layer 123c may be exposed in the N region N on which the second hard mask pattern 130a is not covered.

Figure 35A:
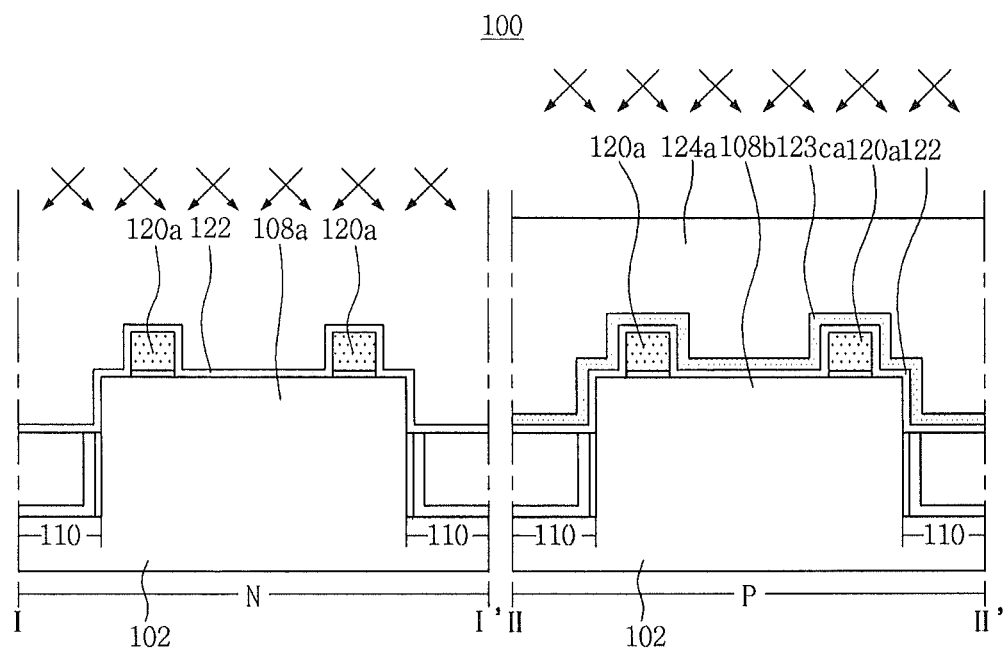
Figure 35B:
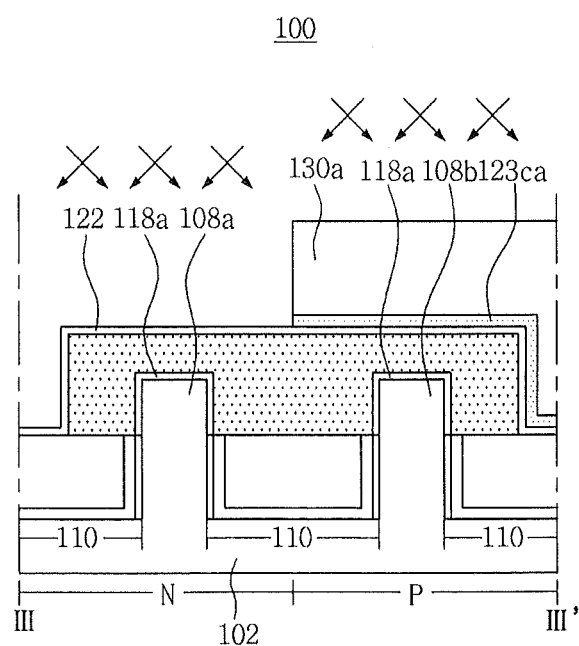
Figure 35C:
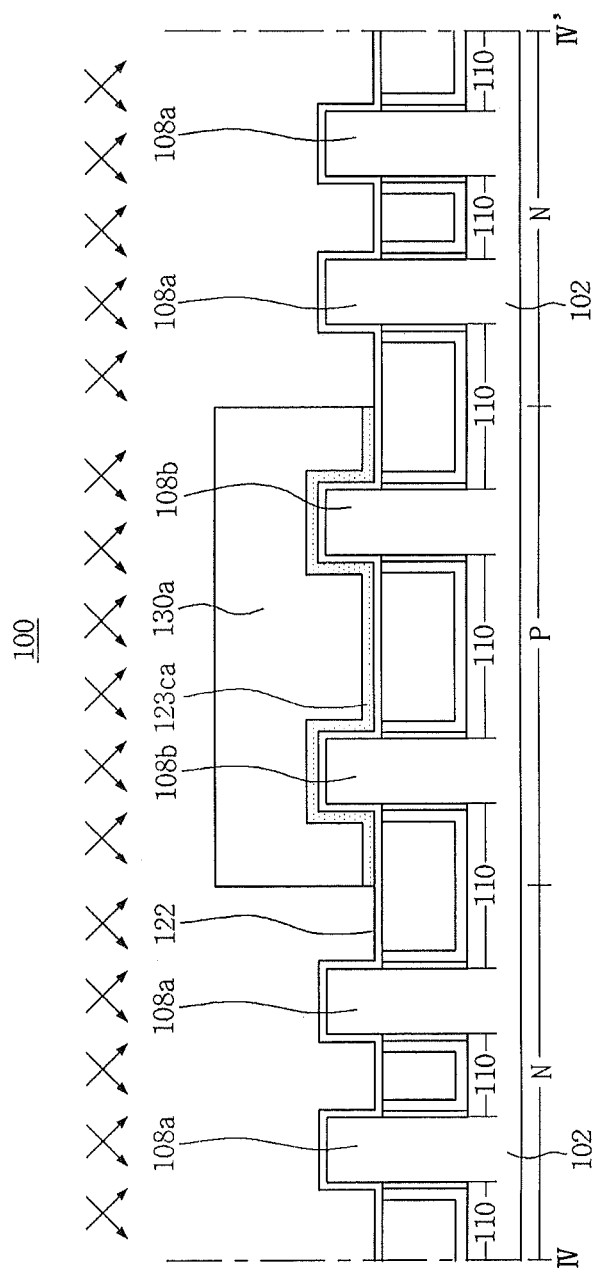

Referring to FIG. 35A, FIG. 35B, and FIG. 35C, the manufacturing method of the semiconductor device according to an embodiment of the inventive concept may include removing the second hard mask buffer pattern 132a shown in FIG. 34A to FIG. 34C and injecting the impurity ions into the N region N.

While removing the second hard mask buffer pattern 132a, the second etch stop layer 123c exposed in the N region N may be removed at the same time. Accordingly, the second residual etch stop layer 123ca is left in the region except the N region N, that is, the P region P and the surrounding region of the substrate 102. Further, the OZ insulation layer 122 may be exposed in the N region N.

The impurities injected into the N region N are p-type impurities, and the p-type impurities may include boron (B), indium (In), and/or gallium (Ga), which belong to 3-valent.

The impurity ions injected into the first active fins 108a may be injected in all directions with the tilted angle which is reasonably determined. The impurity ions may be injected into the first active fins 108a passing through the exposed OZ insulation layer 122. In particular, the threshold voltage of the n-type transistor may be determined depending on the amount of the impurities injected into the sides and the upper surface of the first active fins 108a facing the gate electrodes 120a.

Figure 36A:
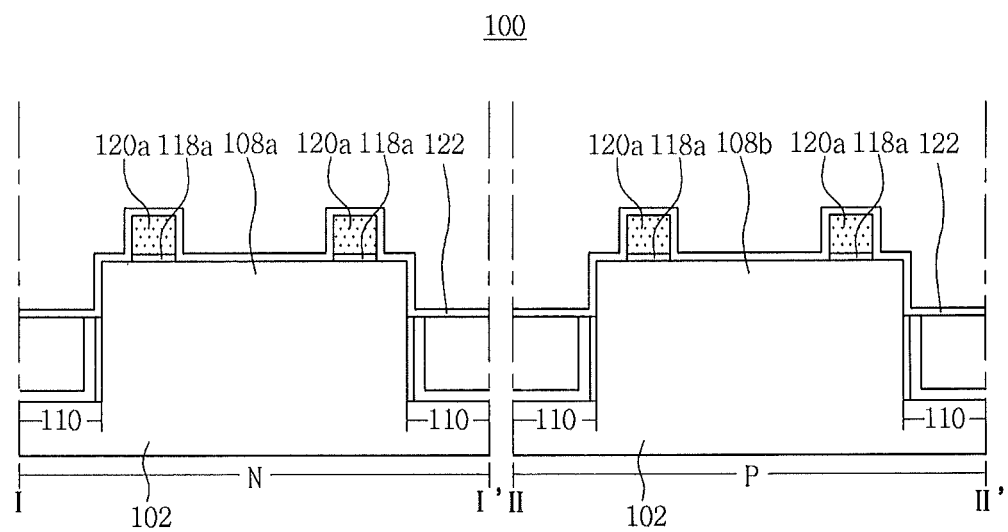
Figure 36B:
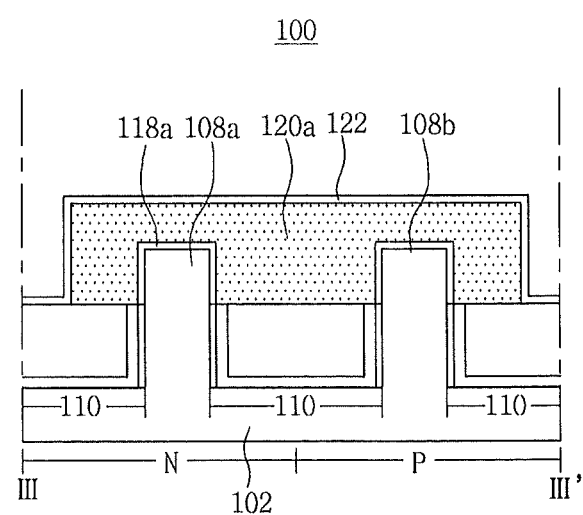
Figure 36C:
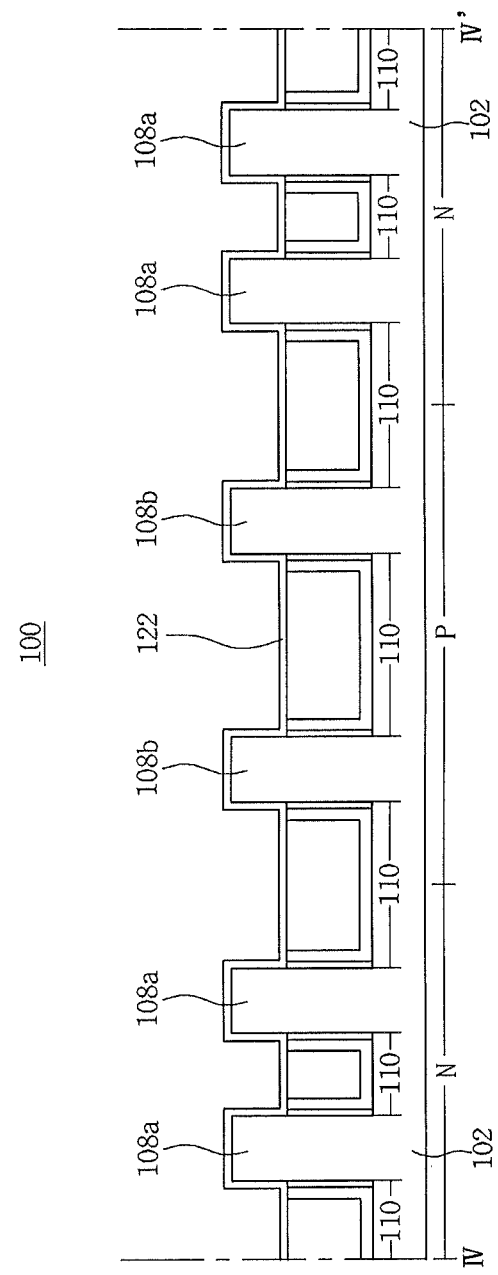

Referring to FIG. 36A, FIG. 36B, and FIG. 36C, the manufacturing method of the semiconductor device according to an embodiment of the inventive concept may include removing the second hard mask pattern 130a of the N region N shown in FIG. 35A to FIG. 35C and removing the second residual etch stop layer 123ca. Accordingly, the OZ insulation layer 122 may be exposed on the entire surface of the substrate 102, including the N region N and the P region P.

Next, performing the annealing process after having removed the second hard mask pattern 130a may be included. While performing the annealing process, the impurity ions are diffused, and thereby the impurities injected into the sides and the upper surface of the first and second active fins 108a and 108b facing the gate electrodes 120a may be distributed generally evenly.

The processes of injecting impurities of the processes described above are the ion implantation process for regulating the threshold voltages of the n-type transistor and the p-type transistor, which are formed in the N region N and the P region P.

Actually, a plurality of transistors having threshold voltages of different levels in the substrate 102 may be formed. In this case, the above processes may be repeatedly performed according to the level of threshold voltage.

The description with respect to the subsequent processes is the same as the processes described with reference to FIG. 17A to FIG. 17C and therefore will be omitted.

Figure 37:
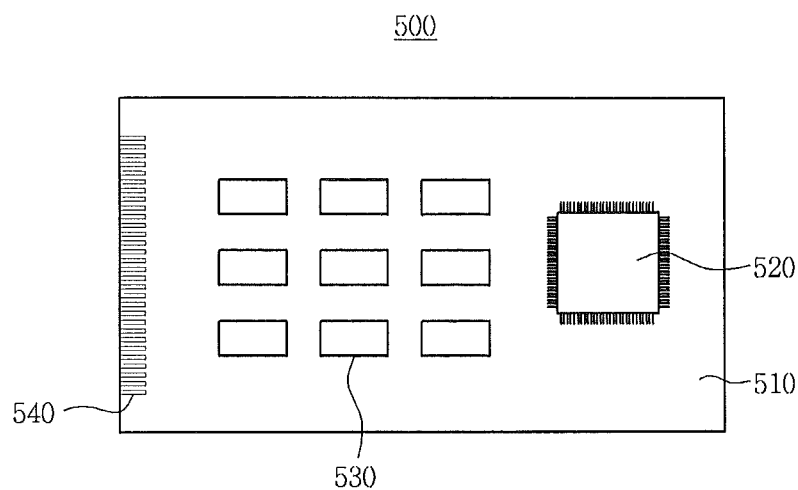
FIG. 37 is a diagram conceptually showing a semiconductor module according to an embodiment of the inventive concept including a semiconductor device manufactured by embodiments of the inventive concept.

FIG. 37 is a diagram conceptually showing a semiconductor module according to an embodiment of the inventive concept, including the semiconductor device 100 manufactured by various embodiments of the inventive concept.

Referring to FIG. 37, a semiconductor module 500 according to an embodiment of the inventive concept may include the semiconductor device 100 according to various embodiments of the inventive concept, which is mounted on a semiconductor module substrate 510. The semiconductor module 500 may further include a microprocessor 520, which is mounted on the semiconductor module substrate 510. Input and output terminals 540 may be disposed in at least one side of the semiconductor module substrate 510. The semiconductor module 500 may include a memory card or a solid-state drive (SSD).

Figure 38:
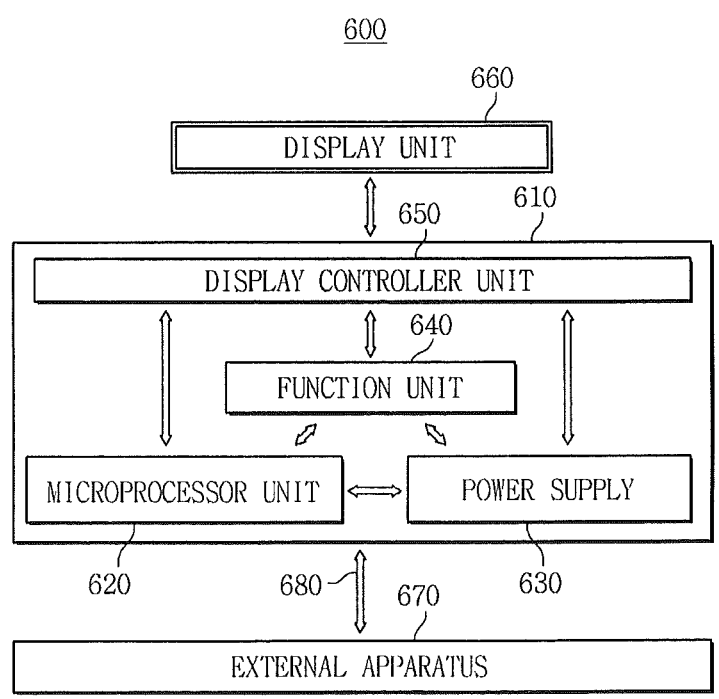
FIG. 38 is a block diagram conceptually showing an electronic system according to an embodiment of the inventive concept including a semiconductor device manufactured by embodiments of the inventive concept.

FIG. 38 is a block diagram conceptually showing an electronic system according to an embodiment of the inventive concept, including the semiconductor device 100 manufactured by embodiments of the inventive concept.

Referring to FIG. 38, the semiconductor device 100 manufactured by embodiments of the inventive concept may be applied to an electronic system 600. The electronic system 600 may include a body 610, a microprocessor unit 620, a power supply unit 630, a function unit 640, and/or a display controller unit 650. The body 610 may be a system board or motherboard having a printed circuit board (PCB). The microprocessor unit 620, the power supply unit 630, the function unit 640, and/or the display controller unit 650 may be mounted on or installed in the body 610. A display unit 660 may be disposed on the upper surface or outside of body 610. For example, the display unit 660 is disposed on the surface of the body 610 and may display an image processed by the display controller unit 650. The power supply unit 630 is supplied with a certain voltage from an external power source or the like and divides the voltage into various levels to supply the divided voltages to the microprocessor unit 620, the function unit 640, the display controller unit 650, and the like. The microprocessor unit 620 is supplied with a voltage from the power supply unit 630 to control the function unit 640 and the display unit 660. The function unit 640 may perform various functions of the electronic system 600. For example, if the electronic system 600 is a mobile electronic device, such as a mobile phone, the function unit 640 may include various configuration components capable of performing wireless communication functions, such as outputting an image to the display unit 660 by dialing or communicating with an external apparatus 670 and outputting a voice to a speaker, and if a camera is included, may perform a role of an image processor. In applied embodiments, if the electronic system 600 is connected to a memory card so as to expand its capacity, the function unit 640 may be a memory card controller. The function unit 640 may send and receive a signal to and from the external apparatus 670 via a wired or wireless communication unit 680. Further, if the electronic system 600 needs a universal serial bus (USB) so as to expand its function, the function unit 640 may perform a role of an interface controller. The semiconductor device 100 manufactured by embodiments according to the inventive concept may be included in the function unit 640.

Figure 39:
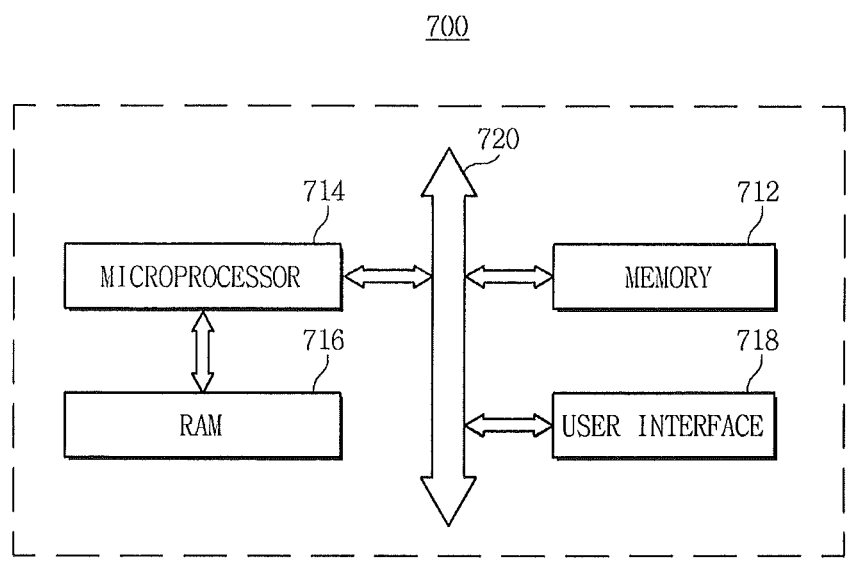
FIG. 39 is a block diagram schematically showing an electronic system according to an embodiment of the inventive concept including a semiconductor device manufactured by embodiments of the inventive concept.

FIG. 39 is a block diagram schematically showing an electronic system according to an embodiment of the inventive concept including the semiconductor device 100 manufactured by embodiments of the inventive concept.

Referring to FIG. 39, an electronic system 700 may include the semiconductor device 100 manufactured according to embodiments of the inventive concept.

The electronic system 700 may be applied to a mobile electronic device or computer. For example, the electronic system 700 may include a user interface 718, which performs data communications using a memory system 712, a microprocessor 714, a RAM 716, and a bus 720. The microprocessor 714 can program and control the electronic system 700. The RAM 716 may be used as an operation memory of the microprocessor 714. For example, the microprocessor 714 or the RAM 716 may include any one of the semiconductor devices 100 manufactured by embodiments of the inventive concept.

The microprocessor 714, the RAM 716, and/or other configurations may be assembled in a single package. The user interface 718 may be used to input data to the electronic system 700 or output data from the electronic system 700. The memory system 712 can store codes for operating the microprocessor 714, data processed by the microprocessor 714, or external input data. The memory system 712 may include a controller and a memory.

Figure 40:
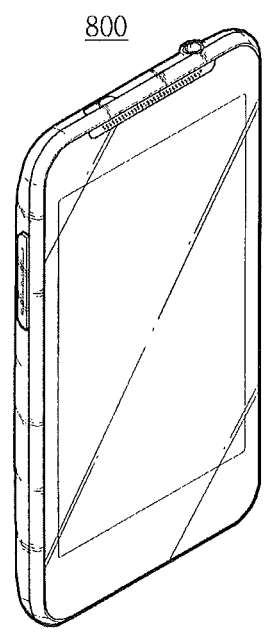
FIG. 40 is a diagram schematically showing a mobile electronic device according to an embodiment of the inventive concept including a semiconductor device manufactured by embodiments of the inventive concept.

FIG. 40 is a diagram schematically showing a mobile electronic device according to an embodiment of the inventive concept, including the semiconductor device 100 manufactured by embodiments of the inventive concept.

A mobile electronic device 800 may be understood as a tablet PC. In addition, at least one of the semiconductor devices 100 manufactured by various embodiments of the inventive concept may be used for a portable computer, such as a notebook computer, a mpeg-1 audio layer 3 (MP3) player, a MP4 player, a navigation device, a solid-state drive (SSD), a desktop computer, appliances for a car and household as well as the tablet PC.

Though embodiments of the inventive concept have been described with reference to the accompanying drawings, it will be understood that those skilled in the art to which the inventive concept belongs may practice with other specific forms within the scope without departing from the technical idea or necessary characteristics of the inventive concept.

Therefore, it should be noted that the embodiments described above are exemplary and are not limited thereto.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A manufacturing method of a semiconductor device comprising:
   providing a substrate including a first region and a second region;
   forming active fins in the first region and the second region;
   forming gate electrodes, which intersect the active fins and have surfaces facing side surfaces of the active fins;
   forming an off-set zero (OZ) insulation layer covering the active fins;
   forming a first hard mask pattern covering the first region;
   injecting first impurities into the active fins of the second region;
   removing the first hard mask pattern;
   forming a second hard mask pattern covering the second region;
   injecting second impurities into the active fins of the first region; and
   removing the second hard mask pattern.

2. The manufacturing method according to claim 1, further comprising forming a gate insulation layer between the gate electrodes and the active fins.

3. The manufacturing method according to claim 1,
   wherein the OZ insulation layer comprises a silicon nitride layer.

4. The manufacturing method according to claim 1,
   wherein the forming the first hard mask pattern comprises:
   forming sequentially a first hard mask layer, a first hard mask buffer layer, and a first photoresistor (PR) layer on an upper portion of the OZ insulation layer;
   forming the first hard mask buffer layer into a first hard mask buffer pattern covering the first region by a photolithography process using the first PR layer;
   forming the first hard mask layer into the first hard mask pattern using the first hard mask buffer pattern as an etching mask; and
   removing the first hard mask buffer pattern.

5. The manufacturing method according to claim 4,
   wherein the first hard mask layer comprises a silicon organic layer, and
   the first hard mask buffer layer comprises a silicon oxide layer.

6. The manufacturing method according to claim 5,
   wherein the forming the first hard mask layer comprises a spin coating process, and
   the forming the first hard mask buffer layer comprises an atomic layer deposition (ALD) process.

7. The manufacturing method according to claim 1, further comprising forming an etch stop layer on an upper surface of the OZ insulation layer.

8. The manufacturing method according to claim 7,
   wherein the etch stop layer comprises a poly silicon layer.

9. The manufacturing method according to claim 8,
   wherein during removal of the first hard mask buffer pattern, the etch stop layer of the second region is removed, and the residual etch stop layer is left in the remaining region including the first region.

10. The manufacturing method according to claim 9, further comprising forming the second hard mask pattern, and removing the residual etch stop layer.

11. The manufacturing method according to claim 1,
    wherein the first impurities and the second impurities are injected into the active fins in all directions at a tilted angle.

12. The manufacturing method according to claim 11,
    wherein the first impurities and the second impurities are injected into an upper surface and side surfaces of the active fins facing the gate electrodes.

13. The manufacturing method according to claim 12, further comprising removing the second hard mask pattern, and performing an annealing process to the substrate.

14. A manufacturing method of a semiconductor device comprising:
    providing a substrate including a first region and a second region;
    forming active fins in the first region and the second region;
    forming gate electrodes, which intersect the active fins and have surfaces facing side surfaces of the active fins;
    forming an off-set zero (OZ) insulation layer covering the active fins;
    forming a first residual etch stop layer and a first hard mask pattern, which cover the first region;
    injecting first impurities into the active fins of the second region;
    removing the first hard mask pattern and the first residual etch stop layer;
    forming a second residual etch stop layer and a second hard mask pattern, which cover the second region;
    injecting second impurities into the active fins of the first region; and
    removing the second hard mask pattern and the second residual etch stop layer.

15. The manufacturing method according to claim 14,
    wherein the forming the first residual etch stop layer and the first hard mask pattern comprises:
    forming sequentially a first etch stop layer, a first hard mask layer, a first hard mask buffer layer, and a first PR layer on an upper portion of the OZ insulation layer;
    forming the first hard mask buffer layer into a hard mask buffer pattern covering the first region by a patterning process using the first PR layer;
    forming the first hard mask layer into a first hard mask pattern using the first hard mask buffer pattern as an etching mask; and
    forming a first residual etch stop layer beneath the first hard mask pattern by removing the first hard mask buffer pattern and the first etch stop layer of the second region.

16. A method, comprising:
    providing a substrate including a first region and a second region;
    forming a first hard mask pattern covering the first region;
    injecting first impurities into the second region;
    removing the first hard mask pattern;
    forming a second hard mask pattern covering the second region;
    injecting second impurities into the first region; and
    removing the second hard mask pattern;
    wherein the first and second hard mask patterns comprise silicon organic material.

17. The method according to claim 16, wherein forming the first hard mask pattern comprises forming a first spin coat of the silicon organic material; and
    wherein forming the second hard mask pattern comprises forming a second spin coat of the silicon organic material.

18. The method of claim 17, further comprising:
    forming active fins in the first region and the second region;
    forming gate electrodes, which intersect the active fins and have surfaces facing side surfaces of the active fins; and
    forming an off-set zero (OZ) insulation layer covering the active fins.

19. The method of claim 18, wherein injecting the first impurities comprises injecting the first impurities into the active fins of the second region; and
    wherein injecting the second impurities comprises injecting the second impurities into the active fins of the first region.

20. The method of claim 19, wherein injecting the first impurities comprises injecting the first impurities into the active fins of the second region to adjust a first threshold voltage of a first semiconductor device; and
    wherein injecting the second impurities comprises injecting the second impurities into the active fins of the first region to adjust a second threshold voltage of a second semiconductor device.

\* \* \* \* \*